United States Patent
Cleavelin et al.

(10) Patent No.: US 10,355,206 B2
(45) Date of Patent: Jul. 16, 2019

(54) SEALED RESISTIVE CHANGE ELEMENTS

(71) Applicant: Nantero, Inc., Woburn, MA (US)

(72) Inventors: C. Rinn Cleavelin, Lubbock, TX (US);
Claude L. Bertin, Venice, FL (US);
Thomas Rueckes, Byfield, MA (US)

(73) Assignee: Nantero, Inc., Woburn, MA (US)

( * ) Notice: Subject to any disclaimer, the term of this patent is extended or adjusted under 35 U.S.C. 154(b) by 0 days.

(21) Appl. No.: 15/486,032

(22) Filed: Apr. 12, 2017

(65) Prior Publication Data
US 2018/0226578 A1   Aug. 9, 2018

Related U.S. Application Data

(60) Provisional application No. 62/455,518, filed on Feb. 6, 2017.

(51) Int. Cl.
*H01L 27/24* (2006.01)
*H01L 45/00* (2006.01)

(52) U.S. Cl.
CPC ........ *H01L 45/149* (2013.01); *H01L 27/2436* (2013.01); *H01L 27/2463* (2013.01); *H01L 27/2481* (2013.01); *H01L 45/04* (2013.01); *H01L 45/06* (2013.01); *H01L 45/1233* (2013.01); *H01L 45/1246* (2013.01);
(Continued)

(58) Field of Classification Search
CPC ............... H01L 45/122; H01L 45/1233; H01L 45/1246; H01L 45/149
See application file for complete search history.

(56) References Cited

U.S. PATENT DOCUMENTS 6,630,772 B1   10/2003   Bower et al.
6,921,575 B2   7/2005   Horiuchi et al.
(Continued)

FOREIGN PATENT DOCUMENTS

JP       2008065953 A      3/2008
WO    WO-1998/39250 A1   9/1998
(Continued)

OTHER PUBLICATIONS

Amblard, G., "Development and characterization of carbon nanotube processes for NRAM technology," Proc. of SPIE 2011, vol. 7970, pp. 797017-1-797017-7.
(Continued)

*Primary Examiner* — Allison Bernstein
(74) *Attorney, Agent, or Firm* — Nantero, Inc.

(57) ABSTRACT

Methods for scaling dimensions of resistive change elements, resistive change element arrays of scalable resistive change elements, and sealed resistive change elements are disclosed. According to some aspects of the present disclosure the methods for scaling dimensions of resistive change elements and the resistive change element arrays of scalable resistive change elements reduce the impact of overlapping materials on the switching characteristics of resistive change elements. According to some aspects of the present disclosure the methods for scaling dimensions of resistive change elements include sealing surfaces of resistive change elements. According to some aspects of the present disclosure the methods for scaling dimensions of resistive change elements include forming barriers to copper migration in a copper back end of the line.

30 Claims, 49 Drawing Sheets

(52) U.S. Cl.
CPC ........ *H01L 45/1253* (2013.01); *H01L 45/146* (2013.01); *H01L 45/1625* (2013.01); *H01L 45/1675* (2013.01)

(56) References Cited

U.S. PATENT DOCUMENTS

| | | | |
|---|---|---|---|
| 6,972,985 | B2 | 12/2005 | Rinerson et al. |
| 6,995,081 | B2* | 2/2006 | Vaartstra ................ C23C 16/08 |
| | | | 257/E21.171 |
| 7,015,500 | B2 | 3/2006 | Choi et al. |
| 7,075,817 | B2 | 7/2006 | Rinerson et al. |
| 7,115,901 | B2 | 10/2006 | Bertin et al. |
| 7,161,403 | B2 | 1/2007 | Bertin et al. |
| 7,335,395 | B2 | 2/2008 | Ward et al. |
| 7,365,632 | B2 | 4/2008 | Bertin et al. |
| 7,375,369 | B2 | 5/2008 | Sen et al. |
| 7,479,654 | B2 | 1/2009 | Bertin et al. |
| 7,667,999 | B2 | 2/2010 | Herner |
| 7,781,862 | B2 | 8/2010 | Bertin et al. |
| 7,835,170 | B2 | 11/2010 | Bertin et al. |
| 7,940,547 | B2 | 5/2011 | Lee et al. |
| 7,948,054 | B2 | 5/2011 | Bertin et al. |
| 7,982,209 | B2 | 7/2011 | Herner |
| 8,000,127 | B2 | 8/2011 | Hamilton |
| 8,008,745 | B2 | 8/2011 | Bertin et al. |
| 8,023,320 | B2 | 9/2011 | Kim et al. |
| 8,038,908 | B2 | 10/2011 | Hirai et al. |
| 8,102,018 | B2 | 1/2012 | Bertin et al. |
| 8,217,490 | B2 | 7/2012 | Bertin et al. |
| 8,236,623 | B2* | 8/2012 | Schricker ............... B82Y 10/00 |
| | | | 257/107 |
| 8,319,205 | B2 | 11/2012 | Bertin et al. |
| 8,551,855 | B2* | 10/2013 | Xu .................... H01L 21/02115 |
| | | | 257/76 |
| 8,580,586 | B2 | 11/2013 | Bertin et al. |
| 8,587,989 | B2 | 11/2013 | Manning et al. |
| 8,619,450 | B2 | 12/2013 | Hamilton |
| 8,809,917 | B2 | 8/2014 | Bertin et al. |
| 8,854,873 | B1 | 10/2014 | Hollmer et al. |
| 8,895,950 | B2 | 11/2014 | Rueckes et al. |
| 8,941,094 | B2 | 1/2015 | Cleavelin et al. |
| 9,287,356 | B2 | 3/2016 | Bertin et al. |
| 9,337,423 | B2 | 5/2016 | Ghenciu et al. |
| 9,390,790 | B2 | 7/2016 | Bertin et al. |
| 9,422,651 | B2 | 8/2016 | Roberts et al. |
| 2003/0176034 | A1 | 9/2003 | Jackson et al. |
| 2004/0005723 | A1 | 1/2004 | Empedocles et al. |
| 2004/0027849 | A1* | 2/2004 | Yang ...................... B82Y 10/00 |
| | | | 365/115 |
| 2004/0031975 | A1 | 2/2004 | Kern |
| 2004/0043219 | A1 | 3/2004 | Ito et al. |
| 2004/0266106 | A1 | 12/2004 | Lee |
| 2005/0194035 | A1 | 9/2005 | Jin et al. |
| 2005/0212014 | A1 | 9/2005 | Horibe et al. |
| 2006/0115640 | A1 | 6/2006 | Yodh et al. |
| 2006/0250843 | A1 | 11/2006 | Bertin et al. |
| 2006/0258122 | A1 | 11/2006 | Whitefield et al. |
| 2006/0264053 | A1 | 11/2006 | Yates et al. |
| 2006/0276056 | A1 | 12/2006 | Ward et al. |
| 2006/0281256 | A1 | 12/2006 | Carter et al. |
| 2006/0281287 | A1 | 12/2006 | Yates et al. |
| 2006/0292716 | A1 | 12/2006 | Gu et al. |
| 2006/0292870 | A1 | 12/2006 | Pribat et al. |
| 2007/0153353 | A1 | 7/2007 | Gruner |
| 2007/0207186 | A1 | 9/2007 | Scanlon et al. |
| 2008/0157126 | A1 | 7/2008 | Bertin et al. |
| 2008/0160734 | A1 | 7/2008 | Bertin et al. |
| 2008/0299374 | A1 | 12/2008 | Choi et al. |
| 2009/0021976 | A1 | 1/2009 | Liaw et al. |
| 2009/0027977 | A1 | 1/2009 | Rinerson et al. |
| 2009/0166609 | A1 | 7/2009 | Schricker et al. |
| 2009/0166610 | A1 | 7/2009 | Schricker et al. |
| 2009/0168491 | A1 | 7/2009 | Schricker et al. |
| 2009/0184389 | A1 | 7/2009 | Bertin et al. |
| 2009/0256131 | A1 | 10/2009 | Schricker |
| 2009/0286362 | A1 | 11/2009 | Jiang et al. |
| 2010/0044671 | A1 | 2/2010 | Schricker et al. |
| 2010/0067290 | A1 | 3/2010 | Savransky |
| 2010/0074034 | A1 | 3/2010 | Cazzaniga |
| 2010/0078723 | A1 | 4/2010 | Bertin et al. |
| 2010/0102291 | A1* | 4/2010 | Xu ........................ G11C 13/02 |
| | | | 257/4 |
| 2010/0108976 | A1* | 5/2010 | Jayasekara ............. B82Y 10/00 |
| | | | 257/4 |
| 2010/0245029 | A1 | 9/2010 | Schricker et al. |
| 2010/0247381 | A1 | 9/2010 | Yodh et al. |
| 2011/0057161 | A1* | 3/2011 | Sandhu .................. H01L 45/06 |
| | | | 257/2 |
| 2011/0183489 | A1 | 7/2011 | Ghenciu et al. |
| 2012/0176831 | A1 | 7/2012 | Xiao et al. |
| 2012/0181621 | A1 | 7/2012 | Bertin et al. |
| 2012/0299175 | A1 | 11/2012 | Tran |
| 2013/0052449 | A1 | 2/2013 | Sen et al. |
| 2013/0224934 | A1 | 8/2013 | Roberts et al. |
| 2014/0254242 | A1 | 9/2014 | Siau |
| 2018/0025779 | A1 | 1/2018 | Bertin et al. |

FOREIGN PATENT DOCUMENTS

| | | |
|---|---|---|
| WO | WO-1999/65821 A1 | 12/1999 |
| WO | WO-2000/13236 A2 | 3/2000 |
| WO | WO-2006/46014 A2 | 5/2006 |

OTHER PUBLICATIONS

Brock, et al., "Carbon Nanotube Memories and Fabrics in a Radiation Hard Semiconductor Foundry," 2005 IEEE Conference, 9 pgs.

International Search Report for PCT/US2018/015956, dated Mar. 1, 2018, 4 pages.

Written Opinion for PCT/US2018/015956, dated Mar. 1, 2018, 7 pages.

Kianian, et al., "A 3D Stackable Carbon Nanotube-based Nonvolatile Memory (NRAM)," ESSDERC, Nantero, Inc., Jun. 14, 2010, 4 pgs.

Onoa, et al., "Bulk Production of Singly Dispersed Carbon Nanotubes with Prescribed Lengths," Nanotechnology, 2005, vol. 16, pp. 2799-2803.

Naseh, et al., "Functionalization of Carbon Nanotubes Using Nitric Acid Oxidation and DMD Plasma," World Academy of Science, Engineering and Technology, vol. 49, 2009, pp. 177-179.

Rosendale, et al., "A 4 Megabit Carbon Nanotube-based Nonvolatile Memory (NRAM)," ESSCIRC 2010 Proceedings, pp. 478-481.

R. Singh & R. K. Ulrich, "High and Low Dielectric Constant Materials," The Electrochemical Society Interface, pp. 26-30, (1999).

Smith, et al., "Contamination Control and Pilot Manufacturing of Commercial Grade Carbon Nanotube Colloidal Formulations," 2013 SEMI Advanced Semiconductor Manufacturing Conference (ASMC 2013), 5 pages.

Tapan Gupta, "Cooper Interconnect Technology," ch. 2, (Springer 2009).

Utegulov, et al., "Functionalization of single-walled carbon nanotubes using isotropic plasma tratment: Resonant Raman spectroscopy study," Jnrl. App. phys. vol. 97, 2005, pp. 104324-1-104324-4.

* cited by examiner

800

Backsputtering particles from the dielectric to form a thin dielectric sidewall film over at least one surface of the resistive change material layer of the resistive change element — 802

Sputtering particles with primarily a vertical velocity from a dielectric located above the resistive change element to form a thin dielectric sidewall film over at least one surface of the resistive change material layer of the resistive change element — 902

Forming a first thin dielectric sidewall film over at least one surface of the resistive change material layer of the resistive change element — 1102

Forming a second thin dielectric sidewall film over at least one surface of the resistive change material layer of the resistive change element — 1104

1200

Forming at least one bottom plug above at least one bottom interconnect conductor of an initial structure — 1202

Forming at least one resistive change element above the at least one bottom plug, where each resistive change element includes a resistive change material layer — 1204

Sealing the resistive change material layer of each of the at least one resistive change element — 1206

Filling regions around the at least one resistive change element with a dielectric — 1208

Forming at least one top interconnect conductor above the at least one resistive change element — 1210

FIG. 12

SEALED RESISTIVE CHANGE ELEMENTS

CROSS-REFERENCE OF RELATED CASES

This application claims the benefit of U.S. Provisional Application No. 62/455,518, filed on Feb. 6, 2017, which is hereby incorporated by reference in its entirety.

This application is related to the following U.S. Patents, which are assigned to the assignee of the present application, and are hereby incorporated by reference in their entirety:

U.S. Pat. No. 6,835,591, filed on Apr. 23, 2002, entitled *Methods of Nanotube Films and Articles;*

U.S. Pat. No. 7,335,395, filed on Jan. 13, 2003, entitled *Methods of Using Pre-Formed Nanotubes to Make Carbon Nanotube Films, Layers, Fabrics, Ribbons, Elements, and Articles;*

U.S. Pat. No. 6,706,402, filed on Mar. 16, 2004, entitled *Nanotube Films and Articles;*

U.S. Pat. No. 7,115,901, filed on Jun. 9, 2004, entitled *Non-Volatile Electromechanical Field Effect Devices and Circuits Using Same and Methods of Forming Same;*

U.S. Pat. No. 7,365,632, filed on Sep. 20, 2005, entitled *Resistive Elements Using Carbon Nanotubes;*

U.S. Pat. No. 7,781,862, filed on Nov. 15, 2005, entitled *Two-Terminal Nanotube Devices and Systems and Methods of Making Same;*

U.S. Pat. No. 7,479,654, filed on Nov. 15, 2005, entitled *Memory Arrays Using Nanotube Articles with Reprogrammable Resistance;*

U.S. Pat. No. 8,217,490, filed on Aug. 8, 2007, entitled *Nonvolatile Nanotube Diodes and Nonvolatile Nanotube Blocks and Systems Using Same and Methods of Making Same;*

U.S. Pat. No. 7,835,170, filed on Aug. 8, 2007, entitled *Nonvolatile Nanotube Diodes and Nonvolatile Nanotube Blocks and Systems Using Same and Methods of Making Same;*

U.S. Pat. No. 8,102,018, filed on Aug. 8, 2007, entitled *Nonvolatile Resistive Memories Having Scalable Two-Terminal Nanotube Switches;*

U.S. Pat. No. 9,287,356, filed on Jan. 20, 2009, entitled *Nonvolatile Nanotube Diodes and Nonvolatile Nanotube Blocks and Systems Using Same and Methods of Making Same;*

U.S. Pat. No. 8,319,205, filed on Aug. 6, 2009, entitled *Nonvolatile Nanotube Programmable Logic Devices and a Nonvolatile Nanotube Field Programmable Gate Array Using Same;*

U.S. Pat. No. 8,351,239, filed on Oct. 23, 2009, entitled *Dynamic Sense Current Supply Circuit and Associated Method for Reading and Characterizing a Resistive Memory Array;*

U.S. Pat. No. 8,000,127, filed on Nov. 13, 2009, entitled *Method for Resetting a Resistive Change Memory Element;*

U.S. Pat. No. 8,619,450, filed on Sep. 1, 2010, entitled *A Method for Adjusting a Resistive Change Element Using a Reference;*

U.S. Pat. No. 8,941,094, filed on Sep. 2, 2010, entitled *Methods for Adjusting the Conductivity Range of a Nanotube Fabric Layer;*

U.S. Pat. No. 9,422,651, filed on Mar. 30, 2011, entitled *Methods for Arranging Nanoscopic Elements Within Networks, Fabrics, and Films;*

U.S. Pat. No. 9,390,790, filed on Dec. 17, 2012, entitled *Carbon Based Nonvolatile Cross Point Memory Incorporating Carbon Based Diode Select Devices And MOSFET Select Devices For Memory And Logic Applications;* and U.S. Pat. No. 9,337,423, filed on Feb. 27, 2015, entitled *Two-Terminal Switching Device Using a Composite Material of Nanoscopic Particles and Carbon Nanotubes.*

This application is related to the following U.S. Patent Application Publications and U.S. Patent Application, which are assigned to the assignee of the application, and are hereby incorporated by reference in their entirety:

U.S. Patent Application Publication No. 2008/0160734, filed on Aug. 8, 2007, entitled *Nonvolatile Nanotube Diodes and Nonvolatile Nanotube Blocks and Systems Using Same and Methods of Making Same;*

U.S. Patent Application Publication No. 2013/0052449, filed on Feb. 14, 2011, entitled *Methods for Controlling Density, Porosity, and/or Gap Size Within Nanotube Fabric Layers and Films;* and U.S. patent application Ser. No. 15/136,414, filed on Apr. 22, 2016, entitled *Methods for Enhanced State Retention Within a Resistive Change Cell.*

BACKGROUND

Technical Field

The present disclosure generally relates to resistive change elements and arrays of resistive change elements and, more specifically, to scaling resistive change elements to smaller dimensions.

Discussion Of Related Art

Any discussion of the related art throughout this specification should in no way be considered as an admission that such art is widely known or forms part of the common general knowledge in the field.

Resistive change elements and arrays of resistive change elements are used in a variety of devices such as memory devices, routing devices, logic devices, sensor devices, and analog circuits. For example, resistive change elements and arrays of resistive change elements can be used to form nonvolatile storage portions of standalone memories and nonvolatile storage portions of embedded memories. For example, resistive change elements and arrays of resistive change elements can be used to form switch matrixes of routing devices.

Resistive change elements include a resistive change material that can be adjusted between at least two nonvolatile resistive states in response to an applied stimulus. For example, resistive states within a resistive change element can correspond to data values which can be programmed and read back by supporting circuitry within the device or array. For example, resistive states within a resistive change element can correspond to an ON state or an OFF state for routing signals within the device or array.

For example, a resistive change element might be arranged to switch between two resistive states: a low resistive state (which might correspond to a logic 1) and a high resistive state (which might correspond to a logic 0). In this way, a resistive change element can be used to store one binary digit (bit) of data. Or, as another example, a resistive change element might be arranged to switch between four resistive states, so as to store two bits of data. Or a resistive change element might be arranged to switch between eight resistive states, so as to store three bits of data. Or a resistive change element might be arranged to switch between $2^n$ resistive states, so as to store n bits of data.

The increasing demand for memory storage capacity and the continuing miniaturization of electronic devices requires resistive change elements scaled to smaller dimensions. Scaling resistive change elements to smaller dimensions requires fabrication methods that reduce the dimensions of the resistive change elements without substantially impacting the desired switching characteristics of the resistive change elements. Fabrication methods designed for resistive change elements with larger dimensions can create overlapping regions that do not substantially impact the desired switching characteristics of the resistive change elements with larger dimensions because the resistive change elements with larger dimensions are less sensitive to overlapping regions. However, when fabrication methods designed for resistive change elements with larger dimensions are used to fabricate resistive change elements with smaller dimensions, overlapping regions that do not substantially impact the desired switching characteristics of resistive change elements with large dimensions can have a substantial impact on the desired switching characteristics of the resistive change elements with smaller dimensions because the resistive change elements with smaller dimensions are more sensitive to overlapping regions.

SUMMARY

The present disclosure provides a sealed resistive change element including a bottom electrode having a horizontal cross-sectional shape, a resistive change material layer in contact with the bottom electrode, where the resistive change material layer has a horizontal cross-sectional shape, a top electrode in contact with the resistive change material layer, where the top electrode has a horizontal cross-sectional shape, and at least one thin dielectric sidewall film including a portion formed around the resistive change material layer, where the at least one thin dielectric sidewall film has a ring shape, where the portion of the at least one thin dielectric sidewall film formed around the resistive change material layer has a ring shape based on the horizontal cross-sectional shape of the resistive change material layer.

The present disclosure provides a resistive change element array including at least one bottom interconnect conductor, at least one top interconnect conductor, at least one resistive change element in electrical communication with the at least one bottom interconnect conductor and the at least one top interconnect conductor, where the at least one resistive change element includes a resistive change material layer having a horizontal cross-sectional shape, and at least one thin dielectric sidewall film including a portion formed around the resistive change material layer, where the at least one thin dielectric sidewall film has a ring shape, where the portion of the at least one thin dielectric sidewall film formed around the resistive change material layer has a ring shape based on the horizontal cross-sectional shape of the resistive change material layer, and where the at least one thin dielectric sidewall film seals the resistive change material layer to prevent dielectric penetration into the resistive change material layer.

The present disclosure provides a resistive change element array including a plurality of bottom interconnect conductors, a plurality of top interconnect conductors, a plurality of resistive change elements, where each resistive change element is in electrical communication with a bottom interconnect conductor in the plurality of bottom interconnect conductors and a top interconnect conductor in the plurality of top interconnect conductors, where each resistive change element is respectively located where a top interconnect conductor in the plurality of top interconnect conductors crosses a bottom interconnect conductor in the plurality of bottom interconnect conductors, and where each resistive change element includes a resistive change material layer having a horizontal cross-sectional shape, and a plurality of thin dielectric sidewall films, where each thin dielectric sidewall film includes a portion formed around of a resistive change material layer of a resistive change element in the plurality of resistive change elements, where each thin dielectric sidewall film has a ring shape, and where the portion of each thin dielectric sidewall film formed around the resistive change material layer has a ring shape based on the horizontal cross-sectional shape of the resistive change material layer.

The present disclosure provides a method for sealing a resistive change material layer of a resistive change element formed above a dielectric, the method including backsputtering particles from the dielectric to form a thin dielectric sidewall film on at least one surface of the resistive change material layer of the resistive change element.

The present disclosure provides a method for sealing a resistive change material layer of a resistive change element, the method including sputtering particles with primarily a vertical velocity from a dielectric located above the resistive change element to form a thin dielectric sidewall film on at least one surface of the resistive change material layer of the resistive change element.

The present disclosure provides a method for sealing a resistive change material layer of a resistive change element, the method including introducing at least one material that reacts with a reactant gas, introducing at least one reactant gas, and depositing from a reaction of the at least one material that reacts with a reactant gas and the at least one reactant gas at least one dielectric material to form a thin dielectric sidewall film over at least one surface of the resistive change material of the resistive change element.

The present disclosure provides a method for sealing with a multi-film thin dielectric sidewall a resistive change material layer of a resistive change element, the method including forming a first thin dielectric sidewall film over at least one surface of the resistive change material layer of the resistive change element, and forming a second thin dielectric film over at least one surface of the resistive change material layer of the resistive change element.

Other features and advantages of the present disclosure will become apparent from the following description, which is provided below in relation to the accompanying drawings.

BRIEF DESCRIPTION OF THE DRAWINGS

FIG. 8 illustrates a flow chart showing a method for sealing a resistive change material layer of a resistive change element formed above a dielectric.

FIG. 9 illustrates a flow chart showing a method for sealing a resistive change material layer of a resistive change element by sputtering particles with primarily a vertical velocity from a dielectric located above the resistive change element.

FIG. 12 illustrates a flow chart showing a method for fabricating resistive change elements in a resistive change element array.

DETAILED DESCRIPTION

Figure 1:
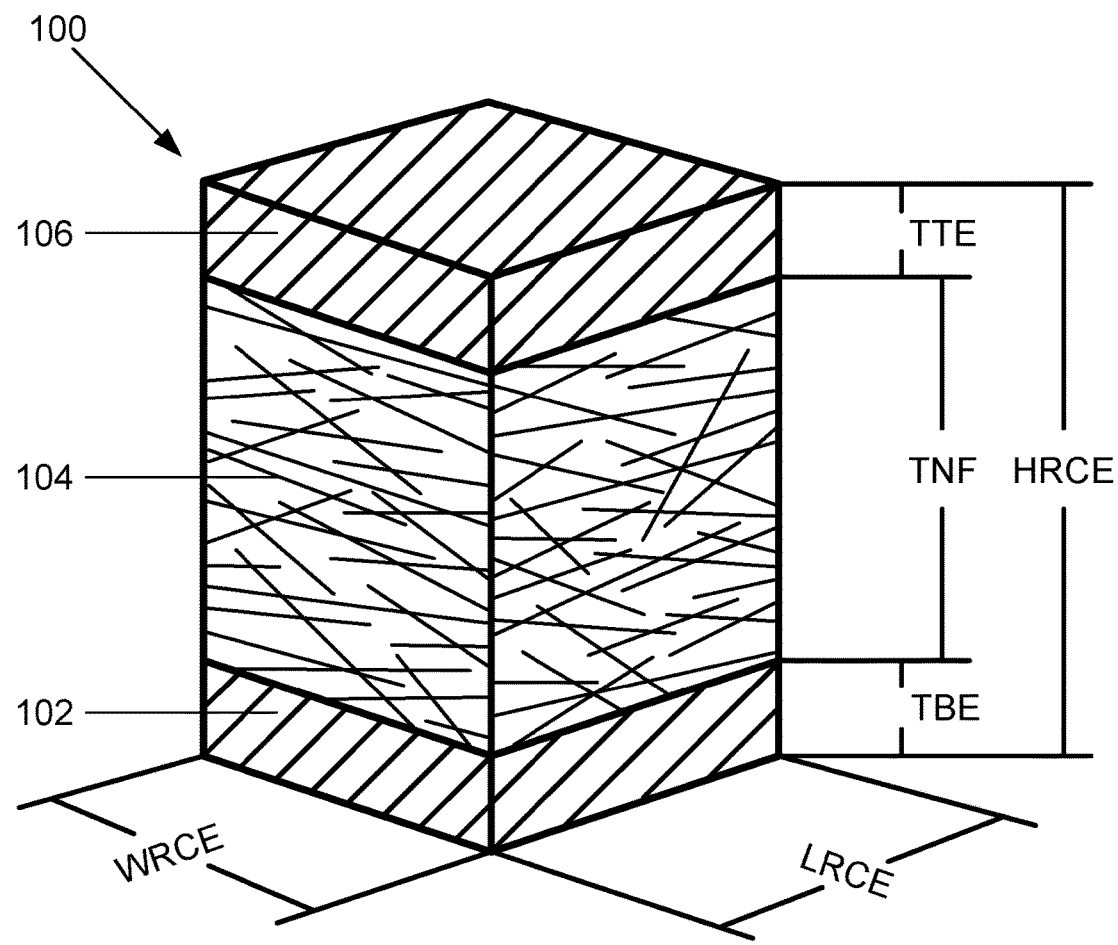
FIG. 1 illustrates a three-dimensional view of a resistive change element having a square horizontal cross-sectional shape.

The present disclosure provides methods for scaling resistive change elements to smaller dimensions without substantially impacting the desired switching characteristics of the resistive change elements. The present disclosure also provides resistive change element arrays of resistive change elements scalable to smaller dimensions without substantially impacting the desired switching characteristics. The present disclosure further provides sealed resistive change elements. Resistive change elements switch between at least two non-volatile resistive states through the use of resistive change materials included in the resistive change elements. Materials used for fabricating other sections of resistive change elements penetrating into resistive change materials of the resistive change elements can impact the switching characteristics of the resistive change elements with the impact becoming more appreciable as the resistive change elements are scaled to smaller dimensions. Materials used for fabricating other sections of resistive change element arrays penetrating into resistive change materials of resistive change elements in the arrays can impact the switching characteristics of the resistive change elements with the impact becoming more appreciable as the resistive change elements are scaled to smaller dimensions. Contaminants penetrating into resistive change materials of the resistive change elements can impact the switching characteristics of the resistive change elements with the impact becoming more appreciable as the resistive change elements are scaled to smaller dimensions.

The methods of the present disclosure reduce the impact of materials used for fabricating other sections of resistive change elements penetrating into resistive change materials of the resistive change elements. The methods of the present disclosure reduce the impact of materials used for fabricating other sections of resistive change element arrays penetrating into resistive change materials of resistive change elements. The methods of the present disclosure reduce the impact of contaminants penetrating into resistive change materials of resistive change elements. The resistive change element arrays of resistive change elements of the present disclosure reduce the impact of materials used for fabricating other sections of the resistive change elements penetrating into resistive change materials of the resistive change elements. The resistive change element arrays of resistive change elements of the present disclosure reduce the impact of materials used for fabricating other sections of resistive change element arrays penetrating into resistive change materials of the resistive change elements. The resistive change element arrays of resistive change elements of the present disclosure reduce the impact of contaminants penetrating into resistive change materials of the resistive change elements.

Resistive change elements (and arrays thereof) are well suited for use as non-volatile memory devices for storing digital data (storing logic values as resistive states) within electronic devices (such as, but not limited to, cell phones, digital cameras, solid state hard drives, and computers). For example, resistive change elements can be used in a variety of types of resistive change memory cells, such as 1T1R resistive change memory cells, 1D1R resistive change memory cells, and 1-R resistive change memory cells. 1T1R resistive change memory cells include a transistor to provide a selectability function for that cell and a resistive change element. 1D1R resistive change memory cells include a diode to provide a selectability function for that cell and a resistive change element. 1-R resistive change memory cells, also referred to as nR resistive change memory cells, include a resistive change element and do not include an in situ selection device or other current limiting device. However, the use of resistive change elements is not limited to memory applications. Resistive change elements (and arrays thereof) are also well suited for use as switches, reprogrammable fuses, and antifuses. Further, resistive change elements and (arrays thereof) are well suited for use in a variety of devices such as memory devices, routing devices, logic devices, including programmable logic devices such as FPGAs, sensor devices, and analog circuits.

Resistive change memory cells, such as 1T1R cells, 1D1R cells, and 1-R cells, store information through the use of a resistive change element within the cell. Responsive to electrical stimulus, the resistive change element can be adjusted between at least two non-volatile resistive states. Typically, two resistive states are used: a low resistive state (corresponding, typically, to a logic '1,' a SET state) and a high resistive state (corresponding, typically, to a logic '0,' a RESET state). In this way, the resistance value of the resistive change element within the resistive change memory cell can be used to a store a bit of information. According to other aspects of the present disclosure, more than two resistive states are used, allowing a single cell to store more than one bit of information. For example, a resistive change memory cell might adjust its resistive change element between four non-volatile resistive states, allowing for the storage of two bits of information in a single cell. Resistance values corresponding with non-volatile resistive states are typically separated by an amount of resistance so that a non-volatile resistive state of a resistive change element can be determined during a READ operation. For example, a resistive change element can have a low resistive state (corresponding, typically, to a logic '1,' a SET state) corresponding with a resistance value on the order of 1 MΩ, and a high resistive state (corresponding, typically, to a logic '0,' a RESET state) corresponding with a resistance value on the order of 10 MΩ.

A resistive change element is adjusted (programmed) between at least two non-volatile resistive states by applying electrical stimuli across the resistive change element. A make electrical stimulus of one or more programming pulses of specific voltages, currents, and pulse widths can be applied across a resistive change element to adjust a resistance of a resistive change material, such as a nanotube fabric layer for carbon nanotube memory such as NRAM®, from an initial resistance to a new desired resistance. A break electrical stimulus of one or more programming pulses of specific voltages, currents, and pulse widths can be applied across a resistive change element to adjust a resistance of a resistive change material, such as a nanotube fabric layer for carbon nanotube memory such as NRAM®, back to the initial resistance or, depending on the specific application, a third resistance. The specific voltages, currents, and pulse widths of the one or more programming pulses of the make electrical stimulus and the break electrical stimulus can be adjusted as required by the needs of a specific application. For example, the specific voltages, currents, and pulse widths of the one or more programming pulses of the make electrical stimulus and the break electrical stimulus can be adjusted based on resistance values corresponding with non-volatile resistive states of a resistive change element, dimensions of a resistive change element, materials of a resistive change element, and/or the configuration of a resistive change element array.

Alternatively, the make electrical stimulus is a pulse train made up of a series of sub-pulses applied in immediate and rapid succession across a resistive change element to adjust a resistance of a resistive change material, such as a nanotube fabric layer for carbon nanotube memory such as NRAM®, from an initial resistance to a new desired resistance and the break electrical stimulus is a pulse train made up of a series of sub-pulses applied in immediate and rapid succession across a resistive change element to adjust a resistance of a resistive change material, such as a nanotube fabric layer for carbon nanotube memory such as NRAM®, back to the initial resistance or, depending on the specific application, a third resistance. The present disclosure uses the term pulse train to refer to a long or short burst of sub-pulses applied in immediate and rapid succession to successively stimulate a resistive change material within a resistive change element multiple times. As described in U.S. patent application Ser. No. 15/136,414, applying pulse trains to adjust a resistance of resistive change material tends to adjust the resistive change element into non-volatile states that exhibit significantly less drift over time because the successive stimulation of the resistive change material by pulse trains tends to correct any unstable or metastable state within the resistive change material.

The voltage, current, duty cycle, frequency, and length of time of pulse trains of the make electrical stimulus and the break electrical stimulus can be adjusted as required by the needs of a specific application. For example, the voltage, current, duty cycle, frequency, and length of time of pulse trains of the make electrical stimulus and the break electrical stimulus can be adjusted based on resistance values corresponding with non-volatile resistive states of a resistive change element, materials of the resistive change element, and/or the configuration of a resistive change element array. Additionally, the specific voltages, currents, and pulse widths of the sub-pulses can be separately adjusted as required by the needs of a specific application, such that successive sub-pulses in pulse trains of the make electrical stimulus and the break electrical stimulus can have differing voltages, currents, and/or pulse widths. For example, the specific voltages, currents, and pulse widths of the sub-pulses of pulse trains of the make electrical stimulus and the break electrical stimulus can be adjusted based on resistance values corresponding with non-volatile resistive states of a resistive change element, dimensions of a resistive change element, materials of a resistive change element, and/or the configuration of a resistive change element array.

Further, for resistive change elements including top and bottom electrodes and a nanotube fabric layer, the electrical characteristics of the make electrical stimulus and the break electrical stimulus can be based on various parameters such as, but not limited to, the thickness of the nanotube fabric layer, the top and bottom electrode interfacial contact resistances, the number of switching sites in the nanotube fabric layer, doping of the nanotube fabric layer, inclusion of nanoscopic particles such as silica, and/or type of nanotube forming the nanotube fabric layer such as kinked, single-wall, multi-wall, etc. Types of nanotubes are further described in U.S. Pat. Nos. 9,337,423. U.S. Pat. No. 8,941,094 discusses methods to modify the nanotube fabric layer and electrode interfaces which may include, but not limited to filler material, ion implantation with the appropriate implant parameters such as ion energy, species, and dose directed to the interface/s between the nanotube fabric layer and the metals that form the contacts to the nanotube fabric. Ions implanted into these regions can be used to modify the contact characteristics of the nanotube layer fabric and the top and bottom electrodes. Lowering the contact resistance increases the drop in applied voltage to the nanotube fabric layer and decrease the voltage drop across the interfaces between the bottom electrode and the nanotube fabric layer.

As discussed below, increasing the number of switching sites within the nanotube fabric layer through nanotube defects, such as nanotubes having kink defects and nanotubes having curved shaped, that increase the volume of space covered by nanotube movement, limiting the dielectric penetration into the nanotube fabric layer, reducing top electrode penetration by aligning the top layer of the nanotube fabric layer as disclosed in U.S. Pat. No. 9,390,790, by controlling filler material (such as $SiO_2$) as disclosed in U.S. Pat. Nos. 9,337,423, 9,287,356 and functionalizing the nanotubes as disclosed in U.S. Pat. No. 9,337,423, for example can influence and provide a reduction in the programming voltage.

Referring now to FIG. 1, a three-dimensional view of a resistive change element 100 having a square horizontal cross-sectional shape is illustrated. The resistive change element 100 includes a bottom electrode 102, a nanotube fabric layer 104, and a top electrode 106. The bottom electrode 102 is in contact with the nanotube fabric layer 104 and the top electrode 106 is in contact with the nanotube fabric layer 104. Alternatively, the resistive change element 100 can include at least one intervening layer located between the bottom electrode 102 and the nanotube fabric layer 104, at least one intervening layer located between the nanotube fabric layer 104 and the top electrode 106, or at least one intervening layer located between the bottom electrode 102 and the nanotube fabric layer 104 and at least one intervening layer located between the nanotube fabric layer 104 and the top electrode 106. Alternatively, the bottom electrode 102 can be omitted from the resistive change element 100, the top electrode 106 can be omitted from the resistive change element 100, or the bottom electrode 102 and the top electrode 106 can be omitted from the resistive change element 100.

The resistive change element 100 has a length $L_{RCE}$, a width $W_{RCE}$, and a height $H_{RCE}$, where the length $L_{RCE}$ is approximately equal to F, the width $W_{RCE}$ is approximately equal to F, and the height $H_{RCE}$ is approximately equal to the sum of the thicknesses of the bottom electrode 102, the nanotube fabric layer 104, and the top electrode 106. The height $H_{RCE}$ of the resistive change element 100 is typically larger than F, however, the height $H_{RCE}$ of the resistive change element 100 can be scaled, such that height $H_{RCE}$ approaches F. F represents a minimum feature size to achieve maximum resistive change element density in a resistive change element array. Alternatively, the resistive change element 100 can have a length $L_{RCE}$ larger than F, a width $W_{RCE}$ larger than F, and/or a height $H_{RCE}$ larger than F. Alternatively, the resistive change element 100 can have a non-square horizontal cross-sectional shape, such as a rectangular horizontal cross-sectional shape, a circular horizontal cross-sectional shape, an oval horizontal cross-sectional shape, a triangular horizontal cross-sectional shape, a trapezoidal horizontal cross-sectional shape, an irregular horizontal cross-sectional shape, and a non-uniform horizontal cross-sectional shape where different sections of the resistive change element 100 can have different dimensions. The bottom electrode 102, the nanotube fabric layer 104, and the top electrode 106 have square horizontal cross-sectional shapes because the resistive change element 100 has a square horizontal cross-sectional shape. The bottom electrode 102 has a length dimension approximately equal to F, a width dimension approximately equal to F, and a thickness TBE. The nanotube fabric layer 104 has a length dimension approximately equal to F, a width dimension approximately equal to F, and a thickness TNF. The top electrode 106 has a length dimension approximately equal to F, a width dimension approximately equal to F, and a thickness TTE.

The resistive change element 100 can be adjusted (programmed) between at least two non-volatile resistive states by applying electrical stimuli across the resistive change element 100. As discussed above, a make electrical stimulus including one or more programming pulses of specific voltages, currents, and pulse widths or a pulse train made up of a series of sub-pulses can be applied across the resistive change element 100 to adjust a resistance of the nanotube fabric layer 104, from an initial resistance to a new desired resistance. Also, as discussed above, a break electrical stimulus including one or more programming pulses of specific voltages, currents, and pulse widths or a pulse train made up of a series of sub-pulses can be applied across the resistive change element 100 to adjust a resistance of the nanotube fabric layer 104, back to the initial resistance or, depending on the specific application, a third resistance. It is noted that the resistance of the nanotube fabric layer 104 includes the resistance of the nanotubes forming the nanotube fabric layer 104, the contact resistance between the nanotube fabric layer 104 and the bottom electrode 102, and the contact resistance between the nanotube fabric layer 104 and the top electrode 106.

The make electrical stimulus induces microscopic movement of the nanotubes in the nanotube fabric layer 104 to make conductive paths in the nanotube fabric layer 104, while the break electrical stimulus induces microscopic movement of the nanotubes in the nanotube fabric layer 104 to break conductive paths in the nanotube fabric layer 104. It is noted that conductive paths in the nanotube fabric layer 104 refers to conductive paths between nanotubes and the bottom electrode 102, conductive paths between nanotubes and the top electrode 106, and conductive paths between nanotubes. The make electrical stimulus switches the resistive state of the resistive change element 100 from a high resistive state to a low resistive state because making conductive paths in the nanotube fabric layer 104 decreases the resistance of the nanotube fabric layer 104. The make electrical stimulus makes conductive paths in the nanotube fabric layer 104 by causing the nanotubes to become electrostatically attractive and move into contact at switching sites. The conductive paths made by the make electrical stimulus remain after the make electrical stimulus is applied because the nanotubes are held in contact at switching sites by Van der Waals forces. The break electrical stimulus switches the resistive state of the resistive change element 100 from a low resistive state to a high resistive state because breaking conductive paths in the nanotube fabric layer 104 increases the resistance of the nanotube fabric layer 104. The break electrical stimulus breaks conductive paths in the nanotube fabric layer 104 by causing phonons or vibrations in the nanotube fabric layer 104 that overcome the Van der Waals forces holding the nanotubes in contact at the switching sites and cause the nanotubes to move apart a distance outside of the Van der Waals forces. The conductive paths broken by the break electrical stimulus remain broken after the break electrical stimulus is applied because the nanotubes remain apart at the switching sites. Switching sites refer to areas where conductive paths in the nanotube fabric layer 104 can be made and broken. With applicable programming algorithms, as discussed in U.S. Pat. No. 8,102,018, the resistive state of the resistive change element 100 can be controlled between a low resistive state and a high resistive state.

The resistance values of the low resistive state and the high resistive state are based on the number of conductive paths in the nanotube fabric layer 104. The resistance value for the low resistive state is less than the resistance value for the high resistive state because the number of conductive paths in the nanotube fabric layer 104 for the low resistive state is greater than the number of conductive paths in the nanotube fabric layer 104 for the high resistive state. The difference between the resistance values for the low resistive state and the high resistive state is based on the difference between the number of conductive paths in the nanotube fabric layer 104 for the low resistive state and the number of conductive paths in the nanotube fabric layer 104 for the high resistive state. The difference between the resistance values for the low resistive state and the high resistive state increases when the difference between the number of conductive paths in the nanotube fabric layer 104 for the low resistive state and the number of conductive paths in the nanotube fabric layer 104 for the high resistive state increases. The difference between the resistance values for the low resistive state and the high resistive state decreases when the difference between the number of conductive paths in the nanotube fabric layer 104 for the low resistive state and the number of conductive paths in the nanotube fabric layer 104 for the high resistive state decreases.

Determining whether a resistive change element is in a low resistive state or a high resistive state becomes more difficult as the difference between the resistance values for the low resistive state and the high resistive state decreases. In some instances, where there is a small difference or no difference between a resistance value for a low resistive state and a resistance value for the high resistive state, a resistive state of a resistive change element cannot be determined. For example, when the number of conductive paths in a nanotube fabric layer for a low resistive state is approximately equal to the number of conductive paths in the nanotube fabric layer for a high resistive state, a resistance value for the low resistive state is approximately equal to a resistance value for the high resistive state and the resistive state of the resistive change element cannot be determined.

The number of conductive paths made by the make electrical stimulus generally decreases as the movement of the nanotubes in the nanotube fabric layer 104 is restricted because for the make electrical stimulus to make conductive paths in the nanotube fabric layer 104 the nanotubes must be able to move into contact at switching sites. Additionally, the number of conductive paths broken by the break electrical stimulus generally decreases as the movement of the nanotubes in the nanotube fabric layer 104 is restricted because fewer conductive paths are formed by the make electrical stimulus, and thus, the nanotube fabric layer 104 has fewer conductive paths that can be broken by the break electrical stimulus. Further, the number of conductive paths made by the make electrical stimulus and the number of conductive paths broken by the break electrical stimulus also generally decreases as the cross-sectional area of the nanotube fabric layer 104 decreases because the number of switching sites in nanotube fabric layer 104 generally decreases as the cross-sectional area of the nanotube fabric layer 104 decreases.

Figure 2A:
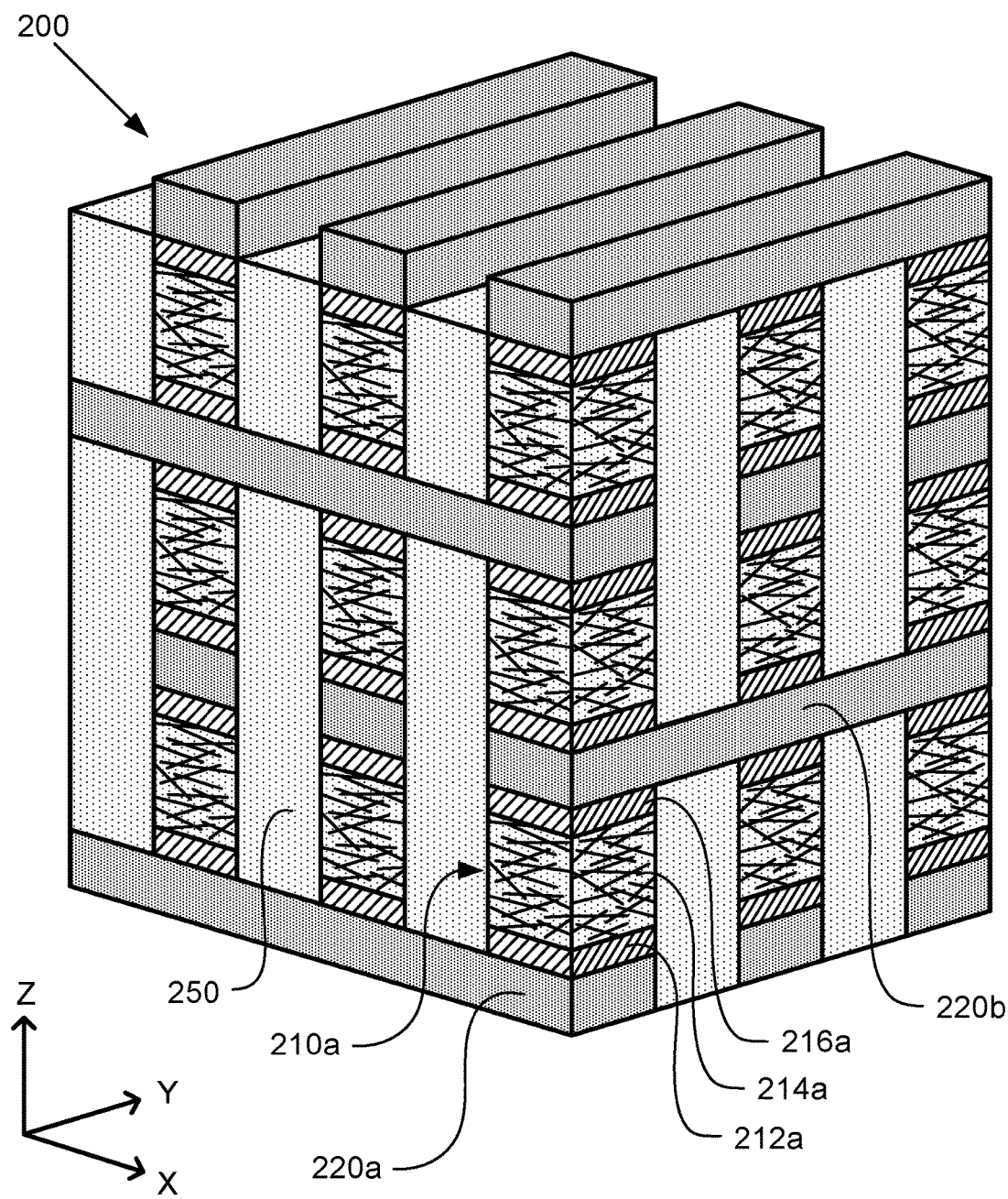
FIG. 2A illustrates a three-dimensional view of a three-dimensional cross point resistive change element array including a plurality of resistive change elements, a plurality of interconnect conductors, and a dielectric filling the regions between the resistive changes elements and the interconnect conductors.

Referring now to FIG. 2A, a three-dimensional view of a three-dimensional cross point resistive change element array 200 is illustrated. The three-dimensional cross point resistive change element array 200 includes a plurality of resistive change elements arranged in three dimensions, a plurality of interconnect conductors, and a dielectric 250, such as a flowable dielectric, filling the regions around the resistive changes elements and the interconnect conductors. Each resistive change element in the plurality of resistive change elements is located where an interconnect conductor in the plurality of interconnect conductors crosses another interconnect conductor in the plurality of interconnect conductors with interconnect conductors between resistive change elements on consecutive levels being common. Alternatively, the three-dimensional cross point resistive change element array 200 can include separate interconnect conductors for the resistive change elements on consecutive levels. The regions around the resistive change elements and the interconnect conductors can be filled with a flowable dielectric using equipment for depositing a flowable low-dielectric constant gap filling material, such as a PRODUCER® ETERNA™ FCVD™. Each resistive change element in the plurality of resistive change elements has the same structure, and thus, the discussion below of resistive change element 210a is applicable to each resistive change element in the plurality of resistive change elements. Each interconnect conductor in the plurality of interconnect conductors has the same structure, and thus, the discussion below of interconnect conductors 220a and 220b is applicable to each interconnect conductor in the plurality of interconnect conductors. The three-dimensional view of the three-dimensional cross point resistive change element array 200 is shown along the vertical sides of resistive change elements in the y-z plane and along the vertical sides of resistive change elements in the x-z plane so that the structure of the resistive change elements can be shown, however, the dielectric 250 also fills the regions around the vertical sides of the resistive change elements in the y-z plane and the vertical sides of the resistive change elements in the x-z plane shown in FIG. 2A.

The resistive change elements in the three-dimensional cross point resistive change element array 200 are isolated from each other by the dielectric 250 that fills the regions around the resistive change elements. The dielectric 250 prevents undesired current flow and cross-talk, however, as discussed below the dielectric 250 penetrates into the nanotube fabric layers of the resistive change elements and restricts the movement of the nanotubes. The adjacent resistive change elements in the three-dimensional cross point resistive change element array 200 are separated by a distance F, where F represents a minimum feature size to achieve maximum resistive change element density in a resistive change element array. Alternatively, the distance separating adjacent resistive change elements in the three-dimensional cross point resistive change element array 200 is larger than F. It is noted that although the three-dimensional cross point resistive change element array 200 is shown in FIG. 2A including twenty seven resistive change elements in three by three matrices on three levels, the three-dimensional cross point resistive change element array 200 is not limited to twenty seven resistive change elements in three by three matrices on three levels, and that the three-dimensional cross point resistive change element array 200 can include a plurality of resistive change elements, other shapes and sizes of matrices, and a plurality of levels.

Figure 2B:
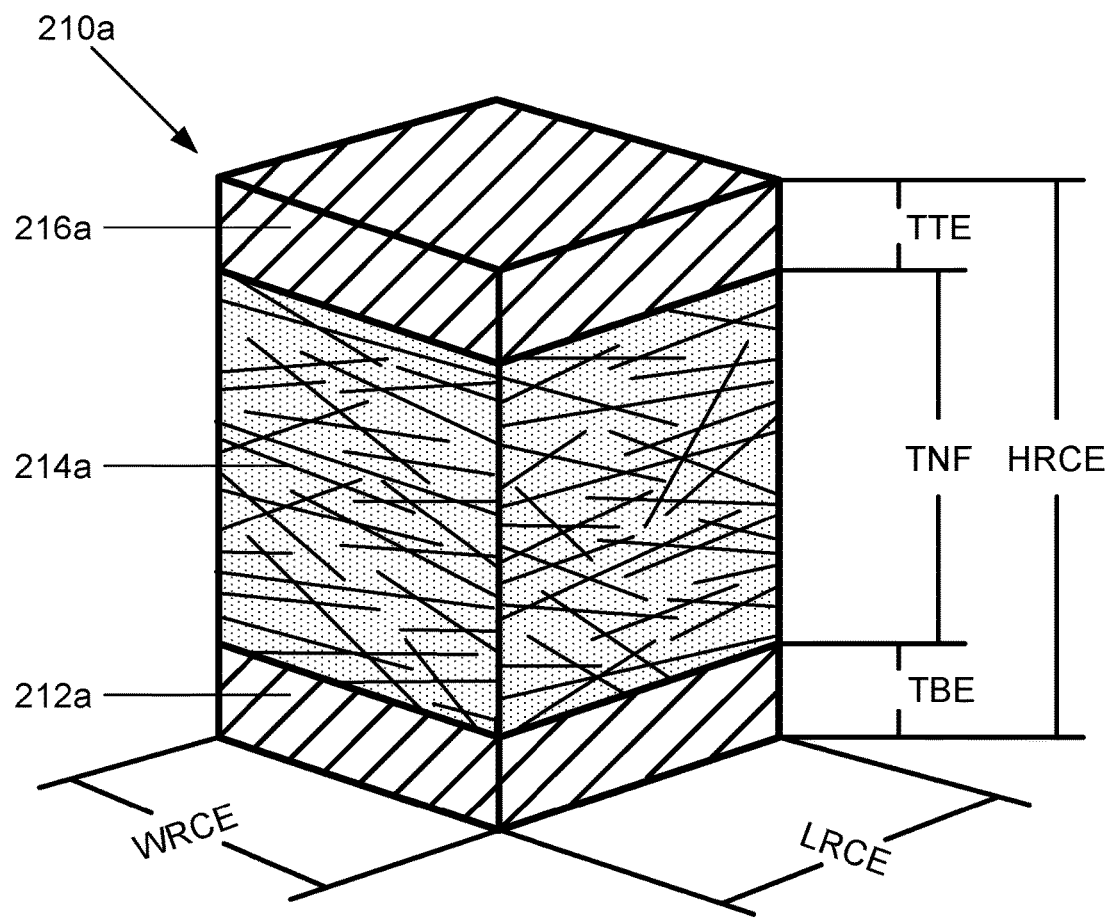
FIG. 2B illustrates a three-dimensional view of a resistive change element from the three-dimensional cross point resistive change element array of FIG. 2A.

Referring now to FIG. 2B, a three-dimensional view of a resistive change element 210a from the three-dimensional cross point resistive change element array 200 is illustrated. The discussion of the resistive change element 210a is applicable to each resistive change element in the plurality of resistive change elements because each resistive change element in the plurality of resistive change elements has the same structure. The resistive change element 210a includes a bottom electrode 212a, a nanotube fabric layer 214a formed with nanotubes that are relatively defect free, and a top electrode 216a. The bottom electrode 212a is in contact with the nanotube fabric layer 214a and the top electrode 216a is in contact with the nanotube fabric layer 214a. Alternatively, the resistive change element 210a can include at least one intervening layer located between the bottom electrode 212a and the nanotube fabric layer 214a, at least one intervening layer located between the nanotube fabric layer 214a and the top electrode 216a, or at least one intervening layer located between the bottom electrode 212a and the nanotube fabric layer 214a and at least one intervening layer located between the nanotube fabric layer 214a and the top electrode 216a. Alternatively, the bottom electrode 212a can be omitted from the resistive change element 210a, the top electrode 216a can be omitted from the resistive change element 210a, or the bottom electrode 212a and the top electrode 216a can be omitted from the resistive change element 210a.

The resistive change element 210a has a square horizontal cross-sectional shape, a length $L_{RCE}$, a width $W_{RCE}$, and a height $H_{RCE}$, where the length $L_{RCE}$ is approximately equal to F, the width $W_{RCE}$ is approximately equal to F, and the height $H_{RCE}$ is approximately equal to the sum of the thicknesses of the bottom electrode 212a, the nanotube fabric layer 214a, and the top electrode 216a. The height $H_{RCE}$ of the resistive change element 210a is typically larger than F, however, the height $H_{RCE}$ of the resistive change element 210a can be scaled, such that height $H_{RCE}$ approaches F. F represents a minimum feature size to achieve maximum resistive change element density in a resistive change element array. Alternatively, the resistive change element 210a can have a length $L_{RCE}$ larger than F, a width $W_{RCE}$ larger than F, and/or a height $H_{RCE}$ larger than F. Alternatively, the resistive change element 210a can have a non-square horizontal cross-sectional shape, such as a rectangular horizontal cross-sectional shape, a circular horizontal cross-sectional shape, an oval horizontal cross-sectional shape, a triangular horizontal cross-sectional shape, a trapezoidal horizontal cross-sectional shape, an irregular horizontal cross-sectional shape, and a non-uniform horizontal cross-sectional shape where different sections of the resistive change element 210a can have different dimensions. The bottom electrode 212a, the nanotube fabric layer 214a, and the top electrode 216a have square horizontal cross-sectional shapes because the resistive change element 210a has a square horizontal cross-sectional shape. The bottom electrode 212a has a length dimension approximately equal to F, a width dimension approximately equal to F, and a thickness TBE. The nanotube fabric layer 214a has a length dimension approximately equal to F, a width dimension approximately equal to F, and a thickness TNF. The top electrode 216a has a length dimension approximately equal to F, a width dimension approximately equal to F, and a thickness TTE.

Referring back to FIG. 2A, the bottom electrode 212a of the resistive change element 210a is in contact with the interconnect conductor 220a and the top electrode 216a of the resistive change element 210a is in contact with the interconnect conductor 220b. Alternatively, the bottom electrode 212a can be omitted and the nanotube fabric layer 214a can be in contact with the interconnect conductor 220a, the top electrode 216a can be omitted and the nanotube fabric layer 214a can be in contact with the interconnect conductor 220b, or the bottom electrode 212a and the top electrode 216a can be omitted and the nanotube fabric layer 214a can be in contact with the interconnect conductor 220a and the interconnect conductor 220b. Alternatively, the resistive change element 210a can include at least one intervening layer located between the bottom electrode 212a and the interconnect conductor 220a, at least one intervening layer located between the top electrode 216a and the interconnect conductor 220b, or at least one intervening layer located between the bottom electrode 212a and the interconnect conductor 220a and at least one intervening layer located between the top electrode 216a and the interconnect conductor 220b.

Figure 2C:
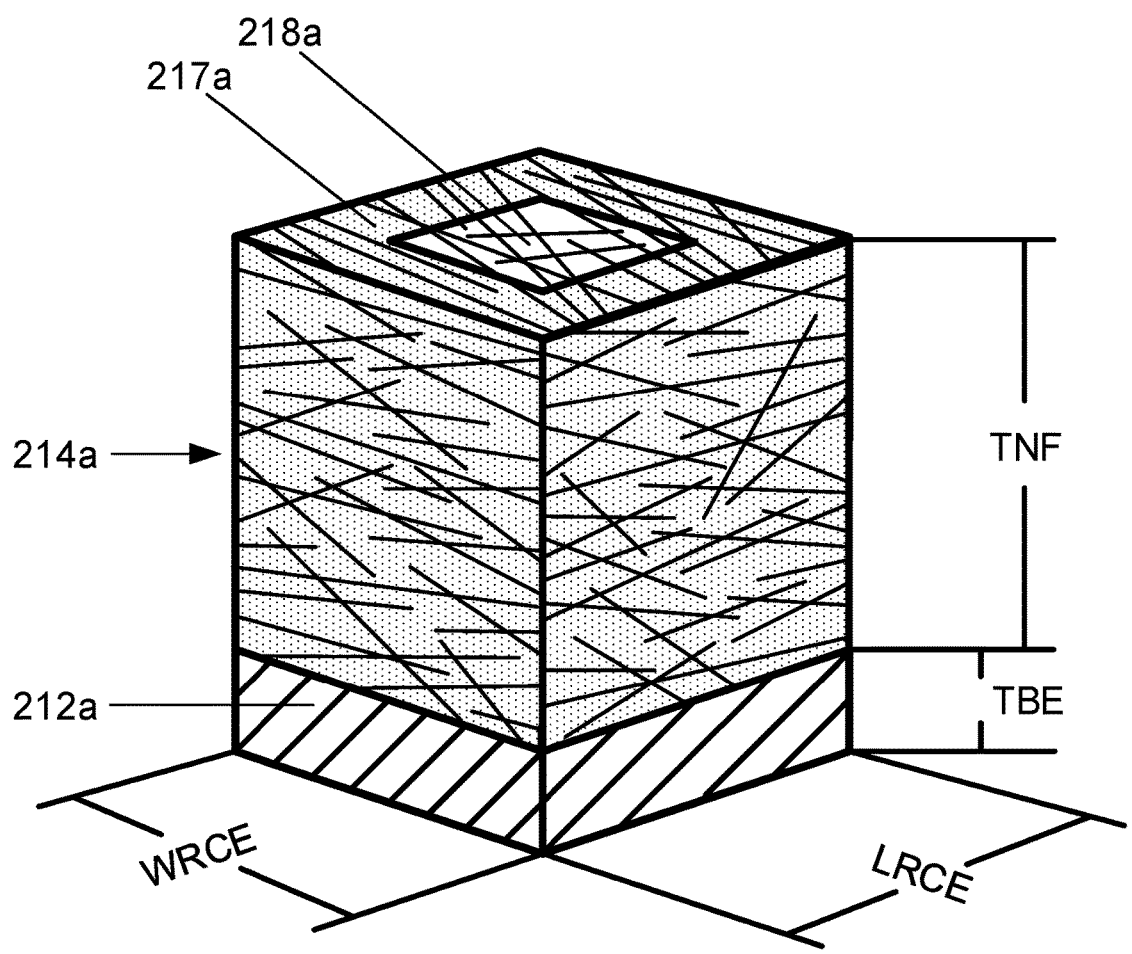
FIG. 2C illustrates a three-dimensional view of the resistive change element of FIG. 2B with the top electrode not shown so that the nanotube fabric layer can be shown in greater detail.

Referring now to FIG. 2C, a three-dimensional view of the resistive change element 210a with the top electrode 216a not shown so that the nanotube fabric layer 214a can be shown in greater detail is illustrated. The nanotube fabric layer 214a includes a pinned region 217a formed around an unpinned region 218a. The pinned region 217a is a region of the nanotube fabric layer 214a where the dielectric 250 has penetrated into the nanotube fabric layer 214a and the unpinned region 218a is a region of the nanotube fabric layer 214a where the dielectric 250 has not penetrated into the nanotube fabric layer 214a. It is noted that in some instances a dielectric may penetrate the entire nanotube fabric layer causing a nanotube fabric layer to include only a pinned region.

Figure 2D:
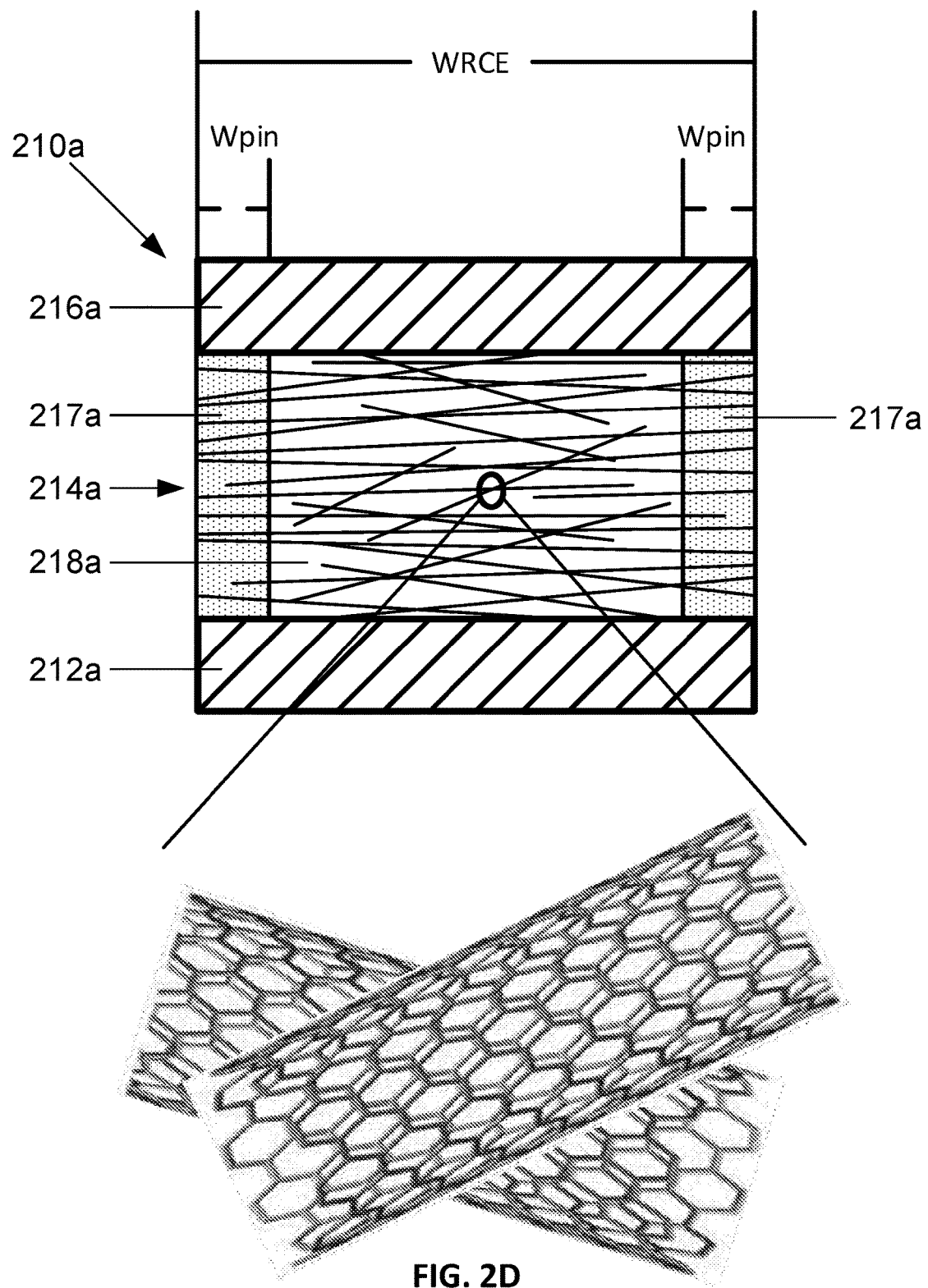
FIG. 2D illustrates a vertical cross-sectional view along the width of the resistive change element shown in FIG. 2B and a close up view showing nanotube to nanotube contacts in the nanotube fabric layer.
Figure 2E:
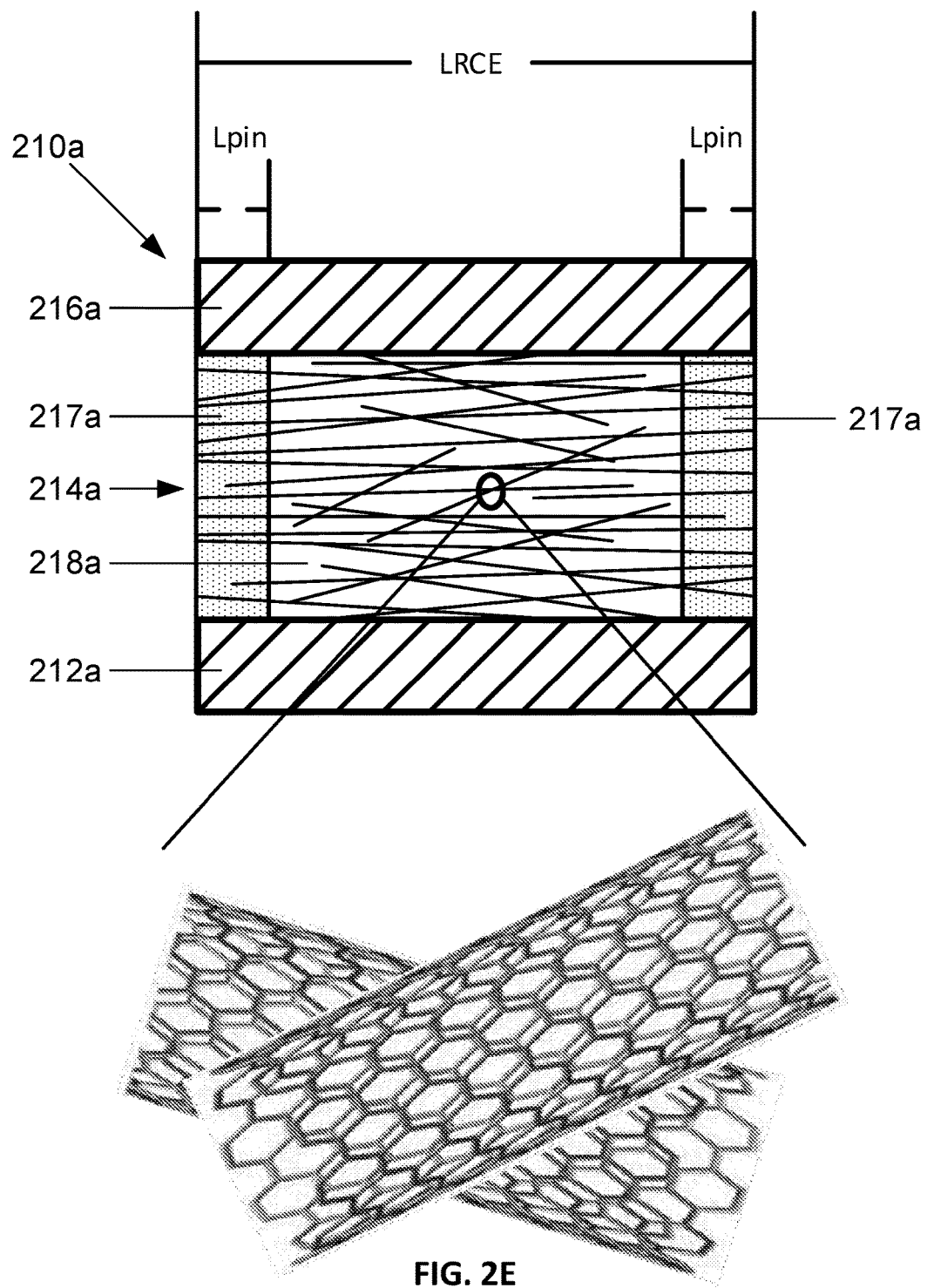
FIG. 2E illustrates a vertical cross-sectional view along the length of the resistive change element shown in FIG. 2B and a close up view showing nanotube to nanotube contacts in the nanotube fabric layer.

FIGS. 2D and 2E illustrate the distance the dielectric 250 has penetrated into the vertical sides of the nanotube fabric layer 214a. FIG. 2D illustrates a vertical cross-sectional view along the width of the resistive change element 210a showing the dielectric 250 penetrating a distance Wpin in the width dimension of the nanotube fabric layer 214a. FIG. 2E illustrates a vertical cross-sectional view along the length of resistive change element 210a showing the dielectric 250 penetrating a distance Lpin in the length dimension of the nanotube fabric layer 214a. FIGS. 2D and 2E show relatively defect free nanotubes having relatively straight cylindrical shapes. The close-up views of the nanotube fabric layer 214a in FIGS. 2D and 2E show switching sites formed by nanotube to nanotube contacts in the nanotube fabric layer 214a. Alternatively, as discussed below, resistive change elements can include nanotube fabric layers formed with nanotubes having defects introduced post nanotube deposition or nanotubes having intrinsic defects introduced prior to nanotube deposition.

The dielectric 250 penetrates into the nanotube fabric layer 214a when the regions around the resistive change elements in the three-dimensional cross point resistive change element array 200 are filled with the dielectric 250 because the nanotube fabric layer 214a is porous. The dielectric 250 penetrating into the nanotube fabric layer 214a restricts movement of nanotubes in the nanotube fabric layer 214a because the dielectric 250 holds in place nanotubes entirely in the pinned region 217a and holds in place portions of nanotubes in the pinned region 217a. The dielectric 250 restricts the movement of nanotubes having one end in the pinned region 217a and one end in the unpinned region 218a such that the nanotubes can bend or rotate. The dielectric 250 restricts the movement of nanotubes having both ends in the pinned region 217a and a middle portion in the unpinned region 218a such that the nanotubes can bend or rotate. The extent of space around the nanotubes covered by the nanotubes bending is relatively small because the nanotubes are extremely stiff. The extent of space around the nanotubes covered by the nanotubes rotating is relatively small because rotating relatively defect free nanotubes with relatively straight cylindrical shapes covers approximately the same volume of space as the volume of the nanotubes.

Figure 2F:
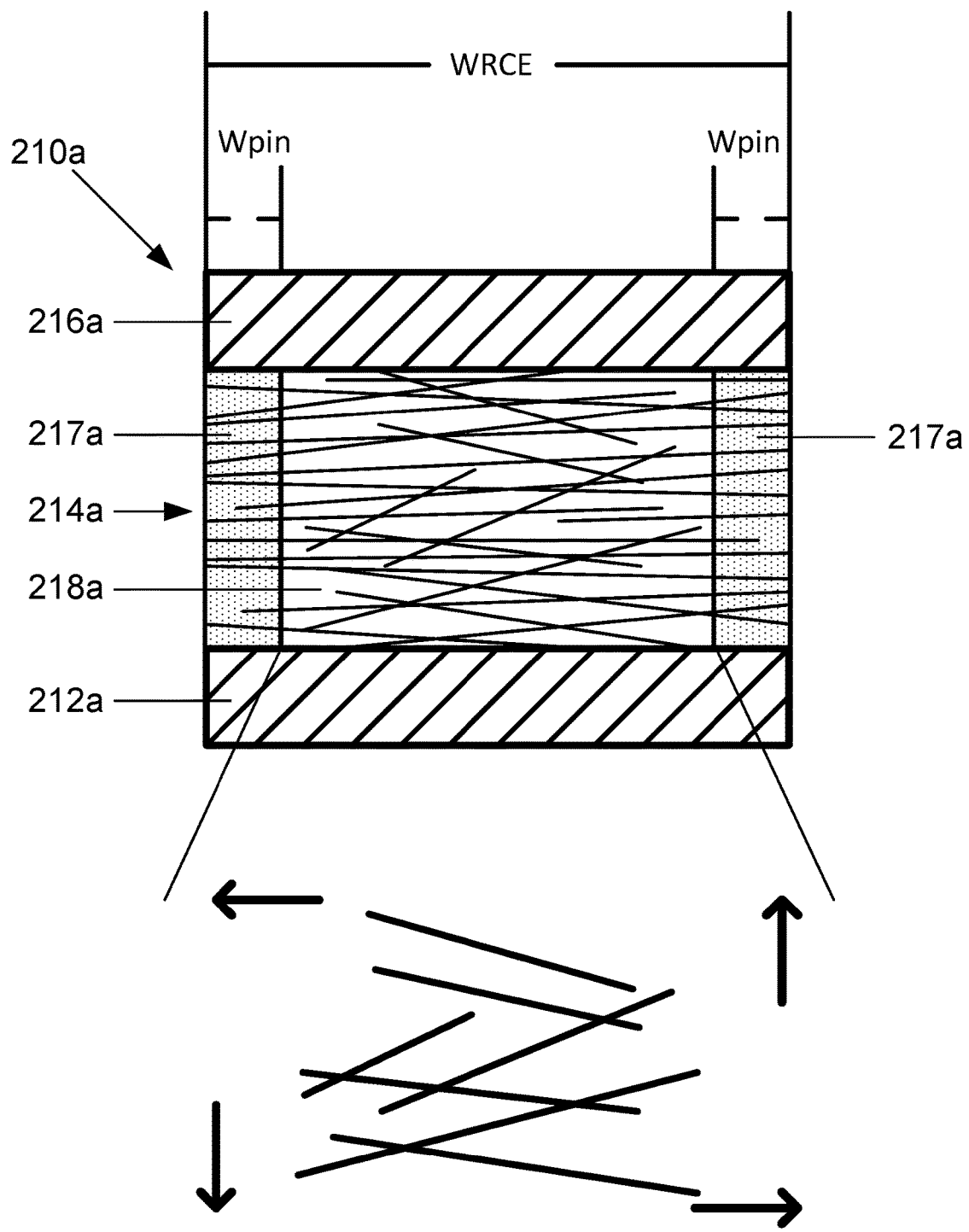
FIG. 2F illustrates a vertical cross-sectional view along the width of the resistive change element shown in FIG. 2B and a close up view showing the linear movement of nanotubes entirely in the unpinned region of the nanotube fabric layer.

The nanotubes entirely in the unpinned region 218a are not held in place by the dielectric 250, and thus, the nanotubes entirely in the unpinned region 218a can rotate, bend, and move linearly. The extent of space around the nanotubes entirely in the unpinned region 218a covered by the nanotubes bending is relatively small because the nanotubes are extremely stiff. The extent of space around the nanotubes entirely in the unpinned region 218a covered by the nanotubes rotating is relatively small because rotating relatively defect free nanotubes with relatively straight cylindrical shapes covers approximately the same volume of space as the volume of the nanotubes. The extent of space around the nanotubes entirely in the unpinned region 218a covered by the nanotubes moving linearly is relatively large. A close up view of the nanotube fabric layer 214a in FIG. 2F shows the linear movement of the nanotubes entirely in the unpinned region 218a.

The resistive change element 210a can be adjusted (programmed) between at least two non-volatile resistive states by applying electrical stimuli across the resistive change element 210a. As discussed above, a make electrical stimulus including one or more programming pulses of specific voltages, currents, and pulse widths or a pulse train made up of a series of sub-pulses can be applied across the resistive change element 210a to adjust a resistive state of the resistive change element 210a from a high resistive state to a low resistive state. Also, as discussed above, a break electrical stimulus including one or more programming pulses of specific voltages, currents, and pulse widths or a pulse train made up of a series of sub-pulses can be applied across the resistive change element 210a to adjust a resistive state of the resistive change element 210a from the low resistive state to the high resistive state. The dielectric 250 penetrating into the nanotube fabric layer 214a reduces the number of conductive paths made by the make electrical stimulus to switch the resistive change element 210a from the high resistive state to the low resistive state because the dielectric 250 penetrating into the nanotube fabric layer 214a restricts movement of nanotubes in the nanotube fabric layer 214a. Additionally, the dielectric 250 penetrating into the nanotube fabric layer 214a reduces the number of conductive paths broken by the break electrical stimulus to switch the resistive change element 210a from the high resistive state to the low resistive state because fewer conductive paths are formed by the make electrical stimulus, and thus, the nanotube fabric layer 214a has fewer conductive paths that can be broken by the break electrical stimulus. Thus, the difference between a resistive value for the low resistive state and a resistive value for a high resistive state is reduced by the dielectric 250 penetrating into the nanotube fabric layer 214a.

The impact of a dielectric penetrating into a nanotube fabric layer can be reduced by increasing the extent of space covered by movement of nanotubes in a nanotube fabric layer. The extent of space covered by movement of nanotubes in a nanotube fabric layer can be increased by introducing defects in nanotubes forming a nanotube fabric layer. The defects can be introduced in nanotubes in a nanotube fabric layer post nanotube deposition or the defects can be intrinsic to nanotubes deposited to form a nanotube fabric layer. Post nanotube deposition defects can be introduced through, but not limited to, ion implantation, chemical modification, or mechanical modification for example, as described in U.S. Pat. No. 8,941,094. Intrinsic nanotube defects are present in the nanotube feed material prior to depositing nanotubes to form a nanotube fabric layer in a fabrication process. Intrinsic nanotube defects can be introduced during purification processing and the intrinsic nanotube defects can be chemical induced or mechanically induced, for example, as described below.

Figure 3A:
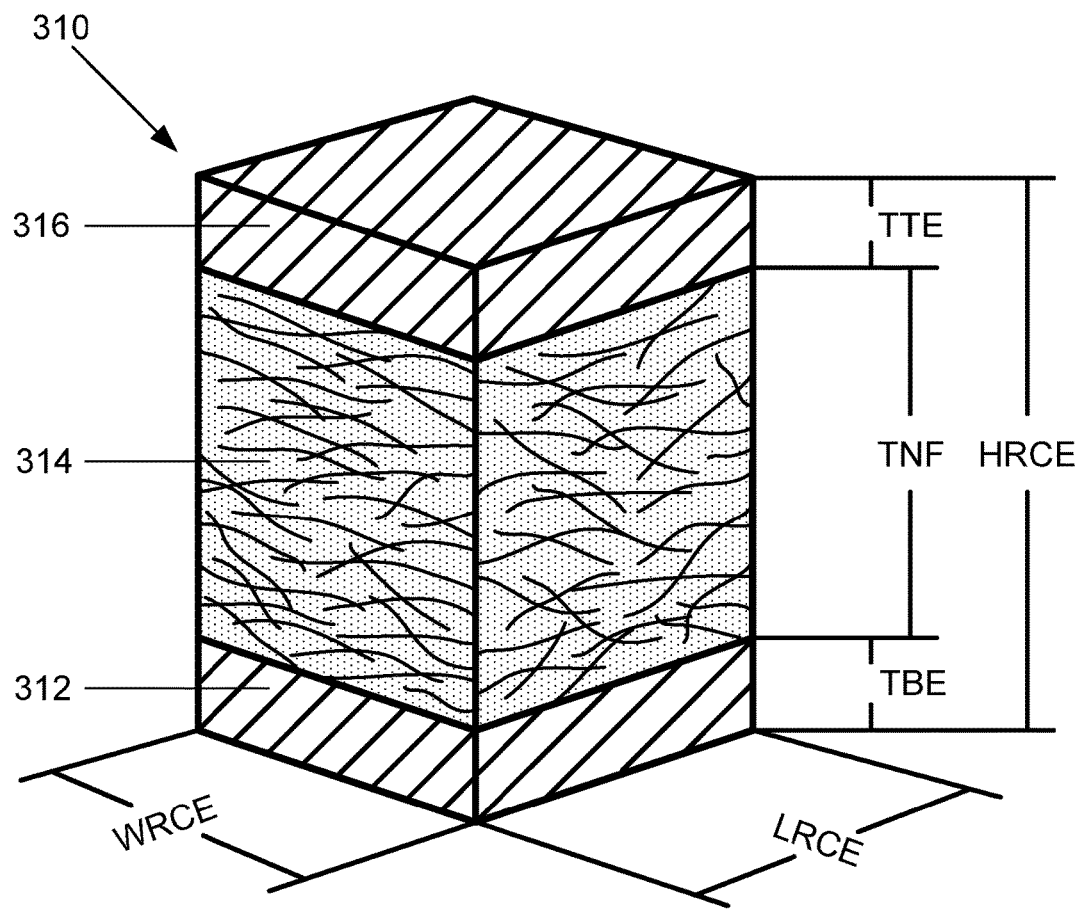
FIG. 3A illustrates a three-dimensional view of a resistive change element including a nanotube fabric layer formed with nanotubes having defects introduced post nanotube deposition.

Referring now to FIG. 3A, a three-dimensional view of a resistive change element 310 from a resistive change element array where a dielectric, such as a flowable dielectric, fills the regions around the resistive change element 310 is illustrated. The resistive change element 310 can be from a two-dimensional resistive change element array where a dielectric, such as a flowable dielectric, fills the regions around the resistive change element 310 or a three-dimensional resistive change element array where a dielectric, such as a flowable dielectric, fills the regions around the resistive change element 310. The resistive change element 310 includes a bottom electrode 312, a nanotube fabric layer 314 formed with nanotubes having defects introduced post nanotube deposition, and a top electrode 316. The nanotube fabric layer 314 is shown in FIG. 3A with the dielectric penetrating into the vertical sides of the nanotube fabric layer 314. The dielectric penetrates into the vertical sides of the nanotube fabric layer 314 because the nanotube fabric layer is porous.

The bottom electrode 312 is in contact with the nanotube fabric layer 314 and the top electrode 316 is in contact with the nanotube fabric layer 314. Alternatively, the resistive change element 310 can include at least one intervening layer located between the bottom electrode 312 and the nanotube fabric layer 314, at least one intervening layer located between the nanotube fabric layer 314 and the top electrode 316, or at least one intervening layer located between the bottom electrode 312 and the nanotube fabric layer 314 and at least one intervening layer located between the nanotube fabric layer 314 and the top electrode 316. Alternatively, the bottom electrode 312 can be omitted from the resistive change element 310, the top electrode 316 can be omitted from the resistive change element 310, or the bottom electrode 312 and the top electrode 316 can be omitted from the resistive change element 310.

The resistive change element 310 has a square horizontal cross-sectional shape, a length $L_{RCE}$, a width $W_{RCE}$, and a height $H_{RCE}$, where the length $L_{RCE}$ is approximately equal to F, the width $W_{RCE}$ is approximately equal to F, and the height $H_{RCE}$ is approximately equal to the sum of the thicknesses of the bottom electrode 312, the nanotube fabric layer 314, and the top electrode 316. The height $H_{RCE}$ of the resistive change element 310 is typically larger than F, however, the height $H_{RCE}$ of the resistive change element 310 can be scaled, such that height $H_{RCE}$ approaches F. F represents a minimum feature size to achieve maximum resistive change element density in a resistive change element array. Alternatively, the resistive change element 310 can have a length $L_{RCE}$ larger than F, a width $W_{RCE}$ larger than F, and/or a height $H_{RCE}$ larger than F. Alternatively, the resistive change element 310 can have a non-square horizontal cross-sectional shape, such as a rectangular horizontal cross-sectional shape, a circular horizontal cross-sectional shape, an oval horizontal cross-sectional shape, a triangular horizontal cross-sectional shape, a trapezoidal horizontal cross-sectional shape, an irregular horizontal cross-sectional shape, and a non-uniform horizontal cross-sectional shape where different sections of the resistive change element 310 can have different dimensions. The bottom electrode 312, the nanotube fabric layer 314, and the top electrode 316 have square horizontal cross-sectional shapes because the resistive change element 310 has a square horizontal cross-sectional shape. The bottom electrode 312 has a length dimension approximately equal to F, a width dimension approximately equal to F, and a thickness TBE. The nanotube fabric layer 314 has a length dimension approximately equal to F, a width dimension approximately equal to F, and a thickness TNF. The top electrode 316 has a length dimension approximately equal to F, a width dimension approximately equal to F, and a thickness TTE.

Figure 3B:
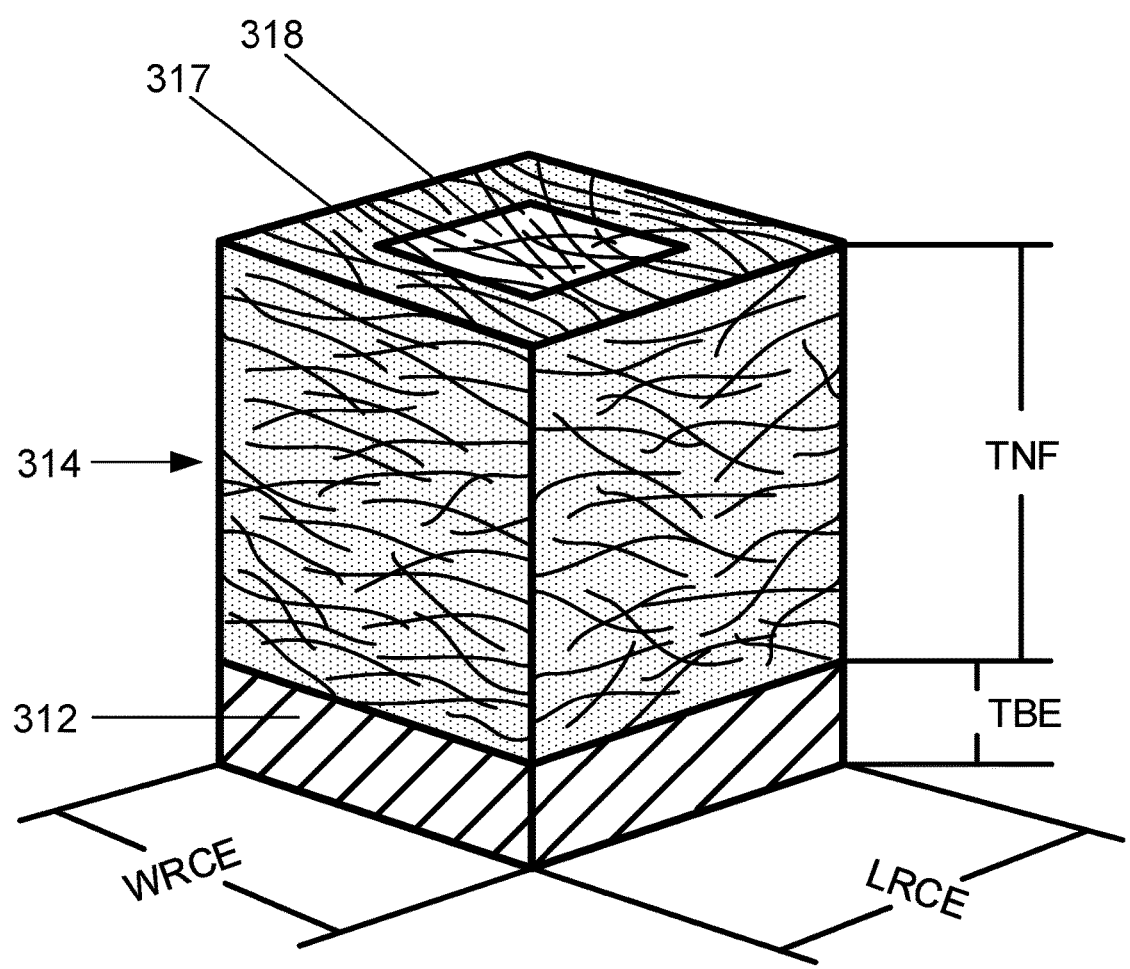
FIG. 3B illustrates a three-dimensional view of the resistive change element of FIG. 3A with the top electrode not shown so that the nanotube fabric layer can be shown in greater detail.

Referring now to FIG. 3B, a three-dimensional view of the resistive change element 310 with the top electrode 316 not shown so that the nanotube fabric layer 314 can be shown in greater detail is illustrated. The nanotube fabric layer 314 includes a pinned region 317 formed around an unpinned region 318. The pinned region 317 is a region of the nanotube fabric layer 314 where the dielectric, such as a flowable dielectric, has penetrated into the nanotube fabric layer 314 and the unpinned region 318 is a region of the nanotube fabric layer 314 where the dielectric has not penetrated into the nanotube fabric layer 314. It is noted that in some instances a dielectric may penetrate the entire nanotube fabric layer causing a nanotube fabric layer to include only a pinned region.

Figure 3C:
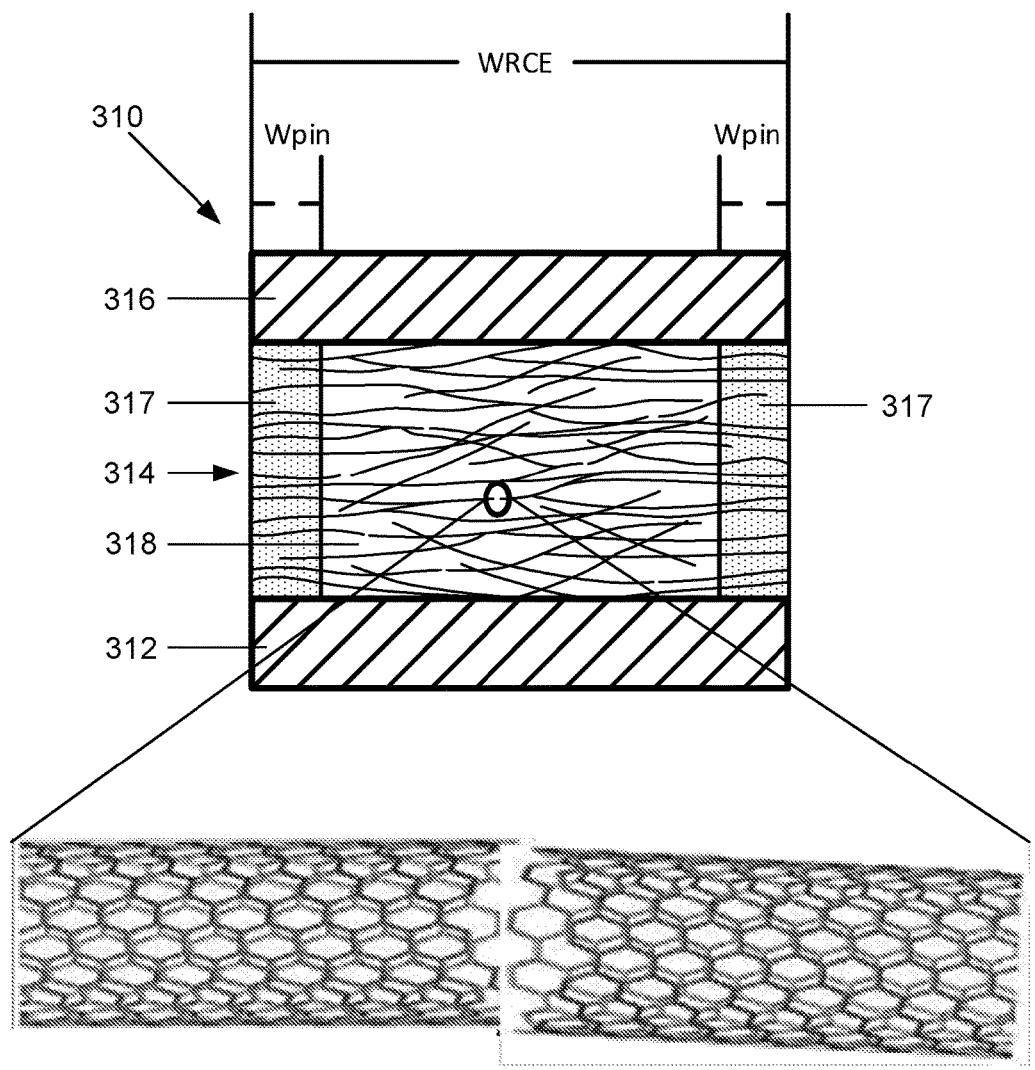
FIG. 3C illustrates a vertical cross-sectional view along the width of the resistive change element shown in FIG. 3A and a close up view showing nanotubes forming defect contacts in the nanotube fabric layer.
Figure 3D:
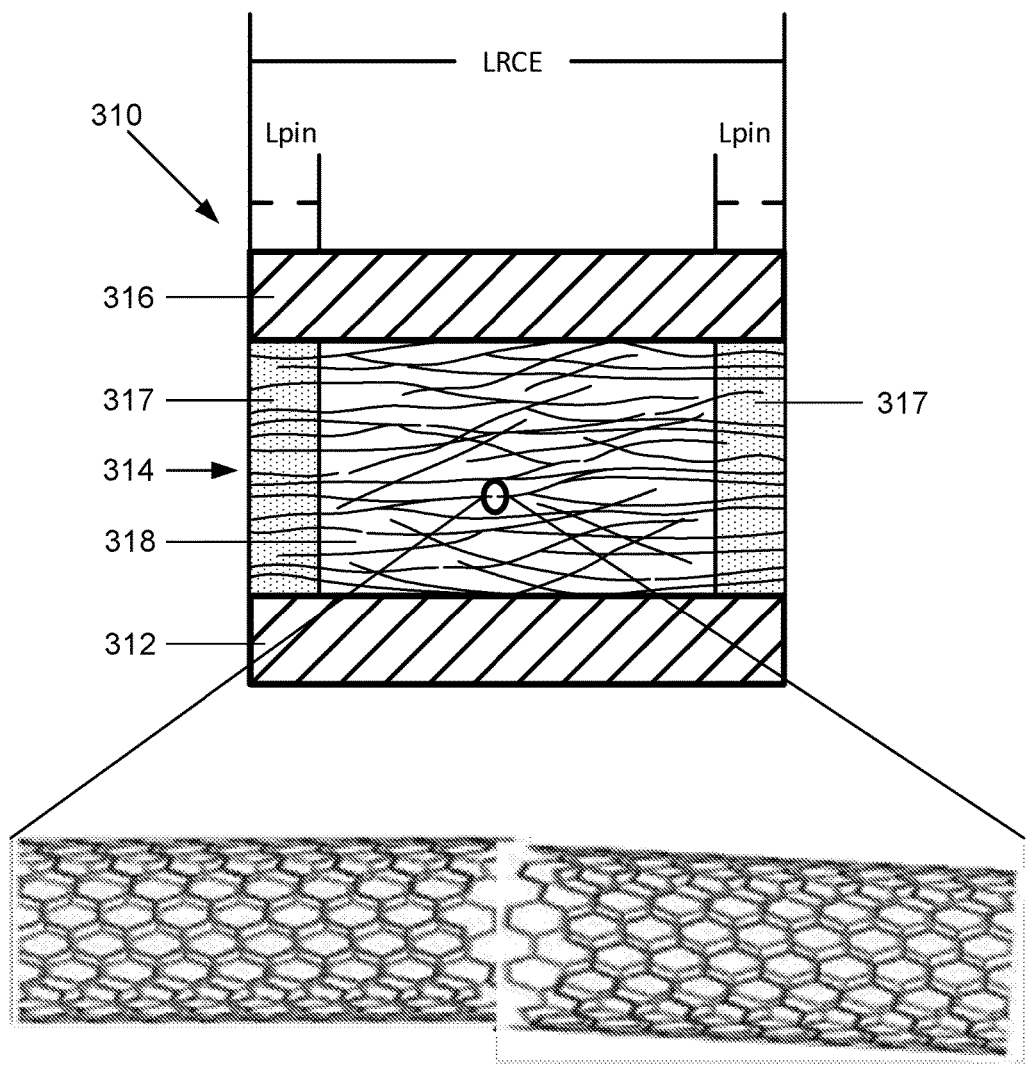
FIG. 3D illustrates a vertical cross-sectional view along the length of the resistive change element shown in FIG. 3A and a close up view showing nanotubes forming defect contacts in the nanotube fabric layer.

FIGS. 3C and 3D illustrate the distance the dielectric, such as a flowable dielectric, has penetrated into the vertical sides of the nanotube fabric layer 314. FIG. 3C illustrates a vertical cross-sectional view along the width of the resistive change element 310 showing the dielectric penetrating a distance Wpin in the width dimension of the nanotube fabric layer 314. FIG. 3D illustrates a vertical cross-sectional view along the length of the resistive change element 310 showing the dielectric penetrating a distance Lpin in the length dimension of the nanotube fabric layer 314. FIGS. 3C and 3D show nanotubes forming defect contacts and nanotubes having curved shapes in the nanotube fabric layer 314. The close-up views of the nanotube fabric layer 314 in FIGS. 3C and 3D showing nanotubes forming defect contacts. The nanotube fabric layer 314 is not limited to including nanotubes forming defect contacts and nanotubes having curved shapes but rather the nanotube fabric layer 314 can include nanotubes having any type of defect introduced post nanotube deposition or combination of nanotubes having different types of defects introduced post nanotube deposition, such as nanotubes forming defect contacts and nanotubes having curved shaped shown in FIGS. 3C and 3D.

The dielectric, such as a flowable dielectric, penetrates into the nanotube fabric layer 314 when the regions around the resistive change element 310 are filled with the dielectric because the nanotube fabric layer 314 is porous. The dielectric penetrating into the nanotube fabric layer 314 restricts movement of nanotubes in the nanotube fabric layer 314 because the dielectric holds in place nanotubes entirely in the pinned region 317 and holds in place portions of nanotubes in the pinned region 317. The dielectric restricts the movement of nanotubes having one end in the pinned region 317 and one end in the unpinned region 318 such that the nanotubes can bend or rotate. The dielectric restricts the movement of nanotubes having both ends in the pinned region 317 and a middle portion in the unpinned region 318 such that the nanotubes can bend or rotate. The extent of space around the nanotubes covered by the nanotubes bending is relatively small because the nanotubes are extremely stiff. The extent of space around the nanotubes covered by the nanotubes rotating is greater than the extent of space around relatively straight cylindrical shaped nanotubes covered by the relatively straight cylindrical shaped nanotubes rotating because rotating nanotubes having defects, such as curved shapes, cover greater volumes of space. Additionally, the number of nanotubes having one end in the pinned region 317 and one end in the unpinned region 318 can be increased by nanotubes having defects introduced post nanotube deposition because nanotubes having defects introduced post nanotube deposition can have a shorter average straight line length than relatively straight cylindrical shaped nanotubes.

Figure 3E:
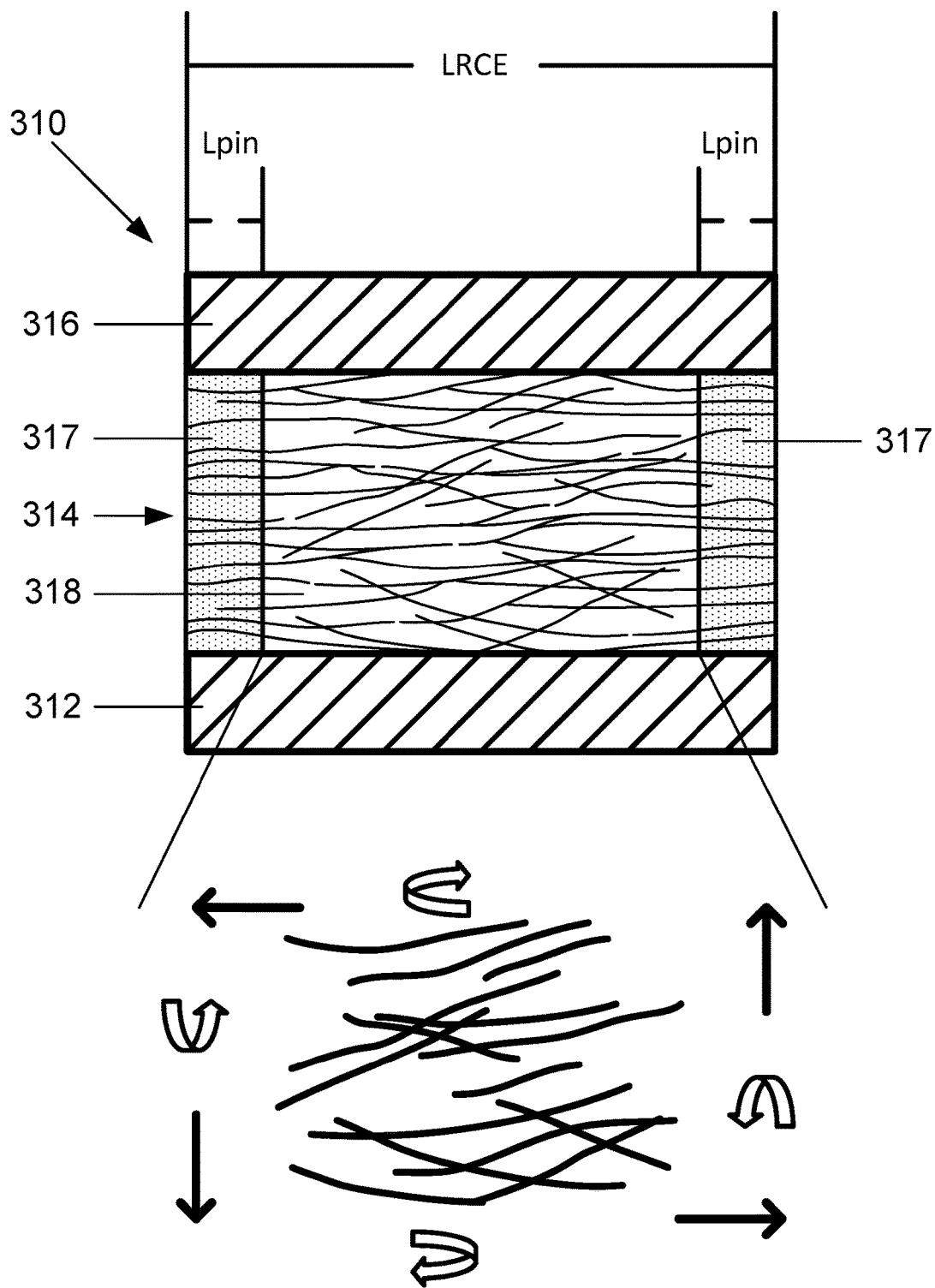
FIG. 3E illustrates a vertical cross-sectional view along the length of the resistive change element shown in FIG. 3A and a close up view showing the rotational and linear movement of nanotubes entirely in the unpinned region of the nanotube fabric layer.

The nanotubes entirely in the unpinned region 318 are not held in place by the dielectric, and thus, the nanotubes entirely in the unpinned region 318 can rotate, bend, and move linearly. The extent of space around the nanotubes entirely in the unpinned region 318 covered by the nanotubes bending is relatively small because the nanotubes are extremely stiff. The extent of space around the nanotubes entirely in the unpinned region 318 covered by the nanotubes rotating is greater than the extent of space around relatively straight cylindrical shaped nanotubes covered by the relatively straight cylindrical shaped nanotubes rotating because rotating nanotubes having defects, such as curved shapes, cover greater volumes of space. The extent of space around the nanotubes entirely in the unpinned region 318 covered by the nanotubes moving linearly is relatively large. A close up view of the nanotube fabric layer 314 in FIG. 3E shows the rotational and linear movement of the nanotubes entirely in the unpinned region 318. Additionally, the number of nanotubes entirely in the unpinned region 318 can be increased by post nanotube deposition introduction of defects because nanotubes with defects introduced post nanotube deposition can have a shorter average straight line length than relatively straight cylindrical shaped nanotubes. Further, nanotubes forming defect contacts can move a smaller distance to make and break conductive paths. The nanotube fabric layer 314 is less impacted by dielectric penetration than the nanotube fabric layer 214a because the extent of space around the nanotubes in the nanotube fabric layer 314 covered by rotating is greater than the extent of space around the nanotubes in the nanotube fabric layer 214a covered by rotating. Further, the nanotube fabric layer 314 is less impacted by dielectric penetration than the nanotube fabric layer 214a because the nanotubes in the nanotube fabric layer 314 can have a shorter average straight line length and a smaller distance to move to make and break conductive paths than the nanotubes in the nanotube fabric layer 214a.

The resistive change element 310 can be adjusted (programmed) between at least two non-volatile resistive states by applying electrical stimuli across the resistive change element 310. As discussed above, a make electrical stimulus including one or more programming pulses of specific voltages, currents, and pulse widths or a pulse train made up of a series of sub-pulses can be applied across the resistive change element 310 to adjust a resistive state of the resistive change element 310 from a high resistive state to a low resistive state. Also, as discussed above, a break electrical stimulus including one or more programming pulses of specific voltages, currents, and pulse widths or a pulse train made up of a series of sub-pulses can be applied across the resistive change element 310 to adjust a resistive state of the resistive change element 310 from the low resistive state to the high resistive state. The dielectric, such as a flowable dielectric, penetrating into the nanotube fabric layer 314 reduces the number of conductive paths made by the make electrical stimulus to switch the resistive change element 310 from the high resistive state to the low resistive state because the dielectric penetrating into the nanotube fabric layer 314 restricts movement of nanotubes in the nanotube fabric layer 314. Additionally, the dielectric penetrating into the nanotube fabric layer 314 reduces the number of conductive paths broken by the break electrical stimulus to switch the resistive change element 310 from the high resistive state to the low resistive state because fewer conductive paths are formed by the make electrical stimulus, and thus, the nanotube fabric layer 314 has fewer conductive paths that can be broken by the break electrical stimulus.

However, when the resistive change element 310 and the resistive change element 210a have approximately the same dimensions, the number of conductive paths made by a make electrical stimulus to switch the resistive change element 310 from a high resistive state to a low resistive state is generally greater than the number of conductive paths made by a make electrical stimulus to switch the resistive change element 210a from a high resistive state to a low resistive state because nanotubes in the nanotube fabric layer 314 can move a greater extent of space to form conductive paths. Additionally, the number of conductive paths broken by a break electrical stimulus to switch the resistive change element 310 from a low resistive state to a high resistive state is generally greater than the number of conductive paths broken by a break electrical stimulus to switch the resistive change element 210a from a low resistive state to a high resistive state because the nanotube fabric layer 314 has a greater number of conductive paths formed by the make electrical stimulus, and thus, the nanotube fabric layer 314 has a greater number of conductive paths that can be broken by the break electrical stimulus. The difference between a resistive value for the low resistive state and a resistive value for the high resistive state for the resistive change element 310 is greater than the difference between a resistive value for the low resistive state and a resistive value for the high resistive state for the resistive change element 210a because the number of conductive paths made and broken to switch resistive states of resistive change element 310 is greater than the number of conductive paths made and broken to switch resistive states of resistive change element 210a. The greater difference between the resistive values for the low resistive state and the high resistive state permits the resistive change element 310 have a more discernible difference between resistive states when a dielectric has penetrated the same distance into the nanotube fabric layer 314 and the nanotube fabric layer 214a. Thus, resistive change elements including a nanotube fabric layer having nanotubes with defects introduced post nanotube deposition, such as resistive change element 310, can be scaled to smaller dimensions than resistive change elements including a nanotube fabric layer having nanotubes that are relatively defect free, such as resistive change element 210a.

Figure 4A:
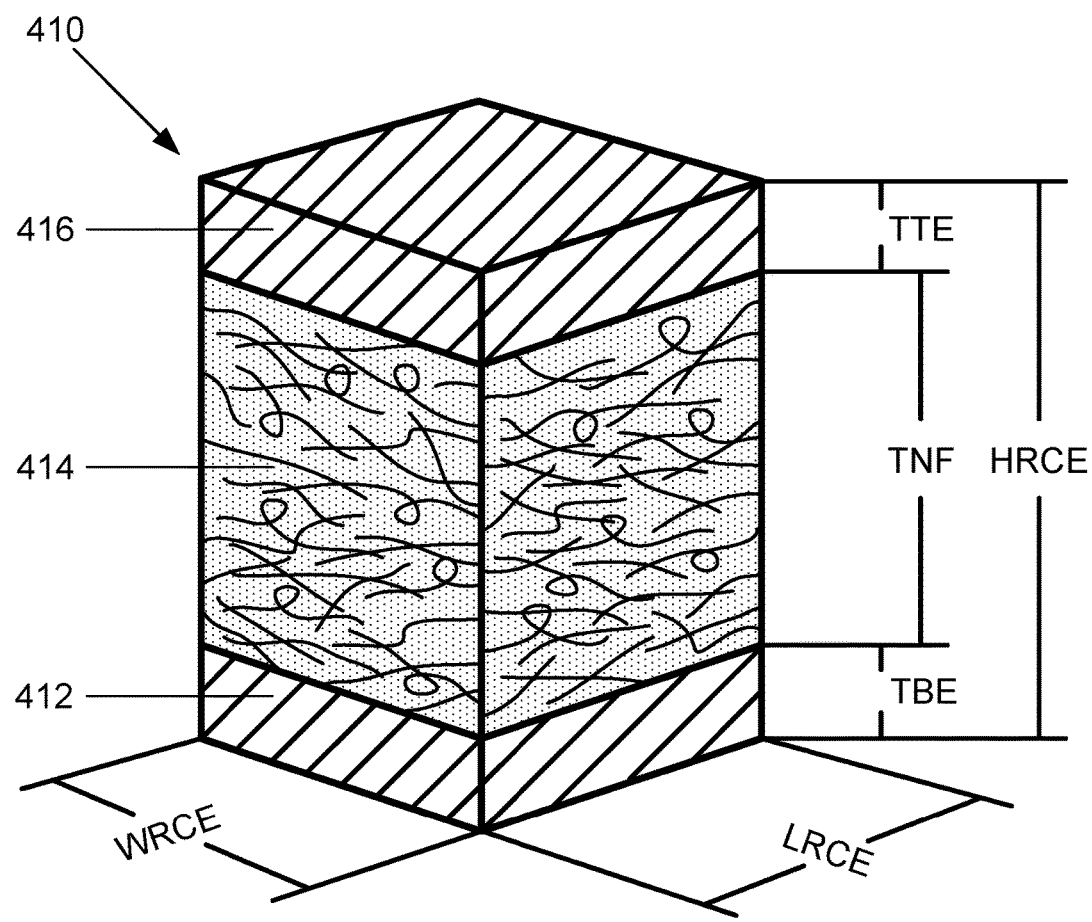
FIG. 4A illustrates a three-dimensional view of a resistive change element including a nanotube fabric layer formed with nanotubes having intrinsic defects introduced prior to nanotube deposition.

Referring now to FIG. 4A, a three-dimensional view of a resistive change element 410 from a resistive change element array where a dielectric, such as a flowable dielectric, fills the regions around the resistive change element 410 is illustrated. The resistive change element 410 can be from a two-dimensional resistive change element array where a dielectric, such as a flowable dielectric, fills the regions around the resistive change element 410 or a three-dimensional resistive change element array where a dielectric, such as a flowable dielectric, fills the regions around the resistive change element 410. The resistive change element 410 includes a bottom electrode 412, a nanotube fabric layer 414 formed with nanotubes having intrinsic defects introduced prior to nanotube deposition, and a top electrode 416. The nanotube fabric layer 414 is shown in FIG. 4A with the dielectric penetrating into the vertical sides of the nanotube fabric layer 414. The dielectric penetrates into the vertical sides of the nanotube fabric layer 414 because the nanotube fabric layer is porous.

The bottom electrode 412 is in contact with the nanotube fabric layer 414 and the top electrode 416 is in contact with the nanotube fabric layer 414. Alternatively, the resistive change element 410 can include at least one intervening layer located between the bottom electrode 412 and the nanotube fabric layer 414, at least one intervening layer located between the nanotube fabric layer 414 and the top electrode 416, or at least one intervening layer located between the bottom electrode 412 and the nanotube fabric layer 414 and at least one intervening layer located between the nanotube fabric layer 414 and the top electrode 416. Alternatively, the bottom electrode 412 can be omitted from the resistive change element 410, the top electrode 416 can be omitted from the resistive change element 410, or the bottom electrode 412 and the top electrode 416 can be omitted from the resistive change element 410.

The resistive change element 410 has a square horizontal cross-sectional shape, a length $L_{RCE}$, a width $W_{RCE}$, and a height $H_{RCE}$, where the length $L_{RCE}$ is approximately equal to F, the width $W_{RCE}$ is approximately equal to F, and the height $H_{RCE}$ is approximately equal to the sum of the thicknesses of the bottom electrode 412, the nanotube fabric layer 414, and the top electrode 416. The height $H_{RCE}$ of the resistive change element 410 is typically larger than F, however, the height $H_{RCE}$ of the resistive change element 410 can be scaled, such that height $H_{RCE}$ approaches F. F represents a minimum feature size to achieve maximum resistive change element density in a resistive change element array. Alternatively, the resistive change element 410 can have a length $L_{RCE}$ larger than F, a width $W_{RCE}$ larger than F, and/or a height $H_{RCE}$ larger than F. Alternatively, the resistive change element 410 can have a non-square horizontal cross-sectional shape, such as a rectangular horizontal cross-sectional shape, a circular horizontal cross-sectional shape, an oval horizontal cross-sectional shape, a triangular horizontal cross-sectional shape, a trapezoidal horizontal cross-sectional shape, an irregular horizontal cross-sectional shape, and a non-uniform horizontal cross-sectional shape where different sections of the resistive change element 410 can have different dimensions. The bottom electrode 412, the nanotube fabric layer 414, and the top electrode 416 have square horizontal cross-sectional shapes because the resistive change element 410 has a square horizontal cross-sectional shape. The bottom electrode 412 has a length dimension approximately equal to F, a width dimension approximately equal to F, and a thickness TBE. The nanotube fabric layer 414 has a length dimension approximately equal to F, a width dimension approximately equal to F, and a thickness TNF. The top electrode 416 has a length dimension approximately equal to F, a width dimension approximately equal to F, and a thickness TTE.

Figure 4B:
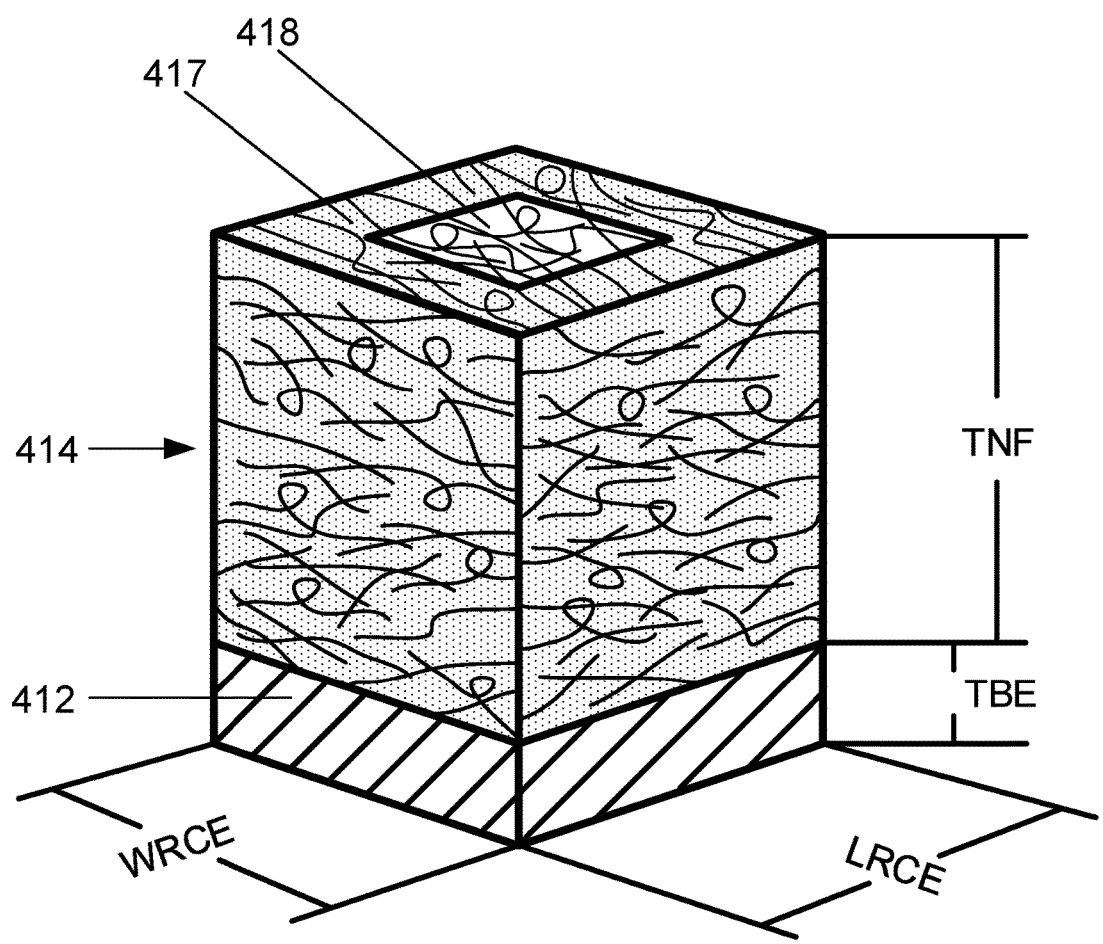
FIG. 4B illustrates a three-dimensional view of the resistive change element of FIG. 4A with the top electrode not shown so that the nanotube fabric layer can be shown in greater detail.

Referring now to FIG. 4B, a three-dimensional view of the resistive change element 410 with the top electrode 416 not shown so that the nanotube fabric layer 414 can be shown in greater detail is illustrated. The nanotube fabric layer 414 includes a pinned region 417 formed around an unpinned region 418. The pinned region 417 is a region of the nanotube fabric layer 414 where the dielectric, such as a flowable dielectric, has penetrated into the nanotube fabric layer 414 and the unpinned region 418 is a region of the nanotube fabric layer 414 where the dielectric has not penetrated into the nanotube fabric layer 414. It is noted that in some instances a dielectric may penetrate the entire nanotube fabric layer causing a nanotube fabric layer to include only a pinned region.

Figure 4C:
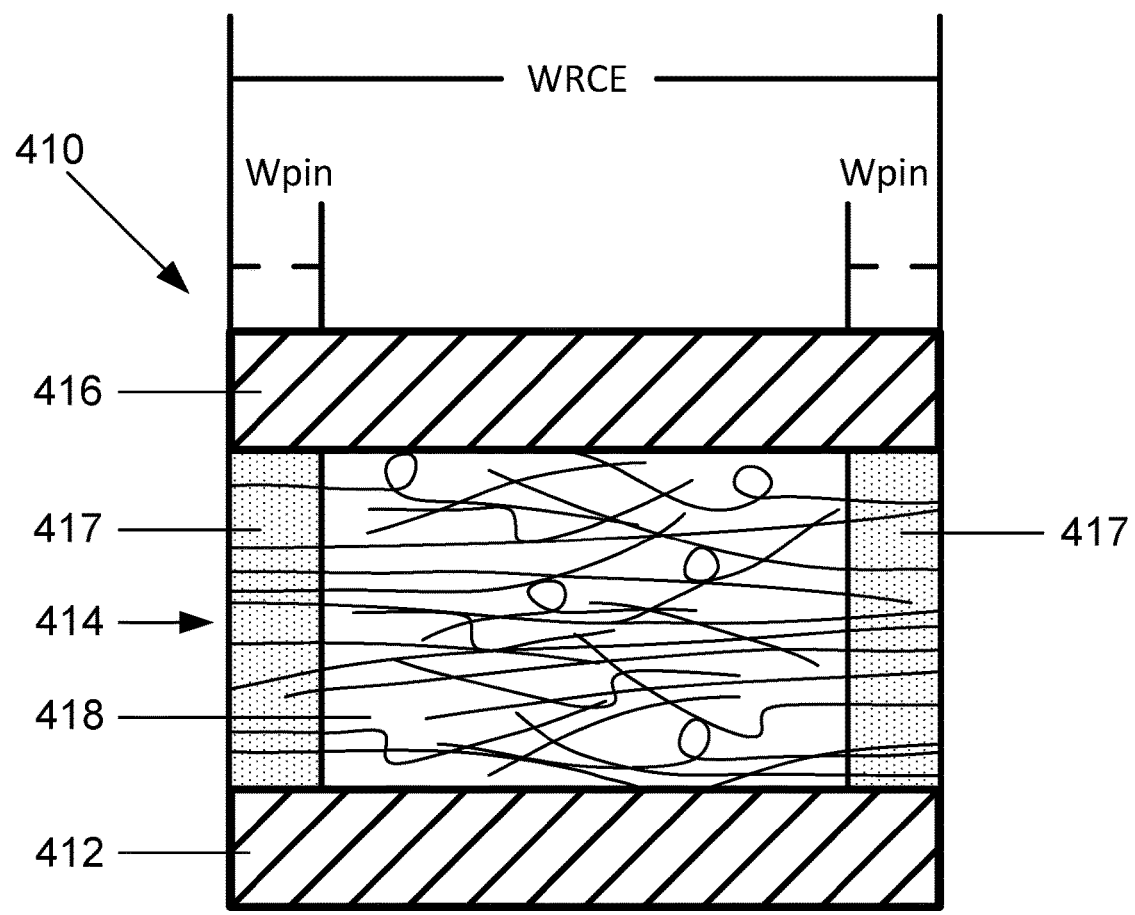
FIG. 4C illustrates a vertical cross-sectional view along the width of the resistive change element shown in FIG. 4A.
Figure 4D:
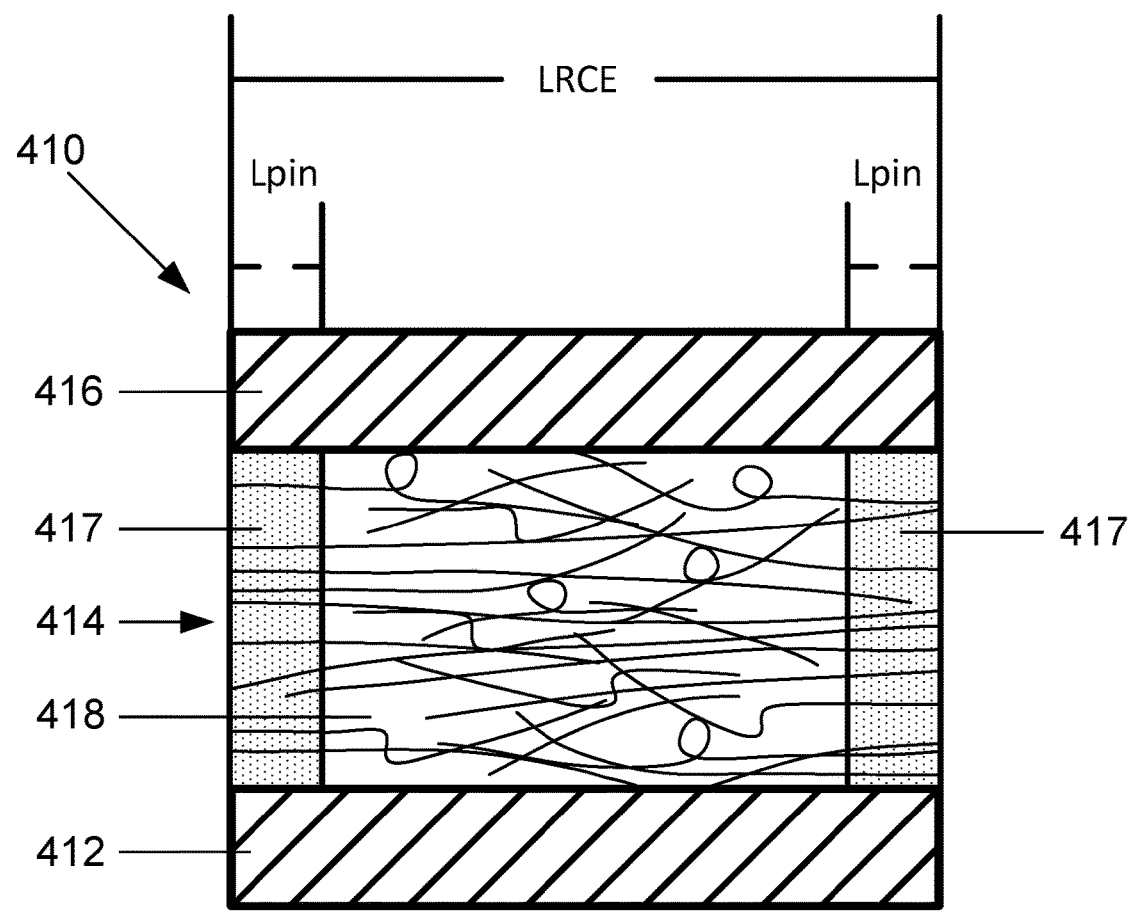
FIG. 4D illustrates a vertical cross-sectional view along the length of the resistive change element shown in FIG. 4A.

FIGS. 4C and 4D illustrate the distance the dielectric, such as a flowable dielectric, has penetrated into the vertical sides of the nanotube fabric layer 414. FIG. 4C illustrates a vertical cross-sectional view along the width of the resistive change element 410 showing the dielectric penetrating a distance Wpin in the width dimension of the nanotube fabric layer 414. FIG. 4D illustrates a vertical cross-sectional view along the length of the resistive change element 410 showing the dielectric penetrating a distance Lpin in the length dimension of the nanotube fabric layer 414. FIGS. 4C and 4D show nanotubes having kink defects and nanotubes having curved shapes in the nanotube fabric layer 414. The nanotube fabric layer 414 is not limited to including nanotubes having kink defects and nanotubes having curved shapes but rather the nanotube fabric layer 414 can include nanotubes having any type intrinsic defect introduced prior to nanotube deposition or combination of nanotubes having different types of intrinsic defects introduced prior to nanotube deposition, such as nanotubes having kink defects, nanotubes having curved shaped, and nanotubes having branches. It is noted that the nanotube fabric layer 414 can include nanotubes having intrinsic defects introduced prior to nanotube deposition and additional defects introduced post nanotube deposition.

The dielectric, such as a flowable dielectric, penetrates into the nanotube fabric layer 414 when the regions around the resistive change element 410 are filled with the dielectric because the nanotube fabric layer 414 is porous. The dielectric penetrating into the nanotube fabric layer 414 restricts movement of nanotubes in the nanotube fabric layer 414 because the dielectric holds in place nanotubes entirely in the pinned region 417 and holds in place portions of nanotubes in the pinned region 417. The dielectric restricts the movement of nanotubes having one end in the pinned region 417 and one end in the unpinned region 418 such that the nanotubes can bend or rotate. The dielectric restricts the movement of nanotubes having both ends in the pinned region 417 and a middle portion in the unpinned region 418 such that the nanotubes can bend or rotate. The extent of space around the nanotubes covered by the nanotubes bending is greater than the extent of space around relatively straight cylindrical shaped nanotubes covered by the relatively straight cylindrical shaped nanotubes bending because nanotubes having kink defects are flexible at the kink defects. The extent of space around the nanotubes covered by the nanotubes rotating is greater than the extent of space around relatively straight cylindrical shaped nanotubes covered by the relatively straight cylindrical shaped nanotubes rotating because rotating nanotubes having defects, such as kinks and curved shapes, cover greater volumes of space. Additionally, the number of nanotubes having one end in the pinned region 417 and one end in the unpinned region 418 can be increased by depositing nanotubes having intrinsic defects introduced prior to nanotube deposition because nanotubes having intrinsic defects can have a shorter average straight line length than relatively straight cylindrical shaped nanotubes.

Figure 4E:
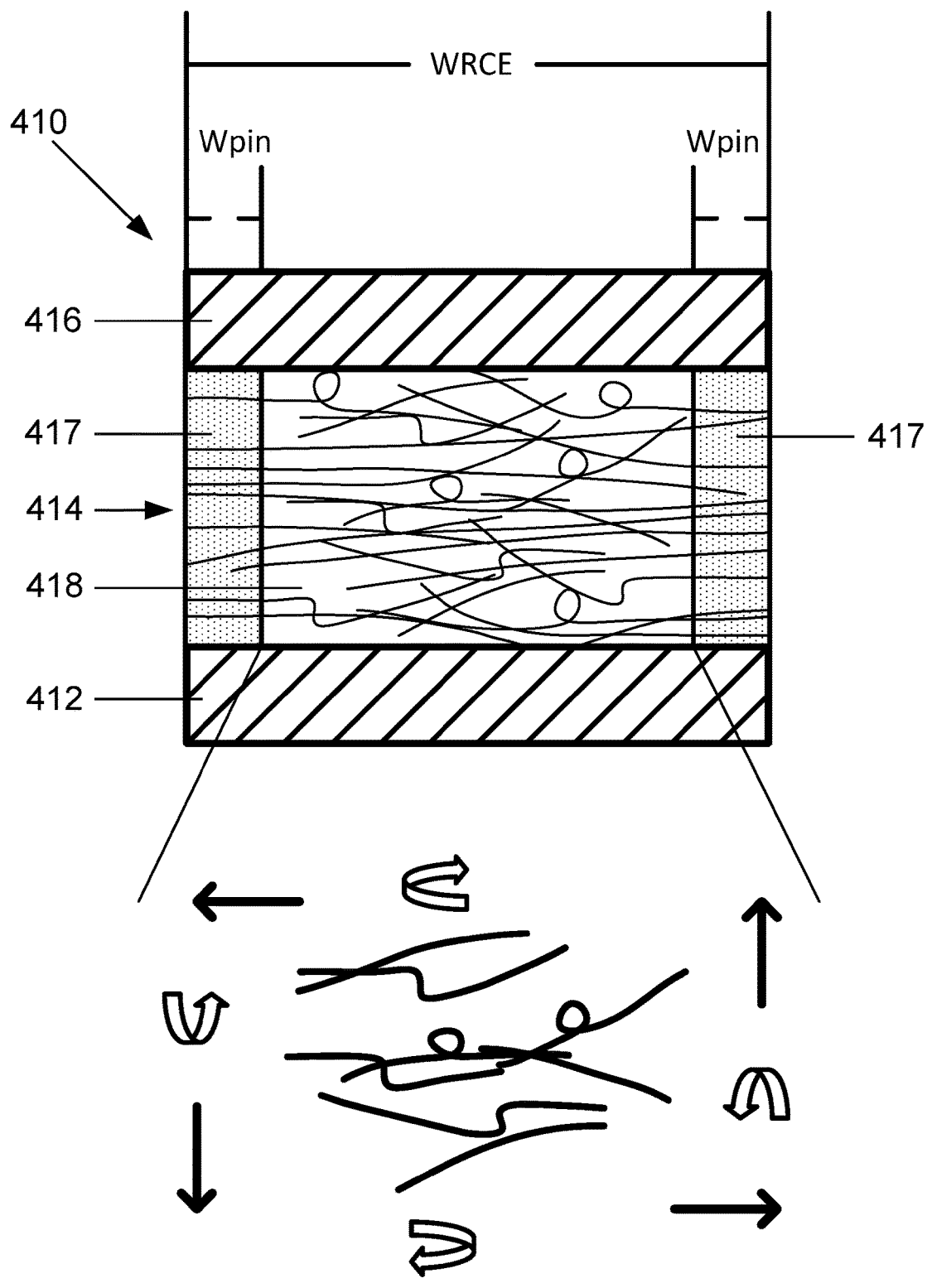
FIG. 4E illustrates a vertical cross-sectional view along the width of the resistive change element shown in FIG. 4A and a close up view showing the rotational and linear movement of nanotubes entirely in the unpinned region of the nanotube fabric layer.

The nanotubes entirely in the unpinned region 418 are not held in place by the dielectric, and thus, the nanotubes entirely in the unpinned region 418 can rotate, bend, and move linearly. The extent of space around the nanotubes entirely in the unpinned region 418 covered by the nanotubes bending is greater than the extent of space around relatively straight cylindrical shaped nanotubes covered by the relatively straight cylindrical shaped nanotubes bending because nanotubes having kink defects are flexible at the kink defects. The extent of space around the nanotubes entirely in the unpinned region 418 covered by the nanotubes rotating is greater than the extent of space around relatively straight cylindrical shaped nanotubes covered by the relatively straight cylindrical shaped nanotubes rotating because rotating nanotubes having defects, such as kinks and curved shapes, cover greater volumes of space. The extent of space around the nanotubes entirely in the unpinned region 418 covered by the nanotubes moving linearly is relatively large. A close up view of the nanotube fabric layer 414 in FIG. 4E shows the rotational and linear movement of the nanotubes entirely in the unpinned region 418. Additionally, the number of nanotubes entirely in the unpinned region 418 can be increased by depositing nanotubes having intrinsic defects introduced prior to nanotube deposition because nanotubes having intrinsic defects can have a shorter average straight line length than relatively straight cylindrical shaped nanotubes. The nanotube fabric layer 414 is less impacted by dielectric penetration than the nanotube fabric layer 214a because the extent of space around the nanotubes in the nanotube fabric layer 414 covered by bending and rotating is greater than the extent of space around the nanotubes in the nanotube fabric layer 214a covered by bending and rotating. Further, the nanotube fabric layer 414 is less impacted by dielectric penetration than the nanotube fabric layer 214a because the nanotubes in the nanotube fabric layer 414 can have a shorter average straight line length than the nanotubes in the nanotube fabric layer 214a.

The resistive change element 410 can be adjusted (programmed) between at least two non-volatile resistive states by applying electrical stimuli across the resistive change element 410. As discussed above, a make electrical stimulus including one or more programming pulses of specific voltages, currents, and pulse widths or a pulse train made up of a series of sub-pulses can be applied across the resistive change element 410 to adjust a resistive state of the resistive change element 410 from a high resistive state to a low resistive state. Also, as discussed above, a break electrical stimulus including one or more programming pulses of specific voltages, currents, and pulse widths or a pulse train made up of a series of sub-pulses can be applied across the resistive change element 410 to adjust a resistive state of the resistive change element 410 from the low resistive state to the high resistive state. The dielectric penetrating into the nanotube fabric layer 414 reduces the number of conductive paths made by the make electrical stimulus to switch the resistive change element 410 from the high resistive state to the low resistive state because the dielectric penetrating into the nanotube fabric layer 414 restricts movement of nanotubes in the nanotube fabric layer 414. Additionally, the dielectric penetrating into the nanotube fabric layer 414 reduces the number of conductive paths broken by the break electrical stimulus to switch the resistive change element 410 from the high resistive state to the low resistive state because fewer conductive paths are formed by the make electrical stimulus, and thus, the nanotube fabric layer 414 has fewer conductive paths that can be broken by the break electrical stimulus.

However, when the resistive change element 410 and the resistive change element 210a have approximately the same dimensions, the number of conductive paths made by a make electrical stimulus to switch the resistive change element 410 from a high resistive state to a low resistive state is generally greater than the number of conductive paths made by a make electrical stimulus to switch the resistive change element 210*a* from a high resistive state to a low resistive state because nanotubes in the nanotube fabric layer 414 can move a greater extent of space to form conductive paths. Additionally, the number of conductive paths broken by a break electrical stimulus to switch the resistive change element 410 from a low resistive state to a high resistive state is generally greater than the number of conductive paths broken by a break electrical stimulus to switch the resistive change element 210*a* from a low resistive state to a high resistive state because the nanotube fabric layer 414 has a greater number of conductive paths formed by a make electrical stimulus, and thus, the nanotube fabric layer 414 has a greater number of conductive paths that can be broken by the break electrical stimulus. The difference between a resistive value for the low resistive state and a resistive value for the high resistive state for the resistive change element 410 is greater than the difference between a resistive value for the low resistive state and a resistive value for the high resistive state for the resistive change element 210*a* because the number of conductive paths made and broken to switch resistive states of resistive change element 410 is greater than the number of conductive paths made and broken to switch resistive states of resistive change element 210*a*. The greater difference between the resistive values for the low resistive state and the high resistive state permits the resistive change element 410 to have a more discernible difference between resistive states when a dielectric has penetrated the same distance into the nanotube fabric layer 414 and the nanotube fabric layer 214*a*. Thus, resistive change elements including a nanotube fabric layer having nanotubes with intrinsic defects introduced prior to nanotube deposition, such as resistive change element 410, can be scaled to smaller dimensions than resistive change elements including a nanotube fabric layer having nanotubes that are relatively defect free, such as resistive change element 210*a*.

When dimensions of resistive change elements are scaled down, while a dielectric penetrates the same distance into a width dimension and a length dimension of a nanotube fabric layer and an average length of nanotubes forming the nanotube fabric layer remains generally constant, the dielectric holds in place entirely and partially a greater percentage of nanotubes in the nanotube fabric layer because a pinned region of the nanotube fabric layer makes up a larger percentage of the cross sectional area of the nanotube fabric layer and because the number of nanotubes having one end in the pinned region and the number of nanotubes having both ends in the pinned region increases. For example, when a dielectric penetrates 5 nm into a nanotube fabric layer having a square cross-sectional area with a width of 100 nm, a length of 100 nm, and an area of 10,000 $nm^2$, the area of the pinned region is 1900 $nm^2$, and thus the pinned region encompasses 19% of the nanotube fabric layer. For example, when a dielectric penetrates 5 nm into a nanotube fabric layer having a square cross-sectional area with a width of 20 nm, a length of 20 nm, and an area of 400 $nm^2$, the area of the pinned region is 300 $nm^2$, and thus the pinned region encompasses 75% of the nanotube fabric layer. For example, when nanotubes having an average length of 50 nm are deposited and etched to form a nanotube fabric layer having a square cross-sectional area with a width of 100 nm, a length of 100 nm, and an area of 10,000 $nm^2$, the nanotubes in the nanotube fabric layer at most extend across half of the nanotube fabric layer and are less likely to have one end or both ends in a pinned region than nanotubes extending across the entire nanotube fabric layer. For example, when nanotubes having an average length of 50 nm are deposited and etched to form a nanotube fabric layer having a square cross-sectional area with a width of 20 nm, a length of 20 nm, and an area of 400 $nm^2$, the nanotubes in the nanotube fabric layer can extend across the entire nanotube fabric layer and the nanotubes are more likely to have one end or both ends in a pinned region than nanotubes extending across less than the entire across the nanotube fabric layer. A difference between a resistive value for a low resistive state and a resistive value for a high resistive state decreases as the dimensions of the resistive change elements are scaled down because the dielectric reduces the extent of space covered by movement of nanotube to form conductive paths, as discussed above. In some instances, the number of conductive paths made by a make electrical stimulus and the number of conductive paths broken by a break electrical stimulus creates only a small difference or no difference between a resistance value for a low resistive state and a resistance value for a high resistive state.

Figure 5A:
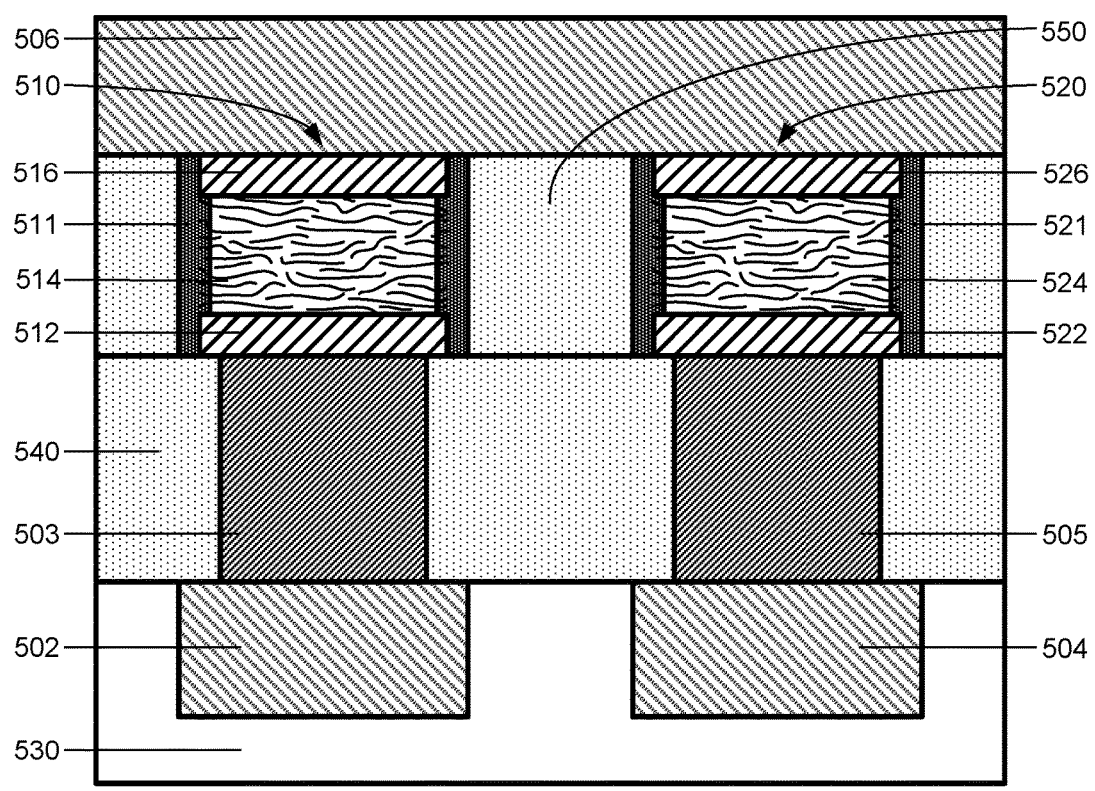
FIG. 5A illustrates a cross-sectional view of resistive change elements where a thin dielectric sidewall film is formed around vertical sides of a top electrode, a nanotube fabric layer, and a bottom electrode of each resistive change element.

Referring now to FIG. 5A, a cross-sectional view of resistive change elements 510, 520 from a cross point resistive change element array where thin dielectric sidewall films 511, 521 are formed around vertical sides of the resistive change elements 510, 520 prior to filling the regions around the resistive change elements 510, 520 with a dielectric 550, such as a flowable dielectric, is illustrated. The resistive change element 510 is located where a top interconnect conductor 506 crosses a first bottom interconnect conductor 502 and the resistive change element 520 is located where the top interconnect conductor 506 crosses a second bottom interconnect conductor 504. The cross point resistive change element array can be a two-dimensional cross point resistive change element array with a layout similar to one level of the three-dimensional cross point resistive change element array 200 shown in FIG. 2A and can include additional resistive change elements and thin dielectric sidewall films having the same structure as the resistive change elements 510, 520 and the thin dielectric sidewall films 511, 521, additional top interconnect conductors having the same structure as the top interconnect conductor 506, and additional bottom interconnect conductors having the same structure as the first and second bottom interconnect conductors 502, 504. Alternatively, the cross point resistive change element array can be a three-dimensional cross point resistive change element array with a layout similar to the three-dimensional cross point resistive change element array 200 shown in FIG. 2A and can include additional resistive change elements and thin dielectric sidewall films having the same structure as the resistive change elements 510, 520 and the thin dielectric sidewall films 511, 521, additional top interconnect conductors having the same structure as the top interconnect conductor 506, and additional bottom interconnect conductors having the same structure as the first and second bottom interconnect conductors 502, 504.

Each resistive change element 510, 520 includes a bottom electrode 512, 522, a nanotube fabric layer 514, 524, and a top electrode 516, 526. The nanotube fabric layers 514, 524, can be formed with nanotubes that are relatively defect free, such as discussed above with respect to FIGS. 2A-2F, nanotubes having defects introduced post nanotube deposition, such as discussed above with respect to FIGS. 3A-3E, nanotubes having intrinsic nanotube defects introduced prior to nanotube deposition, such as discussed above with respect to FIGS. 4A-4E, and nanotubes having intrinsic nanotube defects introduced prior to nanotube deposition and additional defects introduced post nanotube deposition. The nanotube fabric layers 514, 524 are shown in FIG. 5A without the dielectric 550 penetrating into the nanotube fabric layers 514, 524 because the thin dielectric sidewall films 511, 521 seal the nanotube fabric layers 514, 524. Thus, the combination of the resistive change element 510 and the thin dielectric sidewall film 511 can be considered a sealed resistive change element and the combination of the resistive change element 520 and the thin dielectric sidewall film 521 can be considered a sealed resistive change element. Additionally, the thin dielectric sidewall films 511, 521 can prevent contaminants, such as water and metallic contaminants, from penetrating into the nanotube fabric layers 514, 524 and can prevent parasitic conductive paths between the top electrodes 516, 526 and the bottom electrodes 512, 522.

The bottom electrode 512 is in contact with the nanotube fabric layer 514 and the top electrode 516 is in contact with the nanotube fabric layer 514. The bottom electrode 522 is in contact with the nanotube fabric layer 524 and the top electrode 526 is in contact with the nanotube fabric layer 524. Alternatively, each resistive change element 510, 520 can include at least one intervening layer located between the bottom electrode 512, 522 and the nanotube fabric layer 514, 524, at least one intervening layer located between the nanotube fabric layer 514, 524 and the top electrode 516, 526, or at least one intervening layer located between the bottom electrode 512, 522 and the nanotube fabric layer 514, 524 and at least one intervening layer located between the nanotube fabric layer 514, 524 and the top electrode 516, 526. Alternatively, the bottom electrode 512, 522 can be omitted from each resistive change element 510, 520, the top electrode 516, 526 can be omitted from each resistive change element 510, 520, or the bottom electrode 512, 522 and the top electrode 516, 526 can be omitted from each resistive change element 510, 520.

Although not shown in the cross-sectional view of FIG. 5A, each resistive change element 510, 520, has a square horizontal cross-sectional shape, a length $L_{RCE}$, a width $W_{RCE}$, and a height $H_{RCE}$, where the length $L_{RCE}$ is approximately equal to F, the width $W_{RCE}$ is approximately equal to F, and the height $H_{RCE}$ is approximately equal to the sum of the thicknesses of the bottom electrode, the nanotube fabric layer, and the top electrode of that resistive change element. The height $H_{RCE}$ of each resistive change element 510, 520 is typically larger than F, however, the height $H_{RCE}$ of each resistive change element 510, 520 can be scaled, such that height $H_{RCE}$ approaches F. F represents a minimum feature size to achieve maximum resistive change element density in a resistive change element array. Alternatively, each resistive change element 510, 520 can have a length $L_{RCE}$ larger than F, a width $W_{RCE}$ larger than F, and/or a height $H_{RCE}$ larger than F. Alternatively, each resistive change element 510, 520 can have a non-square horizontal cross-sectional shape, such as a rectangular horizontal cross-sectional shape, a circular horizontal cross-sectional shape, an oval horizontal cross-sectional shape, a triangular horizontal cross-sectional shape, a trapezoidal horizontal cross-sectional shape, an irregular horizontal cross-sectional shape, and a non-uniform horizontal cross-sectional shape where different sections of each resistive change element 510, 520 can have different dimensions. The bottom electrodes 512, 522, the nanotube fabric layers 514, 524, and the top electrodes 516, 526 have square horizontal cross-sectional shapes because the resistive change elements 510, 520 have square horizontal cross-sectional shapes. The bottom electrodes 512, 522 have a length dimension approximately equal to F, a width dimension approximately equal to F, and a thickness TBE. The nanotube fabric layers 514, 524 have a length dimension approximately equal to F, a width dimension approximately equal to F, and a thickness TNF. The top electrodes 516, 526 have a length dimension approximately equal to F, a width dimension approximately equal to F, and a thickness TTE.

The thin dielectric sidewall films 511, 521 have generally square ring shapes because the top electrodes 516, 526, the nanotube fabric layers 514, 524, and the bottom electrodes 512, 522 have square horizontal cross-sectional shapes. The portions of the thin dielectric sidewall films 511, 521 formed around the top electrodes 516, 526, have ring shapes based on the horizontal cross-sectional shapes of the top electrodes 516, 526, the portions of the thin dielectric sidewall films 511, 521 formed around the nanotube fabric layers 514, 524 have ring shapes based on the horizontal cross-sectional shapes of the nanotube fabric layers 514, 524, and the portions of the thin dielectric sidewall films 511, 521 formed around the bottom electrodes 512, 522 have ring shapes based on the horizontal cross-sectional shapes of the bottom electrodes 512, 522. Alternatively, when the top electrodes 516, 526, the nanotube fabric layers 514, 524, and the bottom electrodes 512, 522 have non-square horizontal cross-sectional shapes, the thin dielectric sidewall films 511, 521 have non-square ring shapes. It is noted that the term ring shape is not limited to a circular shape, but rather, the term ring shape can include a square ring shape, a rectangular ring shape, an oval ring shape, a triangular ring shape, a trapezoidal ring shape, an irregular ring shape, a non-uniform ring shape, and other non-square ring shapes.

For example, when the top electrodes 516, 526, the nanotube fabric layers 514, 524, and the bottom electrodes 512, 522 have rectangular horizontal cross-sectional shapes, the thin dielectric sidewall films 511, 521 have generally rectangular ring shapes. For example, when the top electrodes 516, 526, the nanotube fabric layers 514, 524, and the bottom electrodes 512, 522 have circular horizontal cross-sectional shapes, the thin dielectric sidewall films 511, 521 have generally circular ring shapes. For example, when the top electrodes 516, 526, the nanotube fabric layers 514, 524, and the bottom electrodes 512, 522 have non-uniform horizontal cross-sectional shapes, where the top electrodes 516, 526, the nanotube fabric layers 514, 524, and the bottom electrodes 512, 522 have different horizontal cross-sectional shapes, the thin dielectric sidewall films 511, 521 have non-uniform horizontal cross-sectional shapes, where the portions of the thin dielectric sidewall films 511, 521 formed around the top electrodes 516, 526, the portions of the thin dielectric sidewall films 511, 521 formed around the nanotube fabric layers 514, 524, and the portions of the thin dielectric sidewall films 511, 521 formed around the bottom electrodes 512, 522 have different ring shapes.

The bottom electrode 512 of the resistive change element 510 is in electrical communication with a first bottom interconnect conductor 502 through a first bottom plug 503 and the bottom electrode 522 of the resistive change element 520 is in electrical communication with a second bottom interconnect conductor 504 through a second bottom plug 505. The first bottom interconnect conductor 502 and the second bottom interconnect conductor 504 are formed in a dielectric 530. The first bottom plug 503 and the second bottom plug 505 are formed in a dielectric 540. The resistive change element 510 is formed above the first bottom plug 503 and the resistive change element 520 is formed above the second bottom plug 505. The top electrode 516 of the resistive change element 510 is in electrical communication with a top interconnect conductor 506 and the top electrode 526 of the resistive change element 520 is in electrical communication with the top interconnect conductor 506. Alternatively, the first bottom plug 503 and the second bottom plug 505 can be omitted, a first top plug located between the top electrode 516 and the top interconnect conductor 506 and a second top plug located between the top electrode 526 and the top interconnect conductor 506 can be included, or the first bottom plug 503 and the second bottom plug 505 can be omitted and a first top plug located between the top electrode 516 and the top interconnect conductor 506 and a second top plug located between the top electrode 526 and the top interconnect conductor 506 can be included. Further, intervening layers, such as barrier metal layers to provide a barrier to metal migration, can be included. For example, metal layers of Ta, TaN, TiN, Mo$_2$N, Ru, RuO$_x$ or amorphous ternary alloys, such as Ta$_{36}$Si$_{14}$N$_{50}$, Ti$_{34}$Si$_{23}$N$_{43}$, can be included to provide a barrier to copper migration.

The resistive change element 510 and the resistive change element 520 from the cross point resistive change element array can be considered 1-R resistive change memory cells. The resistive change element 510 can be considered a 1-R resistive change memory cell because the resistive change element 510 is in electrical communication with the first bottom interconnect conductor 502 and the top interconnect conductor 506 without an intervening in situ selection device or other current limiting device. The resistive change element 520 can be considered a 1-R resistive change memory cell because the resistive change element 520 is in electrical communication with the second bottom interconnect conductor 504 and the top interconnect conductor 506 without an intervening in situ selection device or other current limiting device.

Alternatively, where 1D1R resistive change memory cells are desired, a diode in electrical communication with the resistive change element 510 and located between the resistive change element 510 and the first bottom interconnect conductor 502 or between the resistive change element 510 and the top interconnect conductor 506 can be included and a diode in electrical communication with the resistive change element 520 and located between the resistive change element 520 and the second bottom interconnect conductor 504 or between the resistive change element 520 and the top interconnect conductor 506 can be included. The diode in electrical communication with the resistive change element 510 and the resistive change element 510 form a 1D1R resistive change memory cell and the diode in electrical communication with the resistive change element 520 and the resistive change element 520 form a 1D1R resistive change memory cell. The diodes can have the same horizontal cross-sectional shapes as the resistive change elements 510, 520 or the diodes can have horizontal cross-sectional shapes different from the horizontal cross-sectional shapes of the resistive change elements 510, 520. A thin dielectric sidewall film formed around the vertical sides of the resistive change element 510 can further include a portion formed around at least a portion of vertical sides of the diode in electrical communication with the resistive change element 510 and a thin dielectric sidewall film formed around the vertical sides of the resistive change element 520 can further include a portion formed around at least a portion vertical sides of the diode in electrical communication with the resistive change element 520. The portions of the thin dielectric sidewall films formed around at least portions of the diodes have ring shapes based on the horizontal cross-sectional shapes of the diodes.

The combination of the diode in electrical communication with the resistive change element 510 and located between the resistive change element 510 and the first bottom interconnect conductor 502, the resistive change element 510, and the thin dielectric sidewall film formed around the resistive change element 510 and around at least a portion of the diode can be considered a sealed diode-resistive change element. The combination of the diode in electrical communication with the resistive change element 510 and located between the resistive change element 510 and the top interconnect conductor 506, the resistive change element 510, and the thin dielectric sidewall film formed around the resistive change element 510 and around at least a portion of the diode can be considered a sealed diode-resistive change element. The combination of the diode in electrical communication with the resistive change element 520 and located between the resistive change element 520 and the second bottom interconnect conductor 504, the resistive change element 520, and the thin dielectric sidewall film formed around the resistive change element 520 and around at least a portion of the diode can be considered a sealed diode-resistive change element. The combination of the diode in electrical communication with the resistive change element 520 and located between the resistive change element 520 and the top interconnect conductor 506, the resistive change element 520, and the thin dielectric sidewall film formed around the resistive change element 520 and around at least a portion of the diode can be considered a sealed diode-resistive change element.

Additionally, when the diode in electrical communication with the resistive change element 510 and the resistive change element 510 and the diode in electrical communication with the resistive change element 520 and the resistive change element 520 form a 1D1R resistive change memory cells as discussed above, the first bottom plug 503 and the second bottom plug 505 can be omitted, a first top plug located between the top electrode 516 and the top interconnect conductor 506 and a second top plug located between the top electrode 526 and the top interconnect conductor 506 can be included, or the first bottom plug 503 and the second bottom plug 505 can be omitted and a first top plug located between the top electrode 516 and the top interconnect conductor 506 and a second top plug located between the top electrode 526 and the top interconnect conductor 506 can be included. Further, when the diode in electrical communication with the resistive change element 510 and the resistive change element 510 and the diode in electrical communication with the resistive change element 520 and the resistive change element 520 form 1D1R resistive change memory cells as discussed above, intervening layers, such as barrier metal layers to provide a barrier to metal migration, can be included. For example, metal layers of Ta, TaN, TiN, Mo$_2$N, Ru, RuO$_x$ or amorphous ternary alloys, such as Ta$_{36}$Si$_{14}$N$_{50}$, Ti$_{34}$Si$_{23}$N$_{43}$, can be included to provide a barrier to copper migration.

Figure 5B:
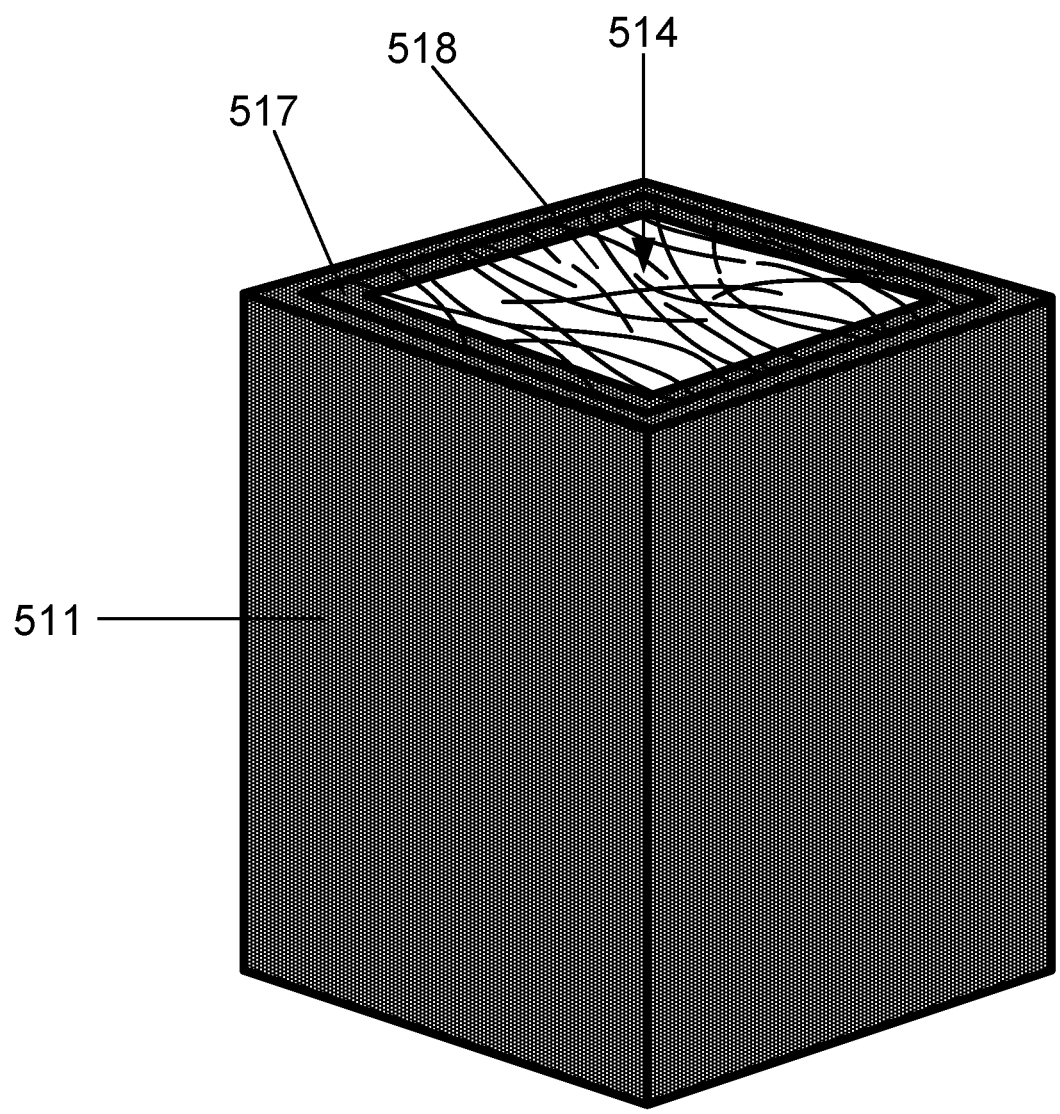
FIG. 5B illustrates a three-dimensional view of a resistive change element where a thin dielectric sidewall film is formed around vertical sides of a top electrode, a nanotube fabric layer, and a bottom electrode of the resistive change element with the top electrode and the portion of the thin dielectric sidewall formed around the top electrode not shown so that the nanotube fabric layer can be shown in greater detail.

Referring now to FIG. 5B, a three-dimensional view of the resistive change element 510 with the top electrode 516 not shown so that the nanotube fabric layer 514 can be shown in greater detail is illustrated. FIG. 5B also shows the thin dielectric sidewall film 511 formed around the vertical sides of the bottom electrode 512 and the vertical sides of the nanotube fabric layer 514 with the portion of the thin dielectric sidewall film 511 formed around the vertical sides of the top electrode 516 not shown. FIG. 5B further shows the generally square ring shape of the portion of the thin dielectric sidewall film 511 formed around the vertical sides of the bottom electrode 512 and the vertical sides of the nanotube fabric layer 514. It is noted that the discussion of resistive change element 510 is applicable to resistive change element 520 because resistive change element 510 and resistive change element 520 have the same structure and because a thin dielectric sidewall film 511, 521 is formed around the vertical sides of each resistive change element 510, 520.

The thin dielectric sidewall film 511 seals the nanotube fabric layer 514 before the regions around the resistive change element 510 are filled with the dielectric 550, so that the dielectric 550 does not penetrate into the nanotube fabric layer 514. The thin dielectric sidewall film 511 penetrates a smaller distance into the nanotube fabric layer 514 than the dielectric 550 would penetrate into the nanotube fabric layer 514 so that nanotube fabric layer 514 has a pinned region 517 smaller than a pinned region that would be formed by the dielectric 550 penetrating into the nanotube fabric layer 514. The nanotube fabric layer 514 also has an unpinned region 518 larger than an unpinned region that would be formed by the dielectric 550 penetrating into the nanotube fabric layer 514. The smaller pinned region 517 of the nanotube fabric layer 514 is less restrictive of movement of nanotubes than a larger pinned region that would be formed by the dielectric 550 penetrating into the nanotube fabric layer 514 because fewer nanotubes are entirely or partially in the smaller pinned region 517 and the nanotubes partially in smaller pinned region 517 have smaller portions in the smaller pinned region 517. Thus, when the nanotube fabric layer 514 is formed with nanotubes that are relatively defect free the nanotube fabric layer 514 is less restrictive of movement of nanotubes than nanotube fabric layer 214*a*, when the nanotube fabric layer 514 is formed with nanotubes having defects introduced post nanotube deposition the nanotube fabric layer 514 is less restrictive of movement of nanotubes than nanotube fabric layer 314, and when the nanotube fabric layer 514 is formed with nanotubes with intrinsic nanotube defects introduced prior to nanotube deposition the nanotube fabric layer 514 is less restrictive of movement of nanotubes than nanotube fabric layer 414. Further, when the nanotube fabric layer 514 is formed with nanotubes with intrinsic nanotube defects introduced prior to nanotube deposition and additional defects introduced post nanotube deposition, the nanotube fabric layer 514 will be less restrictive of movement of nanotubes than a nanotube fabric layer formed with the same nanotubes with the dielectric 550 penetrating into the nanotube fabric layer.

The resistive change element 510 can be adjusted (programmed) between at least two non-volatile resistive states by applying electrical stimuli across the resistive change element 510. As discussed above, a make electrical stimulus including one or more programming pulses of specific voltages, currents, and pulse widths or a pulse train made up of a series of sub-pulses can be applied across the resistive change element 510 to adjust a resistive state of the resistive change element 510 from a high resistive state to a low resistive state. Also, as discussed above, a break electrical stimulus including one or more programming pulses of specific voltages, currents, and pulse widths or a pulse train made up of a series of sub-pulses can be applied across the resistive change element 510 to adjust a resistive state of the resistive change element 510 from the low resistive state to the high resistive state.

When the resistive change element 510 and a resistive change element with a dielectric, such as a flowable dielectric, penetrating into a nanotube fabric layer have approximately the same dimensions and nanotube fabric layers formed with approximately the same type of nanotubes, the number of conductive paths made by a make electrical stimulus to switch the resistive change element 510 from a high resistive state to a low resistive state is generally greater than the number of conductive paths made by a make electrical stimulus to switch the resistive change element with a dielectric, such as a flowable dielectric, penetrating into a nanotube fabric layer from a high resistive state to a low resistive state because nanotubes in the nanotube fabric layer 514 can move a greater extent of space to form conductive paths. Additionally, the number of conductive paths broken by a break electrical stimulus to switch the resistive change element 510 from a low resistive state to a high resistive state is generally greater than the number of conductive paths broken by a break electrical stimulus to switch the resistive change element with a dielectric, such as a flowable dielectric, penetrating into a nanotube fabric layer from a low resistive state to a high resistive state because the nanotube fabric layer 514 has a greater number of conductive paths formed by a make electrical stimulus, and thus, the nanotube fabric layer 514 has a greater number of conductive paths that can be broken by the break electrical stimulus. The difference between a resistive value for the low resistive state and a resistive value for the high resistive state for the resistive change element 510 is greater than the difference between a resistive value for the low resistive state and a resistive value for the high resistive state for the resistive change element with a dielectric, such as a flowable dielectric, penetrating into a nanotube fabric layer because the number of conductive paths made and broken to switch resistive states of the resistive change element 510 is greater than the number of conductive paths made and broken to switch resistive states of the resistive change element with a dielectric, such as a flowable dielectric, penetrating into a nanotube fabric layer. The greater difference between the resistive values for the low resistive state and the high resistive state permits the resistive states of the resistive change element 510 to have a more discernible difference between resistive states. Thus, sealing sides of a nanotube fabric layer with a thin dielectric sidewall film, such as thin dielectric sidewall film 511, to prevent a dielectric, such as a flowable dielectric, from penetrating into the nanotube fabric layer permits scaling resistive change elements to smaller dimensions.

Figure 6A:
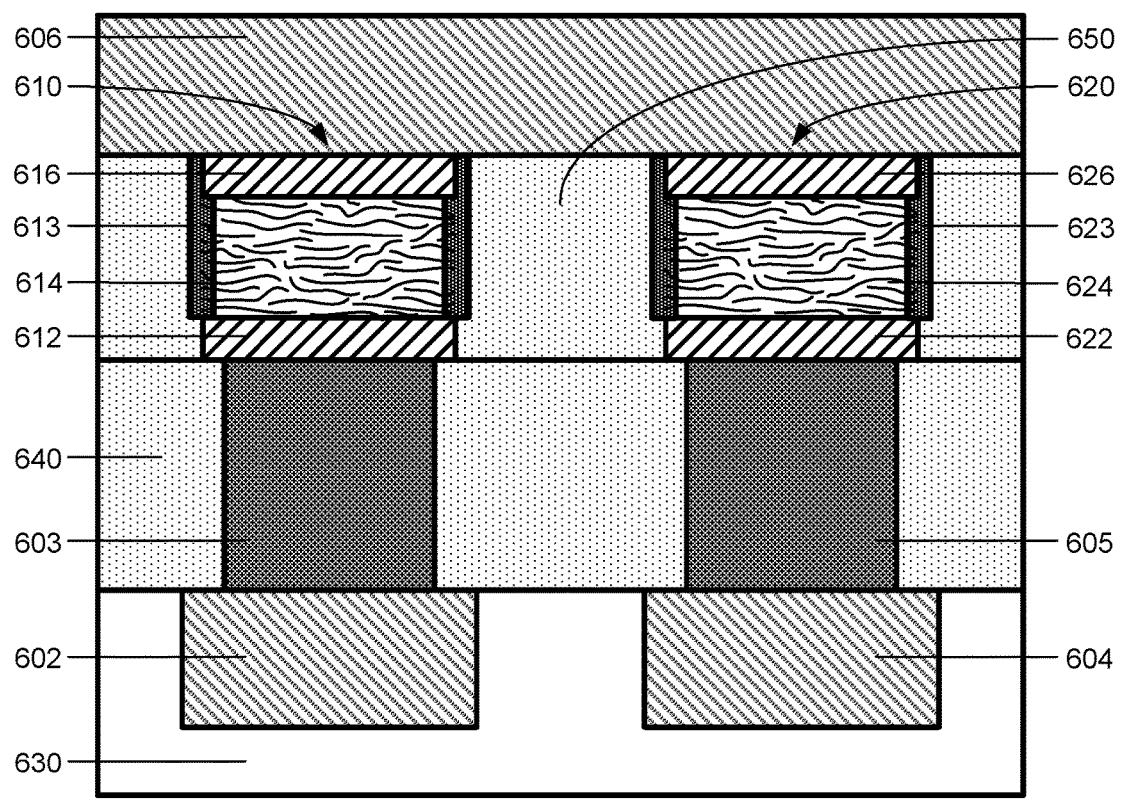
FIG. 6A illustrates a cross-sectional view of resistive change elements where a thin dielectric sidewall film is formed around vertical sides of a top electrode and a nanotube fabric layer of each resistive change element.

Referring now to FIG. 6A, a cross-sectional view of resistive change elements 610, 620 from a cross point resistive change element array where thin dielectric sidewall films 613, 623 are formed around vertical sides of top electrodes 616, 626 and vertical sides of nanotube fabric layers 614, 624 prior to filling the regions around the resistive change elements 610, 620 with a dielectric 650, such as a flowable dielectric, is illustrated. The resistive change element 610 is located where a top interconnect conductor 606 crosses a first bottom interconnect conductor 602 and the resistive change element 620 is located where the top interconnect conductor 606 crosses a second bottom interconnect conductor 604. The cross point resistive change element array can be a two-dimensional cross point resistive change element array with a layout similar to one level of the three-dimensional cross point resistive change element array 200 shown in FIG. 2A and can include additional resistive change elements and thin dielectric sidewall films having the same structure as the resistive change elements 610, 620 and the thin dielectric sidewall films 613, 623, additional top interconnect conductors having the same structure as the top interconnect conductor 606, and additional bottom interconnect conductors having the same structure as the first and second bottom interconnect conductors 602, 604. Alternatively, the cross point resistive change element array can be a three-dimensional cross point resistive change element array with a layout similar to the three-dimensional cross point resistive change element array 200 shown in FIG. 2A and can include additional resistive change elements and thin dielectric sidewall films having the same structure as the resistive change elements 610, 620 and the thin dielectric sidewall films 613, 623, additional top interconnect conductors having the same structure as the top interconnect conductor 606, and additional bottom interconnect conductors having the same structure as the first and second bottom interconnect conductors 602, 604.

Each resistive change element 610, 620 includes a bottom electrode 612, 622, a nanotube fabric layer 614, 624, and a top electrode 616, 626. The nanotube fabric layers 614, 624, can be formed with nanotubes that are relatively defect free, such as discussed above with respect to FIGS. 2A-2F, nanotubes having defects introduced post nanotube deposition, such as discussed above with respect to FIGS. 3A-3E, nanotubes having intrinsic nanotube defects introduced prior to nanotube deposition, such as discussed above with respect to FIGS. 4A-4E, and nanotubes having intrinsic nanotube defects introduced prior to nanotube deposition and additional defects introduced post nanotube deposition. The nanotube fabric layers 614, 624 are shown in FIG. 6A without the dielectric 650 penetrating into the nanotube fabric layers 614, 624 because the thin dielectric sidewall films 613, 623 seal the nanotube fabric layers 614, 624. Thus, the combination of the resistive change element 610 and the thin dielectric sidewall film 613 can be considered a sealed resistive change element and the combination of the resistive change element 620 and the thin dielectric sidewall film 623 can be considered a sealed resistive change element. Additionally, the thin dielectric sidewall films 613, 623 can prevent contaminants, such as water and metallic contaminants, from penetrating into the nanotube fabric layers 614, 624 and can prevent parasitic conductive paths between the top electrodes 616, 626 and the bottom electrodes 612, 622.

The bottom electrode 612 is in contact with the nanotube fabric layer 614 and the top electrode 616 is in contact with the nanotube fabric layer 614. The bottom electrode 622 is in contact with the nanotube fabric layer 624 and the top electrode 626 is in contact with the nanotube fabric layer 624. Alternatively, each resistive change element 610, 620 can include at least one intervening layer located between the bottom electrode 612, 622 and the nanotube fabric layer 614, 624, at least one intervening layer located between the nanotube fabric layer 614, 624 and the top electrode 616, 626, or at least one intervening layer located between the bottom electrode 612, 622 and the nanotube fabric layer 614, 624 and at least one intervening layer located between the nanotube fabric layer 614, 624 and the top electrode 616, 626. Alternatively, the bottom electrode 612, 622 can be omitted from each resistive change element 610, 620, the top electrode 616, 626 can be omitted from each resistive change element 610, 620, or the bottom electrode 612, 622 and the top electrode 616, 626 can be omitted from each resistive change element 610, 620.

Although not shown in the cross-sectional view of FIG. 6A, each resistive change element 610, 620, has a square horizontal cross-sectional shape, a length $L_{RCE}$, a width $W_{RCE}$, and a height $H_{RCE}$, where the length $L_{RCE}$ is approximately equal to F, the width $W_{RCE}$ is approximately equal to F, and the height $H_{RCE}$ is approximately equal to the sum of the thicknesses of the bottom electrode, the nanotube fabric layer, and the top electrode of that resistive change element. The height $H_{RCE}$ of each resistive change element 610, 620 is typically larger than F, however, the height $H_{RCE}$ of each resistive change element 610, 620 can be scaled, such that height $H_{RCE}$ approaches F. F represents a minimum feature size to achieve maximum resistive change element density in a resistive change element array. Alternatively, each resistive change element 610, 620 can have a length $L_{RCE}$ larger than F, a width $W_{RCE}$ larger than F, and/or a height $H_{RCE}$ larger than F. Alternatively, each resistive change element 610, 620 can have a non-square horizontal cross-sectional shape, such as a rectangular horizontal cross-sectional shape, a circular horizontal cross-sectional shape, an oval horizontal cross-sectional shape, a triangular horizontal cross-sectional shape, a trapezoidal horizontal cross-sectional shape, an irregular horizontal cross-section shape, and a non-uniform horizontal cross-sectional shape where different sections of each resistive change element 610, 620 can have different dimensions. The bottom electrodes 612, 622, the nanotube fabric layers 614, 624, and the top electrodes 616, 626 have square horizontal cross-sectional shapes because the resistive change elements 610, 620 have square horizontal cross-sectional shapes. The bottom electrodes 612, 622 have a length dimension approximately equal to F, a width dimension approximately equal to F, and a thickness TBE. The nanotube fabric layers 614, 624 have a length dimension approximately equal to F, a width dimension approximately equal to F, and a thickness TNF. The top electrodes 616, 626 have a length dimension approximately equal to F, a width dimension approximately equal to F, and a thickness TTE.

The thin dielectric sidewall films 613, 623 have generally square ring shapes because the top electrodes 616, 626, and the nanotube fabric layers 614, 624 have square horizontal cross-sectional shapes. The portions of the thin dielectric sidewall films 613, 623 formed around the top electrodes 616, 626, have ring shapes based on the horizontal cross-sectional shapes of the top electrodes 616, 626 and the portions of the thin dielectric sidewall films 613, 623 formed around the nanotube fabric layers 614, 624 have ring shapes based on the horizontal cross-sectional shapes of the nanotube fabric layers 614, 624. Alternatively, when the top electrodes 616, 626 and the nanotube fabric layers 614, 624 have non-square horizontal cross-sectional shapes, the thin dielectric sidewall films 613, 623 have non-square ring shapes. It is noted that the term ring shape is not limited to a circular shape, but rather, the term ring shape can include a square ring shape, a rectangular ring shape, an oval ring shape, a triangular ring shape, a trapezoidal ring shape, an irregular ring shape, a non-uniform ring shape, and other non-square ring shapes.

For example, when the top electrodes 616, 626 and the nanotube fabric layers 614, 624 have rectangular horizontal cross-sectional shapes, the thin dielectric sidewall films 613, 623 have generally rectangular ring shapes. For example, when the top electrodes 616, 626 and the nanotube fabric layers 614, 624 have circular horizontal cross-sectional shapes, the thin dielectric sidewall films 613, 623 have generally circular ring shapes. For example, when the top electrodes 616, 626 and the nanotube fabric layers 614, 624 have non-uniform horizontal cross-sectional shapes, where the top electrodes 616, 626 and the nanotube fabric layers 614, 624 have different horizontal cross-sectional shapes, the thin dielectric sidewall films 611, 621 have non-uniform horizontal cross-sectional shapes, where the portions of the thin dielectric sidewall films 613, 623 formed around the top electrodes 616, 626 and the portions of the thin dielectric sidewall films 613, 623 formed around the nanotube fabric layers 614, 624 have different ring shapes.

The bottom electrode 612 of the resistive change element 610 is in electrical communication with a first bottom interconnect conductor 602 through a first bottom plug 603 and the bottom electrode 622 of the resistive change element 620 is in electrical communication with a second bottom interconnect conductor 604 through a second bottom plug 605. The first bottom interconnect conductor 602 and the second bottom interconnect conductor 604 are formed in a dielectric 630. The first bottom plug 603 and the second bottom plug 605 are formed in a dielectric 640. The resistive change element 610 is formed above the first bottom plug 603 and the resistive change element 620 is formed above the second bottom plug 605. The top electrode 616 of the resistive change element 610 is in electrical communication with a top interconnect conductor 606 and the top electrode 626 of the resistive change element 620 is in electrical communication with the top interconnect conductor 606. Alternatively, the first bottom plug 603 and the second bottom plug 605 can be omitted, a first top plug located between the top electrode 616 and the top interconnect conductor 606 and a second top plug located between the top electrode 626 and the top interconnect conductor 606 can be included, or the first bottom plug 603 and the second bottom plug 605 can be omitted and a first top plug located between the top electrode 616 and the top interconnect conductor 606 and a second top plug located between the top electrode 626 and the top interconnect conductor 606 can be included. Further, intervening layers, such as barrier metal layers to provide a barrier to metal migration, can be included. For example, metal layers of Ta, TaN, TiN, $Mo_2N$, Ru, $RuO_x$ or amorphous ternary alloys, such as $Ta_{36}Si_{14}N_{50}$, $Ti_{34}Si_{23}N_{43}$, can be included to provide a barrier to copper migration.

The resistive change element 610 and the resistive change element 620 from the cross point resistive change element array can be considered 1-R resistive change memory cells. The resistive change element 610 can be considered a 1-R resistive change memory cell because the resistive change element 610 is in electrical communication with the first bottom interconnect conductor 602 and the top interconnect conductor 606 without an intervening in situ selection device or other current limiting device. The resistive change element 620 can be considered a 1-R resistive change memory cell because the resistive change element 620 is in electrical communication with the second bottom interconnect conductor 604 and the top interconnect conductor 606 without an intervening in situ selection device or other current limiting device.

Alternatively, where 1D1R resistive change memory cells are desired, a diode in electrical communication with the resistive change element 610 and located between the resistive change element 610 and the first bottom interconnect conductor 602 or between the resistive change element 610 and the top interconnect conductor 606 can be included and a diode in electrical communication with the resistive change element 620 and located between the resistive change element 620 and the second bottom interconnect conductor 604 or between the resistive change element 620 and the top interconnect conductor 606 can be included. The diode in electrical communication with the resistive change element 610 and the resistive change element 610 form a 1D1R resistive change memory cell and the diode in electrical communication with the resistive change element 620 and the resistive change element 620 form a 1D1R resistive change memory cell. The diodes can have the same horizontal cross-sectional shapes as the resistive change elements 610, 620 or the diodes can have horizontal cross-sectional shapes different from the horizontal cross-sectional shapes of the resistive change elements 610, 620. A thin dielectric sidewall film formed around at least a portion of the vertical sides of the resistive change element 610 can further include a portion formed around at least a portion of vertical sides of the diode in electrical communication with the resistive change element 610 and a thin dielectric sidewall film formed around at least a portion of the vertical sides of the resistive change element 620 can further include a portion formed around at least a portion vertical sides of the diode in electrical communication with the resistive change element 620. The portions of the thin dielectric sidewall films formed around at least portions of the diodes have ring shapes based on the horizontal cross-sectional shapes of the diodes.

The combination of the diode in electrical communication with the resistive change element 610 and located between the resistive change element 610 and the first bottom interconnect conductor 602, the resistive change element 610, and the thin dielectric sidewall film formed around at least a portion of the resistive change element 610 and around at least a portion of the diode can be considered a sealed diode-resistive change element. The combination of the diode in electrical communication with the resistive change element 610 and located between the resistive change element 610 and the top interconnect conductor 606, the resistive change element 610, and the thin dielectric sidewall film formed around at least a portion of the resistive change element 610 and around at least a portion of the diode can be considered a sealed diode-resistive change element. The combination of the diode in electrical communication with the resistive change element 620 and located between the resistive change element 620 and the second bottom interconnect conductor 604, the resistive change element 620, and the thin dielectric sidewall film formed around at least a portion of the resistive change element 620 and around at least a portion of the diode can be considered a sealed diode-resistive change element. The combination of the diode in electrical communication with the resistive change element 620 and located between the resistive change element 620 and the top interconnect conductor 606, the resistive change element 620, and the thin dielectric sidewall film formed around at least a portion of the resistive change element 620 and around at least a portion of the diode can be considered a sealed diode-resistive change element.

Additionally, when the diode in electrical communication with the resistive change element 610 and the resistive change element 610 and the diode in electrical communication with the resistive change element 620 and the resistive change element 620 form a 1D1R resistive change memory cells as discussed above, the first bottom plug 603 and the second bottom plug 605 can be omitted, a first top plug located between the top electrode 616 and the top interconnect conductor 606 and a second top plug located between the top electrode 626 and the top interconnect conductor 606 can be included, or the first bottom plug 603 and the second bottom plug 605 can be omitted and a first top plug located between the top electrode 616 and the top interconnect conductor 606 and a second top plug located between the top electrode 626 and the top interconnect conductor 606 can be included. Further, when the diode in electrical communication with the resistive change element 610 and the resistive change element 610 and the diode in electrical communication with the resistive change element 620 and the resistive change element 620 form 1D1R resistive change memory cells as discussed above, intervening layers, such as barrier metal layers to provide a barrier to metal migration, can be included. For example, metal layers of Ta, TaN, TiN, Mo$_2$N, Ru, RuO$_x$ or amorphous ternary alloys, such as Ta$_{36}$Si$_{14}$N$_{50}$, Ti$_{34}$Si$_{23}$N$_{43}$, can be included to provide a barrier to copper migration.

Figure 6B:
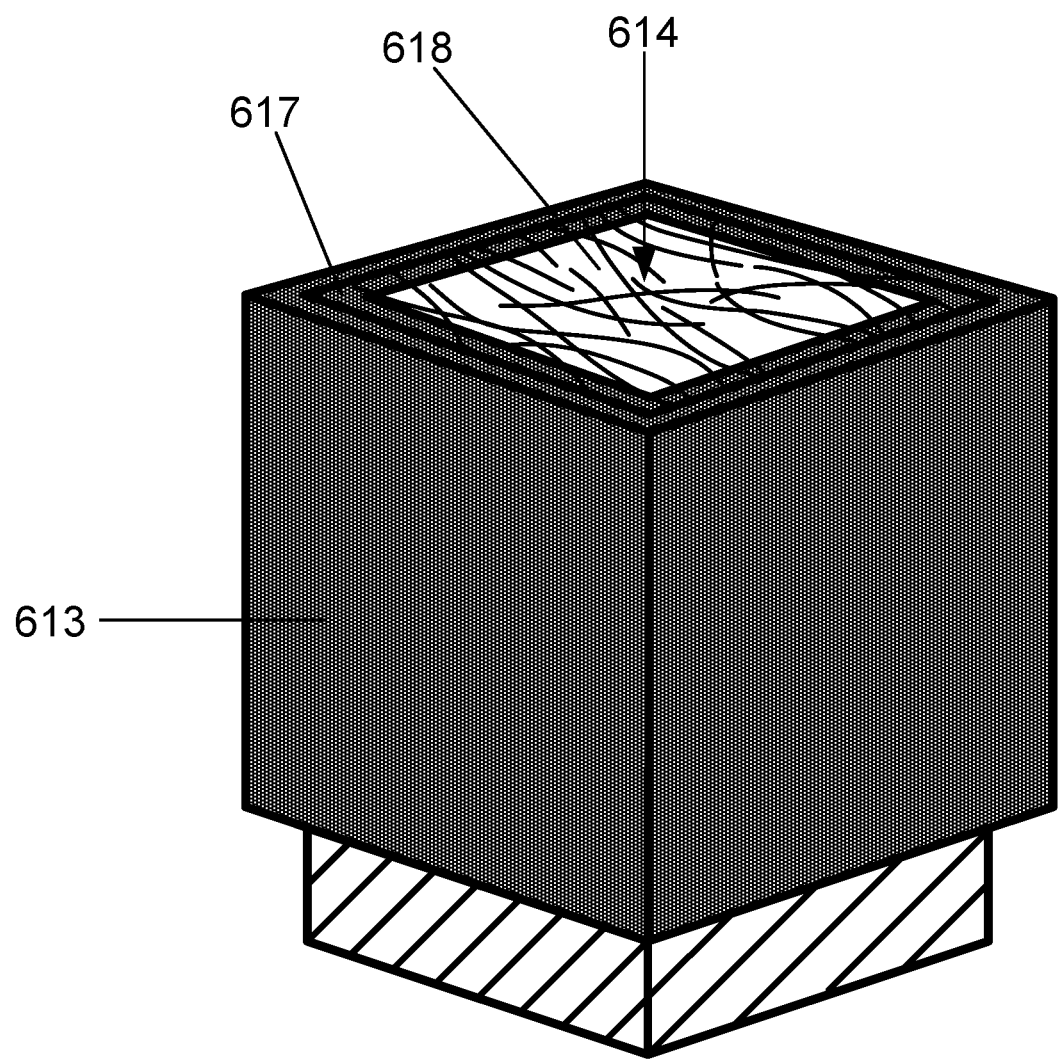
FIG. 6B illustrates a three-dimensional view of a resistive change element where a thin dielectric sidewall film is formed around vertical sides of a top electrode and a nanotube fabric layer of the resistive change element with the top electrode and the portion of the thin dielectric sidewall formed around the top electrode not shown so that the nanotube fabric layer can be shown in greater detail.

Referring now to FIG. 6B, a three-dimensional view of the resistive change element 610 with the top electrode 616 not shown so that the nanotube fabric layer 614 can be shown in greater detail is illustrated. FIG. 6B also shows the thin dielectric sidewall film 613 formed around the vertical sides of the nanotube fabric layer 614 with the portion of the thin dielectric sidewall film 613 formed around the vertical sides of the top electrode 616 not shown. FIG. 6B further shows the generally square ring shape of the portion of the thin dielectric sidewall film 613 formed around the vertical sides of the nanotube fabric layer 614. It is noted that the discussion of resistive change element 610 is applicable to resistive change element 620 because resistive change element 610 and resistive change element 620 have the same structure and because a thin dielectric sidewall film 613, 623 is formed around the vertical sides of the top electrode 616, 626 and the vertical sides of the nanotube fabric layer 614, 624 of each resistive change element 610, 620.

The thin dielectric sidewall film 613 seals the nanotube fabric layer 614 before the regions around the resistive change element 610 are filled with the dielectric 650, so that the dielectric 650 does not penetrate into the nanotube fabric layer 614. The thin dielectric sidewall film 613 penetrates a smaller distance into the nanotube fabric layer 614 than the dielectric 650 would penetrate into the nanotube fabric layer 614 so that nanotube fabric layer 614 has a pinned region 617 smaller than a pinned region that would be formed by the dielectric 650 penetrating into the nanotube fabric layer 614. The nanotube fabric layer 614 also has an unpinned region 618 larger than an unpinned region that would be formed by the dielectric 650 penetrating into the nanotube fabric layer 614. The smaller pinned region 617 of the nanotube fabric layer 614 is less restrictive of movement of nanotubes than a larger pinned region that would be formed by the dielectric 650 penetrating into the nanotube fabric layer 614 because fewer nanotubes are entirely or partially in the smaller pinned region 617 and the nanotubes partially in smaller pinned region 617 have smaller portions in the smaller pinned region 617. Thus, when the nanotube fabric layer 614 is formed with nanotubes that are relatively defect free the nanotube fabric layer 614 is less restrictive of movement of nanotubes than nanotube fabric layer 214a, when the nanotube fabric layer 614 is formed with nanotubes having defects introduced post nanotube deposition the nanotube fabric layer 614 is less restrictive of movement of nanotubes than nanotube fabric layer 314, and when the nanotube fabric layer 614 is formed with nanotubes with intrinsic nanotube defects introduced prior to nanotube deposition the nanotube fabric layer 614 is less restrictive of movement of nanotubes than nanotube fabric layer 414. Further, when the nanotube fabric layer 614 is formed with nanotubes with intrinsic nanotube defects introduced prior to nanotube deposition and additional defects introduced post nanotube deposition, the nanotube fabric layer 614 will be less restrictive of movement of nanotubes than a nanotube fabric layer formed with the same nanotubes with the dielectric 650 penetrating into the nanotube fabric layer.

The resistive change element 610 can be adjusted (programmed) between at least two non-volatile resistive states by applying electrical stimuli across the resistive change element 610. As discussed above, a make electrical stimulus including one or more programming pulses of specific voltages, currents, and pulse widths or a pulse train made up of a series of sub-pulses can be applied across the resistive change element 610 to adjust a resistive state of the resistive change element 610 from a high resistive state to a low resistive state. Also, as discussed above, a break electrical stimulus including one or more programming pulses of specific voltages, currents, and pulse widths or a pulse train made up of a series of sub-pulses can be applied across the resistive change element 610 to adjust a resistive state of the resistive change element 610 from the low resistive state to the high resistive state.

When the resistive change element 610 and a resistive change element with a dielectric, such as a flowable dielectric, penetrating into a nanotube fabric layer have approximately the same dimensions and nanotube fabric layers formed with approximately the same type of nanotubes, the number of conductive paths made by a make electrical stimulus to switch the resistive change element 610 from a high resistive state to a low resistive state is generally greater than the number of conductive paths made by a make electrical stimulus to switch the resistive change element with a dielectric, such as a flowable dielectric, penetrating into a nanotube fabric layer from a high resistive state to a low resistive state because nanotubes in the nanotube fabric layer 614 can move a greater extent of space to form conductive paths. Additionally, the number of conductive paths broken by a break electrical stimulus to switch the resistive change element 610 from a low resistive state to a high resistive state is generally greater than the number of conductive paths broken by a break electrical stimulus to switch the resistive change element with a dielectric, such as a flowable dielectric, penetrating into a nanotube fabric layer from a low resistive state to a high resistive state because the nanotube fabric layer 614 has a greater number of conductive paths formed by a make electrical stimulus, and thus, the nanotube fabric layer 614 has a greater number of conductive paths that can be broken by the break electrical stimulus. The difference between a resistive value for the low resistive state and a resistive value for the high resistive state for the resistive change element 610 is greater than the difference between a resistive value for the low resistive state and a resistive value for the high resistive state for the resistive change element with a dielectric, such as a flowable dielectric, penetrating into a nanotube fabric layer because the number of conductive paths made and broken to switch resistive states of the resistive change element 610 is greater than the number of conductive paths made and broken to switch resistive states of the resistive change element with a dielectric, such as a flowable dielectric, penetrating into a nanotube fabric layer. The greater difference between the resistive values for the low resistive state and the high resistive state permits the resistive states of the resistive change element 610 to have a more discernible difference between resistive states. Thus, sealing sides of a nanotube fabric layer with a thin dielectric sidewall film, such as thin dielectric sidewall film 613, to prevent a dielectric, such as a flowable dielectric, from penetrating into the nanotube fabric layer permits scaling resistive change elements to smaller dimensions.

Figure 7A:
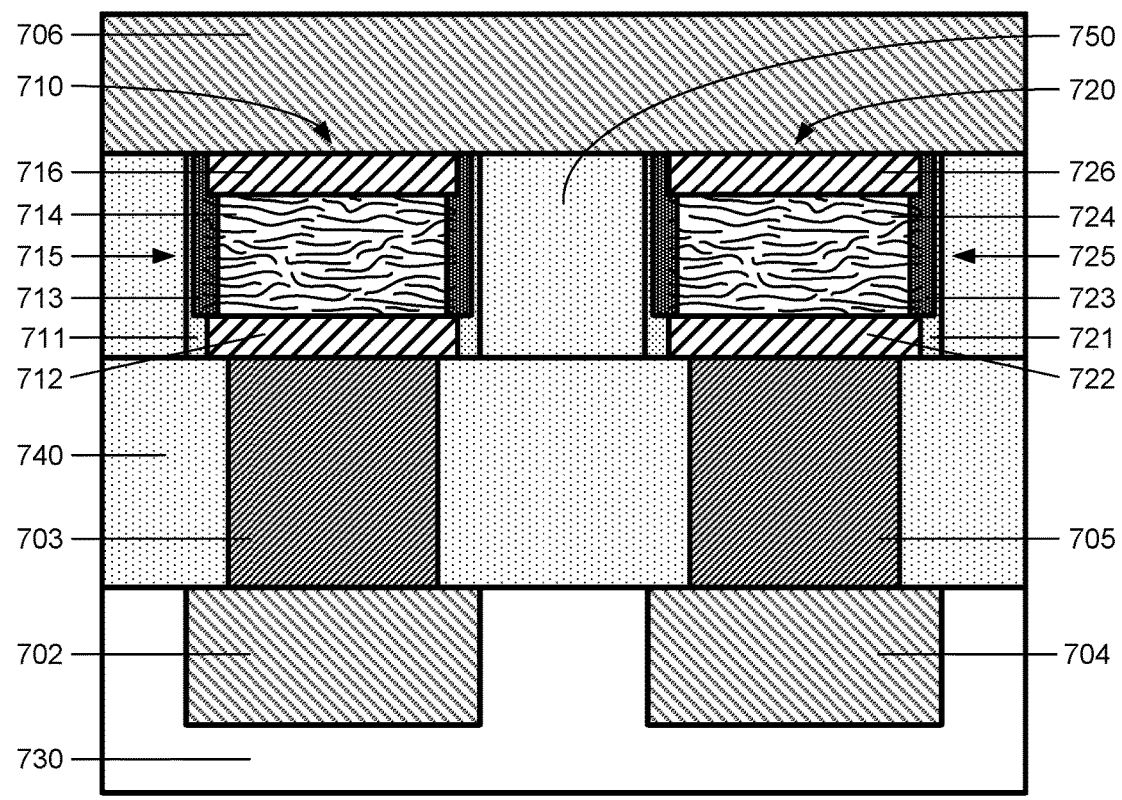
FIG. 7A illustrates a cross-sectional view of resistive change elements where a multi-film thin dielectric sidewall is formed around vertical sides of a top electrode, a nanotube fabric layer, and a bottom electrode of each resistive change element.

Referring now to FIG. 7A, a cross-sectional view of resistive change elements 710, 720 from a cross point resistive change element array where multi-film thin dielectric sidewalls 715, 725 are formed around vertical sides of the resistive change elements 710, 720 prior to filling the regions around the resistive change elements 710, 720 with a dielectric 750, such as a flowable dielectric, is illustrated.

The resistive change element 710 is located where a top interconnect conductor 706 crosses a first bottom interconnect conductor 702 and the resistive change element 720 is located where the top interconnect conductor 706 crosses a second bottom interconnect conductor 704. The cross point resistive change element array can be a two-dimensional cross point resistive change element array with a layout similar to one level of the three-dimensional cross point resistive change element array 200 shown in FIG. 2A and can include additional resistive change elements and multi-film thin dielectric sidewalls having the same structure as the resistive change elements 710, 720 and the multi-film thin dielectric sidewalls 715, 725, additional top interconnect conductors having the same structure as the top interconnect conductor 706, and additional bottom interconnect conductors having the same structure as the first and second bottom interconnect conductors 702, 704. Alternatively, the cross point resistive change element array can be a three-dimensional cross point resistive change element array with a layout similar to the three-dimensional cross point resistive change element array 200 shown in FIG. 2A and can include additional resistive change elements and multi-film thin dielectric sidewalls having the same structure as the resistive change elements 710, 720 and the multi-film thin dielectric sidewalls 715, 725, additional top interconnect conductors having the same structure as the top interconnect conductor 706, and additional bottom interconnect conductors having the same structure as the first and second bottom interconnect conductors 702, 704.

Each resistive change element 710, 720 includes a bottom electrode 712, 722, a nanotube fabric layer 714, 724, and a top electrode 716, 726. The nanotube fabric layers 714, 724 can be formed with nanotubes that are relatively defect free, such as discussed above with respect to FIGS. 2A-2F, nanotubes having defects introduced post nanotube deposition, such as discussed above with respect to FIGS. 3A-3E, nanotubes having intrinsic nanotube defects introduced prior to nanotube deposition, such as discussed above with respect to FIGS. 4A-4E, and nanotubes having intrinsic nanotube defects introduced prior to nanotube deposition and additional defects introduced post nanotube deposition. The nanotube fabric layers 714, 724 are shown in FIG. 7A without the dielectric 750 penetrating into the nanotube fabric layers 714, 724 because the multi-film thin dielectric sidewalls 715, 725 seal the nanotube fabric layers 714, 724. Thus, the combination of the resistive change element 710 and the multi-film thin dielectric sidewall 715 can be considered a sealed resistive change element and the combination of the resistive change element 720 and the multi-film thin dielectric sidewall 725 can be considered a sealed resistive change element. Additionally, the multi-film thin dielectric sidewalls 715, 725 can prevent contaminants, such as water and metallic contaminants, from penetrating into the nanotube fabric layers 714, 724 and can prevent parasitic conductive paths between the top electrodes 716, 726 and the bottom electrodes 712, 722.

Each multi-film thin dielectric sidewall 715, 725 includes a first thin dielectric sidewall film 713, 723, and a second thin dielectric sidewall film 711, 721. The first thin dielectric sidewall film 713 is formed around vertical sides of the top electrode 716 and vertical sides of the nanotube fabric layer 714. Alternatively, the first thin dielectric sidewall film 713 can be formed around only vertical sides of nanotube fabric layer 714 or the first thin dielectric sidewall film 713 can be formed around vertical sides of the resistive change element 710. The first thin dielectric sidewall film 723 is formed around vertical sides of the top electrode 726 and vertical sides of the nanotube fabric layer 724. Alternatively, the first thin dielectric sidewall film 723 can be formed around only vertical sides of the nanotube fabric layer 724 or the first thin dielectric sidewall film 723 can be formed around vertical sides of the resistive change element 720. The second thin dielectric sidewall film 711 is formed around vertical sides of the resistive change element 710 with the first thin dielectric sidewall film 713 located between the second thin dielectric sidewall film 711 and vertical sides of the top electrode 716 and vertical sides of the nanotube fabric layer 714. The second thin dielectric sidewall film 721 is formed around vertical sides of the resistive change element 720 with the first thin dielectric sidewall film 723 located between the second thin dielectric sidewall film 721 and vertical sides of the top electrode 726 and vertical sides of the nanotube fabric layer 724. Additionally, although each multi-film thin dielectric sidewall 715, 725 is shown in FIG. 7A including a first thin dielectric sidewall film 713, 723, and a second thin dielectric sidewall film 711, 721, the multi-film thin dielectric sidewalls 715, 725 are not limited to including two thin dielectric sidewall films and the multi-film thin dielectric sidewalls 715, 725 can include a plurality of thin dielectric sidewall films.

The bottom electrode 712 is in contact with the nanotube fabric layer 714 and the top electrode 716 is in contact with the nanotube fabric layer 714. The bottom electrode 722 is in contact with the nanotube fabric layer 724 and the top electrode 726 is in contact with the nanotube fabric layer 724. Alternatively, each resistive change element 710, 720 can include at least one intervening layer located between the bottom electrode 712, 722 and the nanotube fabric layer 714, 724, at least one intervening layer located between the nanotube fabric layer 714, 724 and the top electrode 716, 726, or at least one intervening layer located between the bottom electrode 712, 722 and the nanotube fabric layer 714, 724 and at least one intervening layer located between the nanotube fabric layer 714, 724 and the top electrode 716, 726. Alternatively, the bottom electrode 712, 722 can be omitted from each resistive change element 710, 720, the top electrode 716, 726 can be omitted from each resistive change element 710, 720, or the bottom electrode 712, 722 and the top electrode 716, 726 can be omitted from each resistive change element 710, 720.

Although not shown in the cross-sectional view of FIG. 7A, each resistive change element 710, 720, has a square horizontal cross-sectional shape, a length $L_{RCE}$, a width $W_{RCE}$, and a height $H_{RCE}$, where the length $L_{RCE}$ is approximately equal to F, the width $W_{RCE}$ is approximately equal to F, and the height $H_{RCE}$ is approximately equal to the sum of the thicknesses of the bottom electrode, the nanotube fabric layer, and the top electrode of that resistive change element. The height $H_{RCE}$ of each resistive change element 710, 720 is typically larger than F, however, the height $H_{RCE}$ of each resistive change element 710, 720 can be scaled, such that height $H_{RCE}$ approaches F. F represents a minimum feature size to achieve maximum resistive change element density in a resistive change element array. Alternatively, each resistive change element 710, 720 can have a length $L_{RCE}$ larger than F, a width $W_{RCE}$ larger than F, and/or a height $H_{RCE}$ larger than F. Alternatively, each resistive change element 710, 720 can have a non-square horizontal cross-sectional shape, such as a rectangular horizontal cross-sectional shape, a circular horizontal cross-sectional shape, an oval horizontal cross-sectional shape, a triangular horizontal cross-sectional shape, a trapezoidal horizontal cross-sectional shape, an irregular horizontal cross-sectional shape, and a non-uniform horizontal cross-sectional shape where different sections of each resistive change element 710, 720 can have different dimensions. The bottom electrodes 712, 722, the nanotube fabric layers 714, 724, and the top electrodes 716, 726 have square horizontal cross-sectional shapes because the resistive change elements 710, 720 have square horizontal cross-sectional shapes. The bottom electrodes 712, 722 have a length dimension approximately equal to F, a width dimension approximately equal to F, and a thickness TBE. The nanotube fabric layers 714, 724 have a length dimension approximately equal to F, a width dimension approximately equal to F, and a thickness TNF. The top electrodes 716, 726 have a length dimension approximately equal to F, a width dimension approximately equal to F, and a thickness TTE.

The multi-film thin dielectric sidewalls 715, 725 have generally square ring shapes because the top electrodes 716, 726, the nanotube fabric layers 714, 724, and the bottom electrodes 712, 722 have square horizontal cross-sectional shapes. The portions of the first thin dielectric sidewall films 713, 723 formed around the top electrodes 716, 726 have ring shapes based on the horizontal cross-sectional shapes of the top electrodes 716, 726 and the portions of the first thin dielectric sidewall films 713, 723 formed around the nanotube fabric layers 714, 724 have ring shapes based on the horizontal cross-sectional shapes of the nanotube fabric layers 714, 724. The portions of the second thin dielectric sidewall films 711, 721 formed around the top electrodes 716, 726 have ring shapes based on the horizontal cross-sectional shapes of the top electrodes 716, 726, the portions of the second thin dielectric sidewall films 711, 721 formed around the nanotube fabric layers 714, 724 have ring shapes based on the horizontal cross-sectional shapes of the nanotube fabric layers 714, 724, and the portions of the second thin dielectric sidewall films 711, 721 formed around the bottom electrodes 712, 722 have ring shapes based on the horizontal cross-sectional shapes of the bottom electrodes 712, 722. Alternatively, when the top electrodes 716, 726, the nanotube fabric layers 714, 724, and the bottom electrodes 712, 722 have non-square horizontal cross-sectional shapes, the multi-film thin dielectric sidewall 715, 725 have non-square ring shapes. It is noted that the term ring shape is not limited to a circular shape, but rather, the term ring shape can include a square ring shape, a rectangular ring shape, an oval ring shape, a triangular ring shape, a trapezoidal ring shape, an irregular ring shape, a non-uniform ring shape, and other non-square ring shapes.

For example, when the top electrodes 716, 726, the nanotube fabric layers 714, 724, and the bottom electrodes 712, 722 have rectangular horizontal cross-sectional shapes, the multi-film thin dielectric sidewalls 715, 725 have generally rectangular ring shapes. For example, when the top electrodes 716, 726, the nanotube fabric layers 714, 724, and the bottom electrodes 712, 722 have circular horizontal cross-sectional shapes, the multi-film thin dielectric sidewalls 715, 725 have generally circular ring shapes. For example, when the top electrodes 716, 726, the nanotube fabric layers 714, 724, and the bottom electrodes 712, 722 have non-uniform horizontal cross-sectional shapes, where the top electrodes 716, 726, the nanotube fabric layers 714, 724, and the bottom electrodes 712, 722 have different horizontal cross-sectional shapes, the multi-film thin dielectric sidewalls 715, 725 have non-uniform horizontal cross-section shapes, where the portions of the first thin dielectric sidewall films 713, 723 formed around the top electrodes 716, 726, and the portions of the first thin dielectric sidewall films 713, 723 formed around the nanotube fabric layers 714, 724 have different ring shapes. Further, in the above example, where the top electrodes 716, 726, the nanotube fabric layers 714, 724, and the bottom electrodes 712, 722 have different horizontal cross-sectional shapes, the portions of the second thin dielectric sidewall films 711, 721 formed around the top electrodes 716, 726, the portions of the second thin dielectric sidewall films 711, 721 formed around the nanotube fabric layers 714, 724, and the portions of the second thin dielectric sidewall films 711, 721 also have different ring shapes.

The bottom electrode 712 of the resistive change element 710 is in electrical communication with a first bottom interconnect conductor 702 through a first bottom plug 703 and the bottom electrode 722 of the resistive change element 720 is in electrical communication with a second bottom interconnect conductor 704 through a second bottom plug 705. The first bottom interconnect conductor 702 and the second bottom interconnect conductor 704 are formed in a dielectric 730. The first bottom plug 703 and the second bottom plug 705 are formed in a dielectric 740. The resistive change element 710 is formed above the first bottom plug 703 and the resistive change element 720 is formed above the second bottom plug 705. The top electrode 716 of the resistive change element 710 is in electrical communication with a top interconnect conductor 706 and the top electrode 726 of the resistive change element 720 is in electrical communication with the top interconnect conductor 706. Alternatively, the first bottom plug 703 and the second bottom plug 705 can be omitted, a first top plug located between the top electrode 716 and the top interconnect conductor 706 and a second top plug located between the top electrode 726 and the top interconnect conductor 706 can be included, or the first bottom plug 703 and the second bottom plug 705 can be omitted and a first top plug located between the top electrode 716 and the top interconnect conductor 706 and a second top plug located between the top electrode 726 and the top interconnect conductor 706 can be included. Further, intervening layers, such as barrier metal layers to provide a barrier to metal migration, can be included. For example, metal layers of Ta, TaN, TiN, $Mo_2N$, Ru, $RuO_x$ or amorphous ternary alloys, such as $Ta_{36}Si_{14}N_{50}$, $Ti_{34}Si_{23}N_{43}$, can be included to provide a barrier to copper migration.

The resistive change element 710 and the resistive change element 720 from the cross point resistive change element array can be considered 1-R resistive change memory cells. The resistive change element 710 can be considered a 1-R resistive change memory cell because the resistive change element 710 is in electrical communication with the first bottom interconnect conductor 702 and the top interconnect conductor 706 without an intervening in situ selection device or other current limiting device. The resistive change element 720 can be considered a 1-R resistive change memory cell because the resistive change element 720 is in electrical communication with the second bottom interconnect conductor 704 and the top interconnect conductor 706 without an intervening in situ selection device or other current limiting device.

Alternatively, where 1D1R resistive change memory cells are desired, a diode in electrical communication with the resistive change element 710 and located between the resistive change element 710 and the first bottom interconnect conductor 702 or between the resistive change element 710 and the top interconnect conductor 706 can be included and a diode in electrical communication with the resistive change element 720 and located between the resistive change element 720 and the second bottom interconnect conductor 704 or between the resistive change element 720 and the top interconnect conductor 706 can be included. The diode in electrical communication with the resistive change element 710 and the resistive change element 710 form a 1D1R resistive change memory cell and the diode in electrical communication with the resistive change element 720 and the resistive change element 720 form a 1D1R resistive change memory cell. The diodes can have the same horizontal cross-sectional shapes as the resistive change elements 710, 720 or the diodes can have horizontal cross-sectional shapes different from the horizontal cross-sectional shapes of the resistive change elements 710, 720. A multi-film thin dielectric sidewall formed around the vertical sides of the resistive change element 710 can further include a portion formed around at least a portion vertical sides of the diode in electrical communication with the resistive change element 710 and a multi-film thin dielectric sidewall formed around the vertical sides of the resistive change element 720 can further include a portion formed around at least a portion vertical sides of the diode in electrical communication with the resistive change element 720. The portions of the multi-film thin dielectric sidewalls formed around at least portions of the diodes have ring shapes based on the horizontal cross-sectional shapes of the diodes.

The combination of the diode in electrical communication with the resistive change element 710 and located between the resistive change element 710 and the first bottom interconnect conductor 702, the resistive change element 710, and the multi-film thin dielectric sidewall formed around the resistive change element 710 and around at least a portion of the diode can be considered a sealed diode-resistive change element. The combination of the diode in electrical communication with the resistive change element 710 and located between the resistive change element 710 and the top interconnect conductor 706, the resistive change element 710, and the multi-film thin dielectric sidewall formed around the resistive change element 710 and around at least a portion of the diode can be considered a sealed diode-resistive change element. The combination of the diode in electrical communication with the resistive change element 720 and located between the resistive change element 720 and the second bottom interconnect conductor 704, the resistive change element 720, and the multi-film thin dielectric sidewall formed around the resistive change element 720 and around at least a portion of the diode can be considered a sealed diode-resistive change element. The combination of the diode in electrical communication with the resistive change element 720 and located between the resistive change element 720 and the top interconnect conductor 706, the resistive change element 720, and the multi-film thin dielectric sidewall formed around the resistive change element 720 and around at least a portion of the diode can be considered a sealed diode-resistive change element.

Additionally, when the diode in electrical communication with the resistive change element 710 and the resistive change element 710 and the diode in electrical communication with the resistive change element 720 and the resistive change element 720 form a 1D1R resistive change memory cells as discussed above, the first bottom plug 703 and the second bottom plug 705 can be omitted, a first top plug located between the top electrode 716 and the top interconnect conductor 706 and a second top plug located between the top electrode 726 and the top interconnect conductor 706 can be included, or the first bottom plug 703 and the second bottom plug 705 can be omitted and a first top plug located between the top electrode 716 and the top interconnect conductor 706 and a second top plug located between the top electrode 726 and the top interconnect conductor 706 can be included. Further, when the diode in electrical communication with the resistive change element 710 and the resistive change element 710 and the diode in electrical communication with the resistive change element 720 and the resistive change element 720 form 1D1R resistive change memory cells as discussed above, intervening layers, such as barrier metal layers to provide a barrier to metal migration, can be included. For example, metal layers of Ta, TaN, TiN, $Mo_2N$, Ru, $RuO_x$ or amorphous ternary alloys, such as $Ta_{36}Si_{14}N_{50}$, $Ti_{34}Si_{23}N_{43}$, can be included to provide a barrier to copper migration.

Figure 7B:
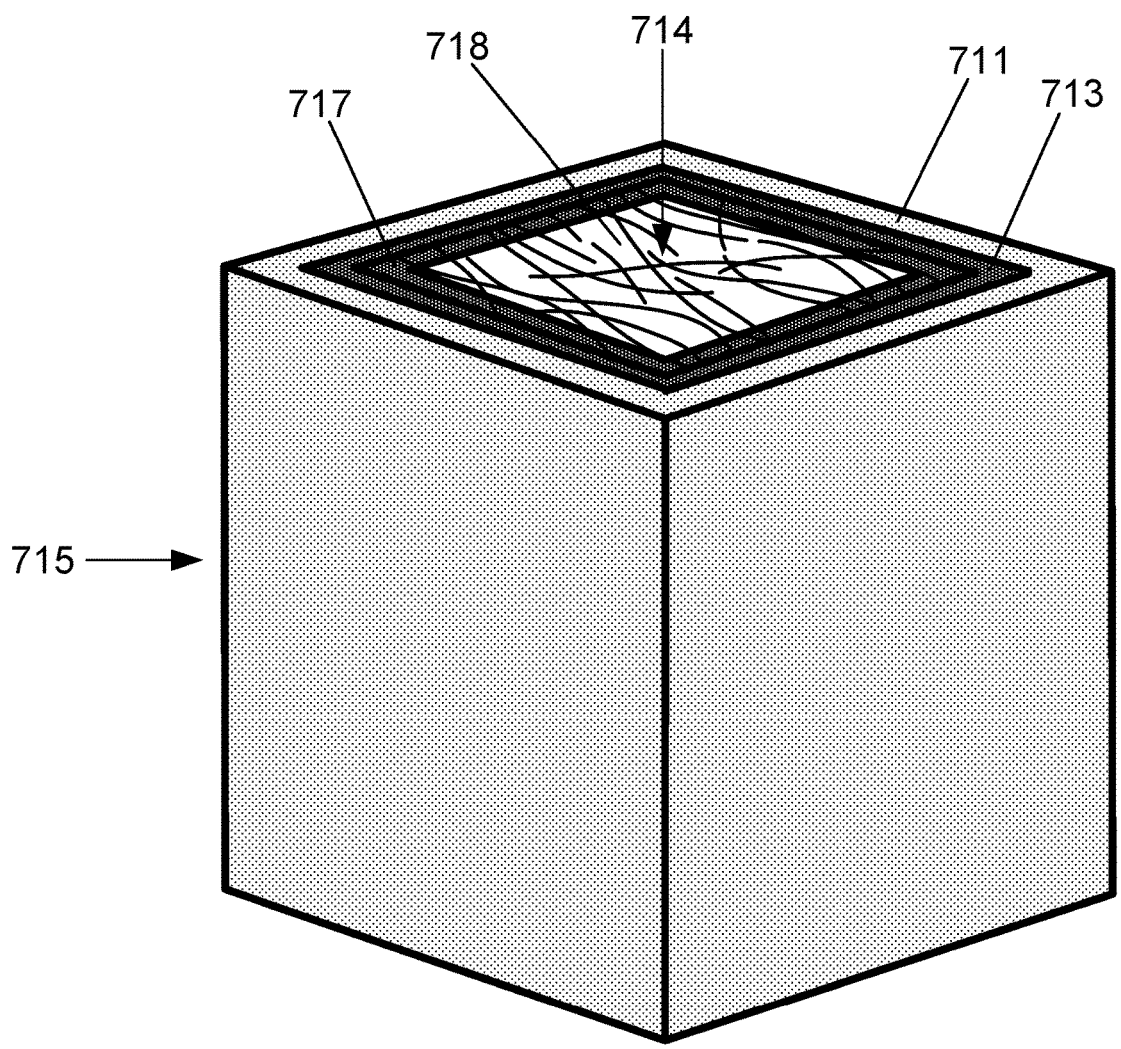
FIG. 7B illustrates a three-dimensional view of a resistive change element where a multi-film thin dielectric sidewall is formed around vertical sides of a top electrode, a nanotube fabric layer, and a bottom electrode of the resistive change element with the top electrode and the portion of the thin dielectric sidewall formed around the top electrode not shown so that the nanotube fabric layer can be shown in greater detail.

Referring now to FIG. 7B, a three-dimensional view of the resistive change element 710 with the top electrode 716 not shown so that the nanotube fabric layer 714 can be shown in greater detail is illustrated. FIG. 7B also shows the multi-film thin dielectric sidewall 715 formed around the vertical sides of the bottom electrode 712 and the vertical sides of the nanotube fabric layer 714 with the portion of the multi-film thin dielectric sidewall 715 formed around the vertical sides of the top electrode 716 also not shown. FIG. 7B further shows the generally square ring shape of portion of the multi-film thin dielectric sidewall 715 formed around the vertical sides of the bottom electrode 712 and the vertical sides of the nanotube fabric layer 714. It is noted that the discussion of resistive change element 710 is applicable to resistive change element 720 because resistive change element 710 and resistive change element 720 have the same structure and because a multi-film thin dielectric sidewall 715, 725 is formed around the vertical sides of each resistive change element 710, 720.

The multi-film thin dielectric sidewall 715 seals the nanotube fabric layer 714 before the regions around the resistive change element 710 are filled with the dielectric 750, so that the dielectric 750 does not penetrate into the nanotube fabric layer 714. The first thin dielectric sidewall film 713 penetrates a smaller distance into the nanotube fabric layer 714 than the dielectric 750 would penetrate into the nanotube fabric layer 714 so that nanotube fabric layer 714 has a pinned region 717 smaller than a pinned region that would be formed by the dielectric 750 penetrating into the nanotube fabric layer 714. The nanotube fabric layer 714 also has an unpinned region 718 larger than an unpinned region that would be formed by the dielectric 750 penetrating into the nanotube fabric layer 714. The smaller pinned region 717 of the nanotube fabric layer 714 is less restrictive of movement of nanotubes than a larger pinned region that would be formed by the dielectric 750 penetrating into the nanotube fabric layer 714 because fewer nanotubes are entirely or partially in the smaller pinned region 717 and the nanotubes partially in smaller pinned region 717 have smaller portions in the smaller pinned region 717. Thus, when the nanotube fabric layer 714 is formed with nanotubes that are relatively defect free the nanotube fabric layer 714 is less restrictive of movement of nanotubes than nanotube fabric layer 214a, when the nanotube fabric layer 714 is formed with nanotubes having defects introduced post nanotube deposition the nanotube fabric layer 714 is less restrictive of movement of nanotubes than nanotube fabric layer 314, and when the nanotube fabric layer 714 is formed with nanotubes with intrinsic nanotube defects introduced prior to nanotube deposition the nanotube fabric layer 714 is less restrictive of movement of nanotubes than nanotube fabric layer 414. Further, when the nanotube fabric layer 714 is formed with nanotubes with intrinsic nanotube defects introduced prior to nanotube deposition and additional defects introduced post nanotube deposition, the nanotube fabric layer 714 will be less restrictive of movement of nanotubes than a nanotube fabric layer formed with the same nanotubes with the dielectric 750 penetrating into the nanotube fabric layer.

The resistive change element 710 can be adjusted (programmed) between at least two non-volatile resistive states by applying electrical stimuli across the resistive change element 710. As discussed above, a make electrical stimulus including one or more programming pulses of specific voltages, currents, and pulse widths or a pulse train made up of a series of sub-pulses can be applied across the resistive change element 710 to adjust a resistive state of the resistive change element 710 from a high resistive state to a low resistive state. Also, as discussed above, a break electrical stimulus including one or more programming pulses of specific voltages, currents, and pulse widths or a pulse train made up of a series of sub-pulses can be applied across the resistive change element 710 to adjust a resistive state of the resistive change element 710 from the low resistive state to the high resistive state.

When the resistive change element 710 and a resistive change element with a dielectric, such as a flowable dielectric, penetrating into a nanotube fabric layer have approximately the same dimensions and nanotube fabric layers formed with approximately the same type of nanotubes, the number of conductive paths made by a make electrical stimulus to switch the resistive change element 710 from a high resistive state to a low resistive state is generally greater than the number of conductive paths made by a make electrical stimulus to switch the resistive change element with a dielectric, such as a flowable dielectric, penetrating into a nanotube fabric layer from a high resistive state to a low resistive state because nanotubes in the nanotube fabric layer 714 can move a greater extent of space to form conductive paths. Additionally, the number of conductive paths broken by a break electrical stimulus to switch the resistive change element 710 from a low resistive state to a high resistive state is generally greater than the number of conductive paths broken by a break electrical stimulus to switch the resistive change element with a dielectric, such as a flowable dielectric, penetrating into a nanotube fabric layer from a low resistive state to a high resistive state because the nanotube fabric layer 714 has a greater number of conductive paths formed by a make electrical stimulus, and thus, the nanotube fabric layer 714 has a greater number of conductive paths that can be broken by the break electrical stimulus. The difference between a resistive value for the low resistive state and a resistive value for the high resistive state for the resistive change element 710 is greater than the difference between a resistive value for the low resistive state and a resistive value for the high resistive state for the resistive change element with a dielectric, such as a flowable dielectric, penetrating into a nanotube fabric layer because the number of conductive paths made and broken to switch resistive states of the resistive change element 710 is greater than the number of conductive paths made and broken to switch resistive states of the resistive change element with a dielectric, such as a flowable dielectric, penetrating into a nanotube fabric layer. The greater difference between the resistive values for the low resistive state and the high resistive state permits the resistive states of the resistive change element 710 to have a more discernible difference between resistive states. Thus, sealing sides of a nanotube fabric layer with a multi-film thin dielectric sidewall, such as multi-film thin dielectric sidewall 715, to prevent a dielectric, such as a flowable dielectric, from penetrating into the nanotube fabric layer permits scaling resistive change elements to smaller dimensions.

FIG. 8 illustrates a flow chart 800 showing a method for sealing a resistive change material layer of a resistive change element formed above a dielectric. The method starts in step 802 with backsputtering particles from the dielectric to form a thin dielectric sidewall film over at least one surface of the resistive change material layer of the resistive change element. The thin dielectric sidewall film can be formed over the at least one surface of the resistive change material layer without any intervening films or intervening layers or the thin dielectric sidewall film can be formed over at least one intervening film or at least one intervening layer formed over the at least one surface of the resistive change material layer. Backsputtering particles from the dielectric to form a thin dielectric sidewall film over at least one surface of the resistive change material layer of the resistive change element, as similarly discussed above in step 802, can be carried out by a highly directional plasma source supplying ions to dislodge particles of the dielectric to form the thin dielectric sidewall film. The highly directional plasma source can supply ions selected from a group consisting of $Ar^+$, $Ne^+$, $Xe^+$, $N^+$, and $N_2^+$. Alternatively, backsputtering particles from the dielectric to form a thin dielectric sidewall film over at least one surface of the resistive change material layer of the resistive change element, as similarly discussed above in step 802, can be carried out by an etch technique having a significant physical etch component, such as a reactive ion etch (RIE), supplying ions to dislodge particles of the dielectric to form the thin dielectric sidewall film.

The method for sealing a resistive change material layer of a resistive change element formed above a dielectric can seal a resistive change material layer formed by resistive change materials such as carbon nanotubes, phase change material, metal oxide, solid electrolyte, and other carbon allotropes such as Buckyballs and graphene flakes. The method for sealing a resistive change material layer of a resistive change element formed above a dielectric can be performed in conjunction with methods for fabricating resistive change elements. Further, the method for sealing a resistive change material layer of a resistive change element formed above a dielectric can be adjusted for methods for fabricating resistive change elements. For example, ions supplied by a highly directional plasma source can be adjusted to include ions to volatize any carbon sputtered from a photoresist masking layer. For example, when a method for fabricating a resistive change element above a dielectric includes a reactive ion etch for forming a resistive change element, the reactive ion etch can be continued into the dielectric to dislodge particles of the dielectric to form the thin dielectric sidewall film.

The method for sealing a resistive change material layer of a resistive change element formed above a dielectric is discussed below in conjunction with a method for fabricating resistive change elements in a resistive change element array. However, the method for sealing a resistive change material layer of a resistive change element formed above a dielectric, discussed above, is not limited to being performed in conjunction with the method for fabricating resistive change elements in a resistive change element array discussed below. The method for sealing a resistive change material layer of a resistive change element formed above a dielectric can be used to seal diodes and resistive change elements to form sealed diode-resistive change elements, discussed further above. The method for sealing a resistive change material layer of a resistive change element formed above a dielectric can be performed in conjunction with other fabrication methods, such as damascene based fabrication methods. For example, the method for sealing a resistive change material layer of a resistive change element formed above a dielectric can be used to seal two vertical sides of a nanotube fabric layer when performed in conjunction with damascene fabrication methods that form trenches filled with nanotube fabric layers.

FIG. 9 illustrates a flow chart 900 showing a method for sealing a resistive change material layer of a resistive change element. The method starts in step 902 with sputtering particles with primarily a vertical velocity from a dielectric located above the resistive change element to form a thin dielectric sidewall film over at least one surface of the resistive change material layer of the resistive change element. The thin dielectric sidewall film can be formed over the at least one surface of the resistive change material layer without any intervening films or intervening layers or the thin dielectric sidewall film can be formed over at least one intervening film or at least one intervening layer formed over the at least one surface of the resistive change material layer. Sputtering particles with primarily a vertical velocity from a dielectric located above the resistive change element to form a thin dielectric sidewall film over at least one surface of the resistive change material layer of the resistive change element, as similarly discussed above in step 902, can be carried out by sputtering particles from a collimated source so that the particles have primarily a vertical velocity. For example, a collimator is inserted between the dielectric and the resistive change element or magnetic fields are used adjust the velocity of the particles.

The method for sealing a resistive change material layer of a resistive change element can seal a resistive change material layer formed by resistive change materials such as carbon nanotubes, phase change material, metal oxide, solid electrolyte, and other carbon allotropes such as Buckyballs and graphene flakes. The method for sealing a resistive change material layer of a resistive change element can be performed in conjunction with methods for fabricating resistive change elements. Further, the method for sealing a resistive change material layer of a resistive change element can be adjusted for methods for fabricating resistive change elements. For example, the collimated source can be selected based on a method for fabricating resistive change elements.

The method for sealing a resistive change material layer of a resistive change element is discussed below in conjunction with a method for fabricating resistive change elements in a resistive change element array. However, the method for sealing a resistive change material layer of a resistive change element, discussed above, is not limited to being performed in conjunction with the method for fabricating resistive change elements in a resistive change element array discussed below. The method for sealing a resistive change material layer of a resistive change element can be used to seal diodes and resistive change elements to form sealed diode-resistive change elements, discussed further above. The method for sealing a resistive change material layer of a resistive change element can be performed in conjunction with other fabrication methods, such as damascene based fabrication methods. For example, the method for sealing a resistive change material layer of a resistive change element can be used to seal two vertical sides of a nanotube fabric layer when performed in conjunction with damascene fabrication methods that form trenches filled with nanotube fabric layers.

Figure 10:
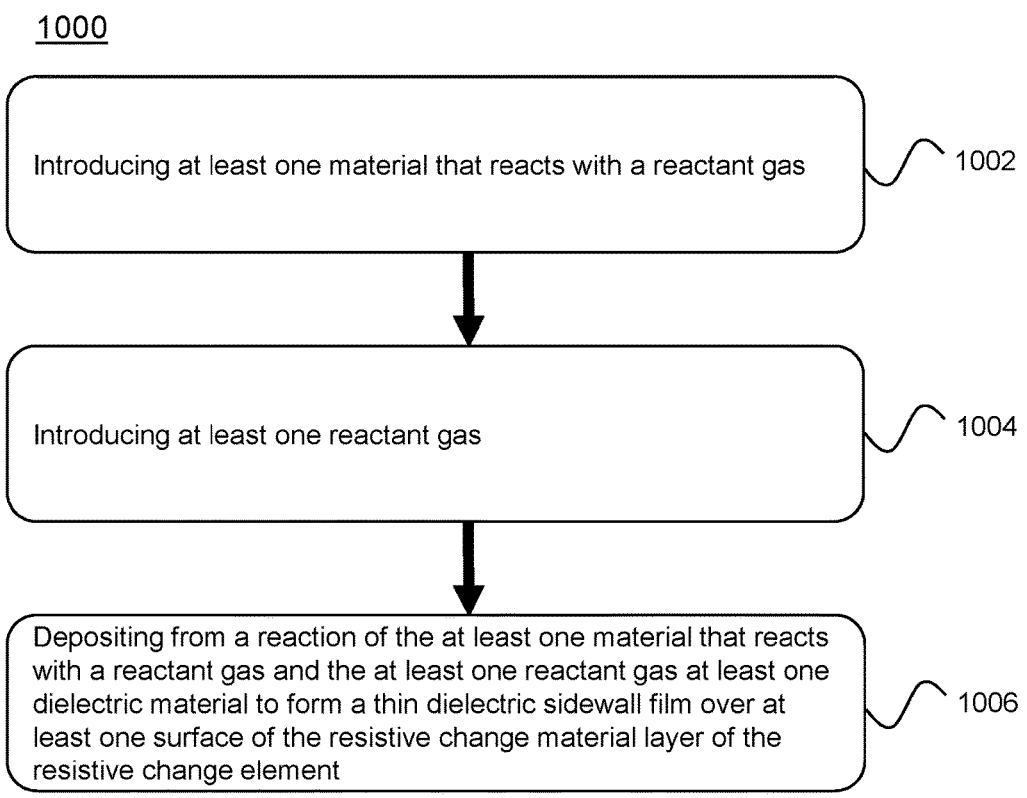
FIG. 10 illustrates a flow chart showing a method for sealing a resistive change material layer of a resistive change element.

FIG. 10 illustrates a flow chart 1000 showing a method for sealing a resistive change material layer of a resistive change element. The method starts in step 1002 with introducing at least one material that reacts with a reactant gas. The method continues in step 1004 with introducing at least one reactant gas. The method proceeds in step 1006 with depositing from a reaction of the at least one material that reacts with a reactant gas and the at least one reactant gas at least one dielectric material to form a thin dielectric sidewall film over at least one surface of the resistive change material layer of the resistive change element. The method for sealing a resistive change material layer of a resistive change element can include additional steps not shown in FIG. 10 and the steps can be performed in a different order from the order shown in FIG. 10. For example, the step of introducing at least one reactant gas, shown in step 1004 in FIG. 10, can be performed before the step of introducing at least one material that reacts with a reactant gas, shown in step 1002 in FIG. 10.

Introducing at least one material that reacts with a reactant gas, as similarly discussed above in step 1002, can be carried out by a fabrication process or a fabrication technique providing at least one material that reacts with a reactant gas. For example, an ionized oxygen based etch of a nanotube fabric layer volatizes carbon of the nanotube fabric layer to form CO and $CO_2$, and thus, the ionized oxygen based etch of a nanotube fabric layer provides molecular carbon, such as CO, $CO_2$, and excess oxygen that is not consumed by etching the nanotube fabric layer into a reactor. In the above example, molecular carbon, such as CO, $CO_2$, and oxygen are materials that react with a reactant gas and the amount of oxygen supplied for the etch can be adjusted to ensure that oxygen for the etch is not depleted by introducing a reactant gas. Alternatively, introducing at least one material that reacts with a reactant gas, as similarly discussed above in step 1002, can be carried out by flowing a material that reacts with a reactant gas or materials that react with a reactant gas. For example, flowing oxygen gas into a reactor, flowing nitrogen gas into a reactor, or flowing oxygen gas and nitrogen gas into a reactor. Alternatively, introducing at least one material that reacts with a reactant gas, as similarly discussed above in step 1002, can be carried out by a fabrication process or a fabrication technique providing at least one material that reacts with a reactant gas and flowing at least one material that reacts with a reactant gas. For example, an ionized oxygen based etch of a nanotube fabric layer provides molecular carbon, such as CO, $CO_2$, and excess oxygen that is not consumed by etching the nanotube fabric layer into a reactor and flowing nitrogen gas into the reactor supplies nitrogen. In the above example, molecular carbon, such as CO, $CO_2$, oxygen, and nitrogen are materials that react with a reactant gas and the amount of oxygen supplied for the etch can be adjusted to ensure that oxygen for the etch is not depleted by introducing a reactant gas. Introducing at least one reactant gas, as similarly discussed above in step 1004, can be carried out by flowing a reactant gas or flowing reactant gases. For example, flowing $SiH_4$ or $SiCH_2$ into a reactor. In the above examples, where an ionized oxygen based etch of a nanotube fabric layer of a resistive change element provides molecular carbon, such as CO, $CO_2$, and oxygen into the reactor, the amount of $SiH_4$ or $SiCH_2$ can be adjusted so that oxygen for the etch is not depleted. The at least one material that reacts with a reactant gas and the at least one reactant gas are design variables and can be selected by a process engineer. For example, a process engineer can select the at least one material that reacts with a reactant gas and the at least one reactant gas based on a desired dielectric material or desired dielectric materials for forming the thin dielectric sidewall films.

Depositing from a reaction of the at least one material that reacts with a reactant gas and the at least one reactant gas at least one dielectric material to form a thin dielectric sidewall film over at least one surface of the resistive change material layer of the resistive change element, as similarly discussed above in step 1006, can be carried out by a reaction of the at least one material that reacts with a reactant gas and the at least one reactant gas depositing at least one dielectric material to form a thin dielectric sidewall film over at least one surface of a resistive change material layer of a resistive change element. For example, molecular carbon, such as CO, $CO_2$, and oxygen react with $SiH_4$ to deposit dielectric materials such as, $SiO_x$, SiC, and SiCO, to form a thin dielectric sidewall film. For example, molecular carbon, such as CO, $CO_2$, oxygen, and nitrogen react with $SiH_4$ to deposit dielectric materials such as, $SiO_x$, SiC, SiCO, and SiON, to form a thin dielectric sidewall film. It is noted that introducing nitrogen to form SiON can reduce penetration into a nanotube fabric layer because SiON is a large molecule. The thin dielectric sidewall film can be formed over the at least one surface of the resistive change material layer without any intervening films or intervening layers or the thin dielectric sidewall film can be formed over at least one intervening film or at least one intervening layer formed over the at least one surface of the resistive change material layer of the resistive change element.

The method for sealing a resistive change material layer of a resistive change element can seal a resistive change material layer formed by resistive change materials such as carbon nanotubes, phase change material, metal oxide, solid electrolyte, and other carbon allotropes such as Buckyballs and graphene flakes. The method for sealing a resistive change material layer of a resistive change element can be performed in conjunction with methods for fabricating resistive change elements. Further, the method for sealing a resistive change material layer of a resistive change element can be adjusted for methods for fabricating resistive change elements. For example, the at least one material that reacts with a reactant gas and the at least one reactant gas can be selected based on the methods for fabricating resistive change elements.

The method for sealing a resistive change material layer of a resistive change element is discussed below in conjunction with a method for fabricating resistive change elements in a resistive change element array. However, the method for sealing a resistive change material layer of a resistive change element, discussed above, is not limited to being performed in conjunction with the method for fabricating resistive change elements in a resistive change element array discussed below. The method for sealing a resistive change material layer of a resistive change element can be used to seal diodes and resistive change elements to form sealed diode-resistive change elements, discussed further above. For example, dielectric materials, such as $SiO_x$, SiC, and SiCO, or dielectric materials, such as $SiO_x$, SiC, SiCO, and SiON, can be deposited to form a thin dielectric sidewall film around at least a portion of the vertical sides of the resistive change element and around at least a portion of the vertical sides of the diode. The method for sealing a resistive change material layer of a resistive change element can be performed in conjunction with other fabrication methods, such as damascene based fabrication methods. For example, the method for sealing a resistive change material layer of a resistive change element can be used to seal two vertical sides of a nanotube fabric layer when performed in conjunction with damascene fabrication methods that form trenches filled with nanotube fabric layers.

Figure 11:
FIG. 11 illustrates a flow chart showing a method for sealing with a multi-film thin dielectric sidewall a resistive change material layer of a resistive change element.

FIG. 11 illustrates a flow chart 1100 showing a method for sealing with a multi-film thin dielectric sidewall a resistive change material layer of a resistive change element. The method starts in step 1102 with forming a first thin dielectric sidewall film over at least one surface of the resistive change material layer of the resistive change element. The method continues in step 1104 with forming a second thin dielectric sidewall film over at least one surface of the resistive change material layer of the resistive change element. Forming a first thin dielectric sidewall film over at least one surface of the resistive change material layer of the resistive change element, as similarly discussed above in step 1102, can be carried out by performing the method for sealing a resistive change material layer of a resistive change element formed above a dielectric discussed above with respect to FIG. 8, the method for sealing a resistive change material layer of a resistive change element discussed above with respect to FIG. 9, or the method for sealing a resistive change material layer of a resistive change element discussed above with respect to FIG. 10. Forming a second thin dielectric sidewall film over at least one surface of the resistive change material layer of the resistive change element, as similarly discussed above in step 1104, can be carried out by performing the method for sealing a resistive change material layer of a resistive change element formed above a dielectric discussed above with respect to FIG. 8, the method for sealing a resistive change material layer of a resistive change element discussed above with respect to FIG. 9, the method for sealing a resistive change material layer of a resistive change element discussed above with respect to FIG. 10, or semiconductor fabrication techniques, such as an atomic layer deposition-chemical vapor deposition (ALD-CVD). The method for sealing with a multi-film thin dielectric sidewall a resistive change material layer of a resistive change element can include additional steps not shown in FIG. 11.

The first thin dielectric sidewall film and the second thin dielectric sidewall film can cover the same surface of the resistive change element or different surfaces of the resistive change element. For example, the first thin dielectric sidewall film can cover the vertical surfaces of the bottom electrode, the nanotube fabric layer, and the top electrode and the second thin dielectric sidewall film can cover the vertical surfaces of the bottom electrode, the nanotube fabric layer, and the top electrode. For example, the first thin dielectric sidewall film can cover the vertical surfaces of the nanotube fabric layer and the top electrode and the second thin dielectric sidewall film can cover the vertical surfaces of the bottom electrode, the nanotube fabric layer, and the top electrode.

The method for sealing with a multi-film thin dielectric sidewall a resistive change material layer of a resistive change element can seal a resistive change material layer formed by resistive change materials such as carbon nanotubes, phase change material, metal oxide, solid electrolyte, and other carbon allotropes such as Buckyballs and graphene flakes. The method for sealing with a multi-film thin dielectric sidewall a resistive change material layer of a resistive change element can be performed in conjunction with methods for fabricating resistive change elements. Further, the method for sealing with a multi-film thin dielectric sidewall a resistive change material layer of a resistive change element can be adjusted for methods for fabricating resistive change elements. For example, the method or technique for forming a first thin dielectric sidewall film over at least one surface of the resistive change material layer of the resistive change element and the method or technique for forming a second thin dielectric sidewall film over at least one surface of the resistive change material layer of the resistive change element can be selected based on the methods for fabricating resistive change elements. For example, when a method for fabricating a resistive change element above a dielectric includes a reactive ion etch for forming a resistive change element, the reactive ion etch can be continued into the dielectric to dislodge particles of the dielectric to form the first thin dielectric sidewall film or to form the second thin dielectric sidewall film.

The method for sealing with a multi-film thin dielectric sidewall a resistive change material layer of a resistive change element is discussed below in conjunction with a method for fabricating resistive change elements in a resistive change element array. However, the method for sealing with a multi-film thin dielectric sidewall a resistive change material layer of a resistive change element, discussed above, is not limited to being performed in conjunction with the method for fabricating resistive change elements in a resistive change element array discussed below. The method for sealing with a multi-film thin dielectric sidewall a resistive change material layer of a resistive change element can be used to seal diodes and resistive change elements to form sealed diode-resistive change elements, discussed further above. The method for sealing with a multi-film thin dielectric sidewall a resistive change material layer of a resistive change element can be performed in conjunction with other fabrication methods, such as damascene based fabrication methods. For example, the method for sealing with a multi-film thin dielectric sidewall a resistive change material layer of a resistive change element can be used to seal two vertical sides of a nanotube fabric layer when performed in conjunction with damascene fabrication methods that form trenches filled with nanotube fabric layers.

FIG. 12 illustrates a high level flow chart 1200 showing a method for fabricating resistive change elements in a resistive change element array. The method for fabricating resistive change elements in a resistive change element array starts in step 1202 with forming at least one bottom plug above at least one bottom interconnect conductor of an initial structure. The method continues in step 1204 with forming at least one resistive change element above the at least one bottom plug, where each resistive change element includes a resistive change material layer. The method proceeds in step 1206 with sealing the resistive change material layer of each of the at least one resistive change element. The method continues in step 1208 with filling regions around the at least one resistive change element with a dielectric. The method proceeds in step 1210 with forming at least one top interconnect conductor above the at least one resistive change element.

The method for fabricating resistive change elements in a resistive change element array can include additional steps not shown in FIG. 12, can omit steps shown in FIG. 12, and the steps can be performed in a different order from the order shown in FIG. 12. For example, as discussed below, the method for fabricating resistive change elements in a resistive change element array can include additional steps not shown in FIG. 12 for fabricating resistive change elements shown in FIGS. 14A-14D and can omit steps shown in FIG. 12 for fabricating resistive change elements shown in FIGS. 14A-14D. For example, the method for fabricating resistive change elements in a resistive change element array can include additional steps not shown in FIG. 12 for forming at least one diode in electrical communication with each of the at least one resistive change element. Further, in the above example, the method for fabricating resistive change elements in a resistive change element array can include sealing each of the at least one diode in electrical communication with each of the at least one resistive change element using a method similar to one of the methods discussed above with respect to FIGS. 8-11. Additionally, the method for fabricating resistive change elements in a resistive change element array may be performed in conjunction with other fabrication methods. For example, the method for fabricating resistive change elements in a resistive change element array can be performed in conjunction with fabrication methods for three-dimensional resistive change element arrays.

Figure 13A:
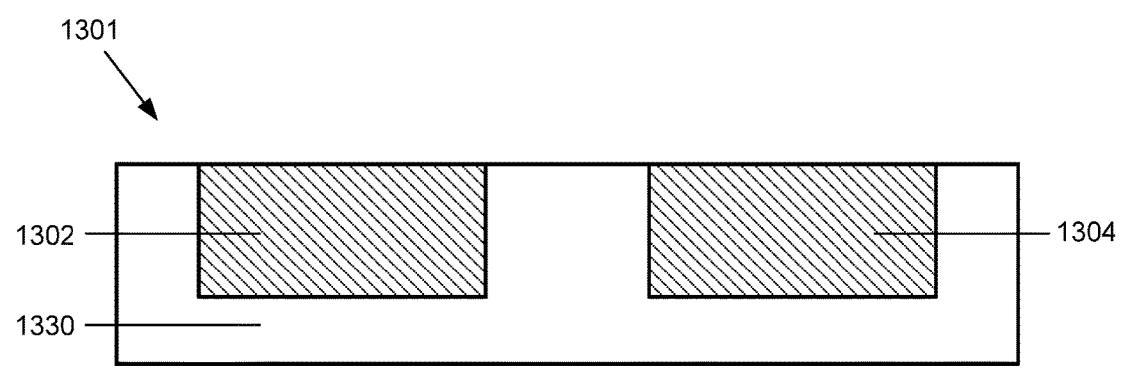
FIG. 13A illustrates a cross-sectional view of an initial structure for fabricating resistive change elements.

The method for fabricating resistive change elements in a resistive change element array shown in FIG. 12 is discussed below with respect to the structures shown in FIGS. 13A-13P. The method for fabricating resistive change elements in a resistive change element array starts, as similarly discussed above in step 1202, by forming a first bottom plug 1303 above a first interconnect conductor 1302 of an initial structure 1301 and a second bottom plug 1305 above a second interconnect conductor 1304 of the initial structure 1301. The initial structure 1301 is shown in FIG. 13A and the initial structure 1301 includes a first interconnect conductor 1302 and a second interconnect conductor 1304 formed in a dielectric 1330. Alternatively, the initial structure 1301 can include a barrier metal layer around the first interconnect conductor 1302 and a barrier metal layer around the second interconnect conductor 1304. Alternatively, the first interconnect conductor 1302 and the second interconnect conductor 1304 can extend through the dielectric 1330. For example, in a three-dimensional resistive change element array the first interconnect conductor 1302 and the second interconnect conductor 1304 can extend through the dielectric 1330 to form common bit lines or common word lines for resistive change elements formed above and below the first interconnect conductor 1302 and second interconnect conductor 1304. The initial structure 1301 has a top surface that has been planarized to provide a smooth surface. The initial structure 1301 is formed on a substrate (not shown), however, the initial structure 1301 can be formed at other levels for three-dimensional layouts. For example, in a three-dimensional resistive change element array the initial structure 1301 can be formed on a level of resistive change elements. The substrate can include drivers and logic circuits in electrical communication with the first interconnect conductor 1302 and the second interconnect conductor 1304. The substrate can be formed from a conductive material, a semiconductor material, or an insulating material as required by the needs of a specific application. Alternatively, the substrate can be used as a starting structure for the method for fabricating resistive change elements in a resistive change element array and the method can include steps for fabricating the initial structure 1301.

Figure 13B:
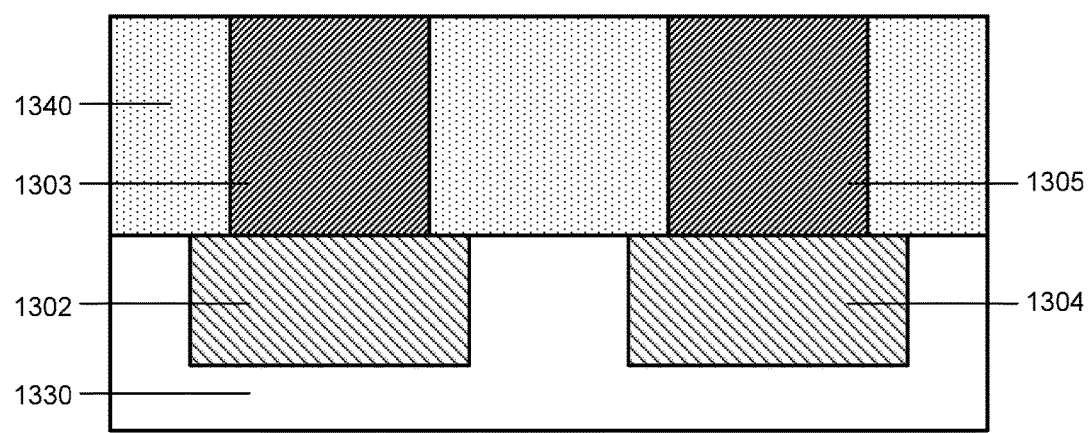
FIG. 13B illustrates a cross-sectional view of bottom plugs formed on an initial structure for fabricating resistive change elements.

The first bottom plug 1303 and the second bottom plug 1305 are formed on the initial structure 1301 by depositing a dielectric 1340 on the initial structure 1301, patterning the dielectric 1340 to form vias in the dielectric 1340 above the first interconnect conductor 1302 and the second interconnect conductor 1304, etching the dielectric 1340 to the first interconnect conductor 1302 and the second interconnect conductor 1304 to form the vias, and depositing a metal film or multiple films filling the vias. Depositing the metal film or the multiple films can be carried out using standard semiconductor fabrication processes such as physical vapor deposition (PVD), chemical vapor deposition (CVD), plasma enhanced chemical vapor deposition (PECVD), atomic layer deposition (ALD), or electroless deposition. The metal film or multiple films should fill the vias without forming voids so that the contact resistances between the first bottom plug 1303 and other elements are low and so that the contact resistances between the second bottom plug 1305 and other elements are low. The metal or metals used for forming the first bottom plug 1303 and the second bottom plug 1305 can be deposited as a single layer film such as, Al, TiN, TaN, W, Ru, RuN, RuO, or other metals for example as disclosed in Bertin et al., U.S. Patent Application Publication No. 2008/0160734, or as a multilayer film such as TiN/W, TiN/TaN, TaN/W, Ru/TiN, Ru/Cu, or other combination of metals depending on the device, circuit, and backend of the line (BEOL) process requirements. FIG. 13B shows the first bottom plug 1303 and the second bottom plug 1305 formed on initial structure 1301. The top surface of the structure shown in FIG. 13B is planarized using standard planarizing techniques such as chemical mechanical polishing (CMP) or plasma etch back leaving the first bottom plug 1303 and the second bottom plug 1305 exposed through the dielectric 1340. Alternatively, the method for fabricating resistive change elements in a resistive change element array can include depositing intervening layers, such as barrier metal layers, prior to depositing the metal film or the multiple films filling the vias. For example, a barrier metal layer can be formed between the first interconnect conductor 1302 and the first bottom plug 1303 and a barrier metal layer can be formed between the second interconnect conductor 1304 and the second bottom plug 1305. Alternatively, the structure shown in FIG. 13B with the first bottom plug 1303 and the second bottom plug 1305 formed on the initial structure 1301 can be used as a starting structure and the step of forming the first bottom plug 1303 and the second bottom plug 1305 can be omitted from the method for fabricating resistive change elements in a resistive change element array. Alternatively, when the first bottom plug 1303 and the second bottom plug 1305 are not desired in the final structure, the step of forming the first bottom plug 1303 and the second bottom plug 1305 can be omitted from the method for fabricating resistive change elements in a resistive change element array.

Figure 13C:
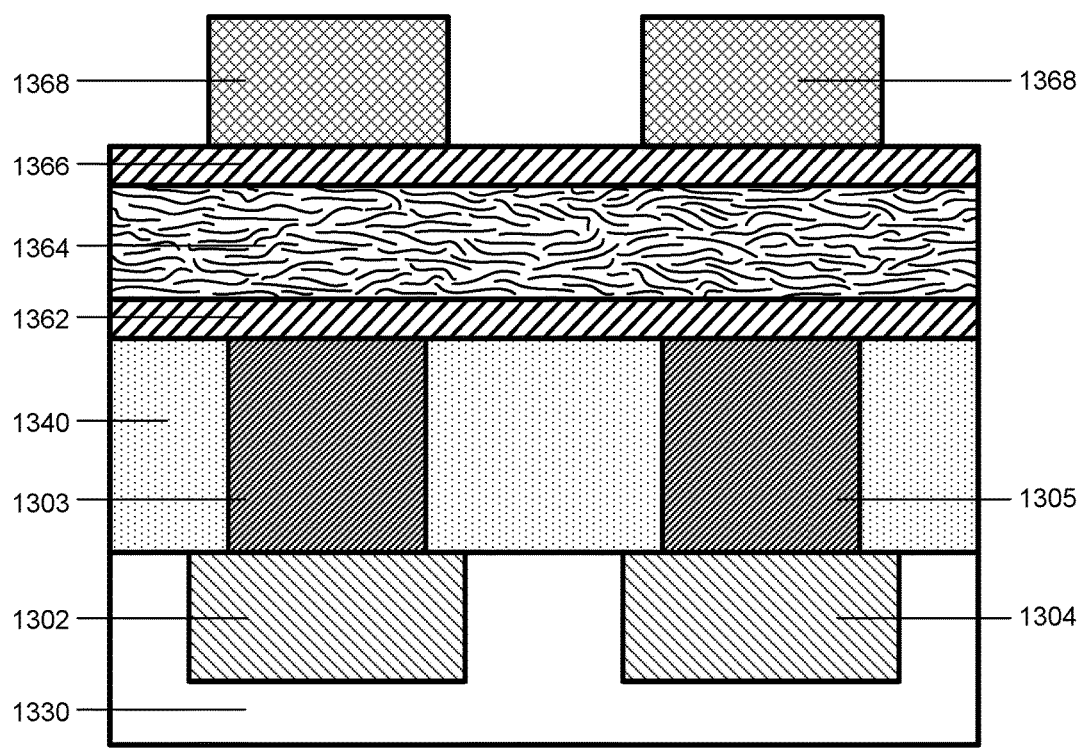
FIG. 13C illustrates a cross-sectional view of a patterned and etched layer of photoresist material, a top metal layer, a nanotube fabric layer, and a bottom metal layer formed on bottom plugs formed on an initial structure for fabricating resistive change elements.
Figure 13D:
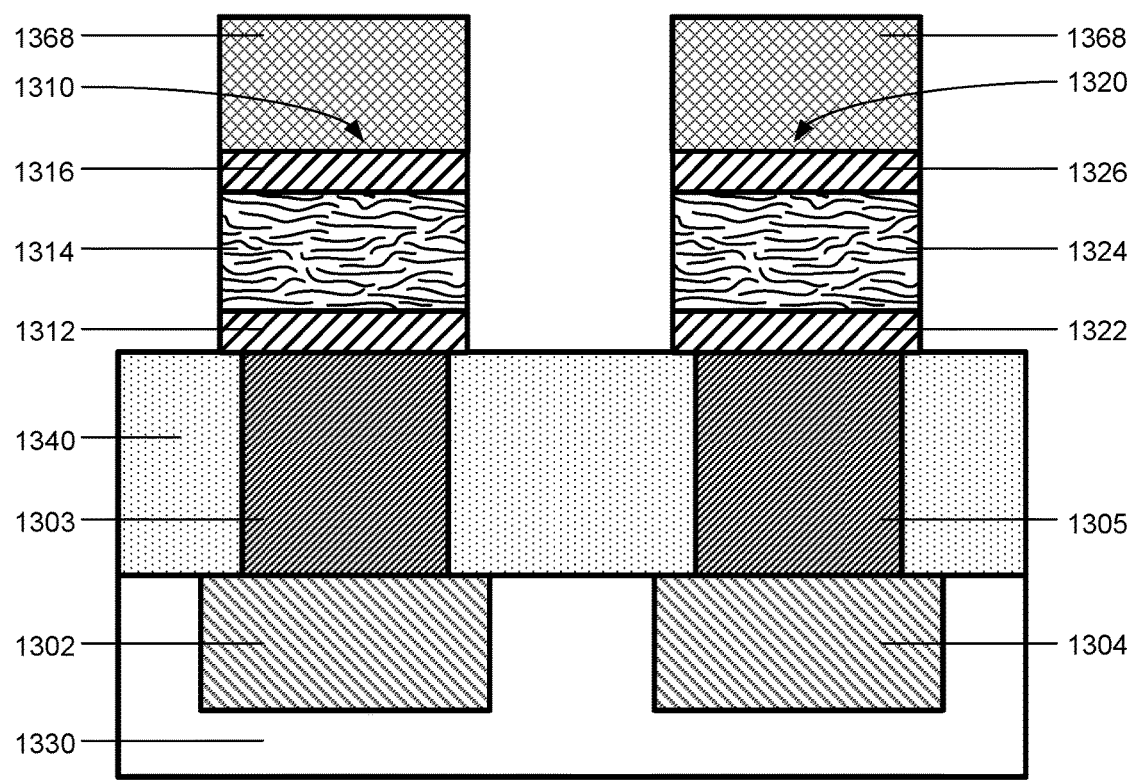
FIG. 13D illustrates a cross-sectional view of a patterned and etched layer of photoresist material on resistive change elements formed on bottom plugs formed on an initial structure for fabricating resistive change elements.

The method for fabricating resistive change elements in a resistive change element array continues, as similarly discussed above in step 1204, by forming a resistive change element 1310 on the first bottom plug 1303 and a resistive change element 1320 on the second bottom plug 1305. The resistive change elements 1310 and 1320 are formed on the first bottom plug 1303 and the second bottom plug 1305 by depositing a bottom metal layer 1362 on the structure shown in FIG. 13B, depositing a nanotube fabric layer 1364 on the bottom metal layer 1362, depositing a top metal layer 1366 on the nanotube fabric layer 1364, depositing a layer of photoresist material on the top metal layer 1366, patterning the layer of photoresist material, and etching the layer of photoresist material, the top metal layer 1366, the nanotube fabric layer 1364, and the bottom metal layer 1362. FIG. 13C illustrates the bottom metal layer 1362, the nanotube fabric layer 1364, the top metal layer 1366, and the patterned and etched layer of photoresist material 1368 on the structure shown in FIG. 13B. FIG. 13D illustrates the resistive change element 1310 formed on the first bottom plug 1303 and the resistive change element 1320 formed on the second bottom plug 1305.

Depositing the bottom metal layer 1362 can be carried out using standard semiconductor fabrication techniques, such as physical vapor deposition (PVD), chemical vapor deposition (CVD), or plasma enhanced chemical vapor deposition (PECVD). The metal or metals used for the bottom metal layer 1362 can be deposited as a single layer film such as, Al, TiN, TaN, W, Ru, RuN, RuO, or other metals for example as disclosed in Bertin et al., U.S. Patent Application Publication No. 2008/0160734, or as a multilayer film such as TiN/W, TiN/TaN, TaN/W, Ru/TiN, Ru/Cu, or other combination of metals depending on the device, circuit, and backend of the line (BEOL) process requirements. Depositing the nanotube fabric layer 1364 can be carried out by spin coating, spray coating, or other coating processes. Spin coating is described in U.S. Pat. No. 7,335,395 to Ward et al. Additionally, as disclosed in U.S. Patent Application Publication No. 2013/0052449, U.S. Pat. Nos. 9,390,790, 9,422, 651, the nanotube fabric layer 1364 may include in addition to the randomly aligned nanotubes, a layer of ordered nanotubes at the top of the nanotube fabric layer 1364 to help prevent penetration of a top metal layer 1366 into the nanotube fabric layer 1364. Further, for embodiments where the nanotube fabric layer 1364 is formed with nanotubes having intrinsic defects introduced prior to nanotube deposition, intrinsic nanotube defects are present in the nanotube feed material prior to depositing nanotubes to form the nanotube fabric layer 1364. Depositing the top metal layer 1366 is carried out after the nanotube fabric layer 1364 is coated and dried. Depositing the top metal layer 1366 can be carried out using standard semiconductor fabrication techniques, such as physical vapor deposition (PVD), chemical vapor deposition (CVD), or plasma enhanced chemical vapor deposition (PECVD). The metal or metals used for the top metal layer 1366 can be deposited as a single layer film such as, TiN, TaN, or Al, or as a multilayer film such as, TaN/TiN, Al/TiN, or Al/TaN, or other combination of metal depending on the device, circuit, and back end of the line (BEOL) process requirements. Additionally, for embodiments where defects are introduced in the nanotube fabric layer 1364 post nanotube deposition, depositing the top metal layer 1366 can be carried out before or after the defects are introduced in the nanotube fabric layer 1364. For example, when defects are introduced in the nanotube fabric layer 1364 post nanotube deposition by ion implantation, defects can be introduced in the nanotube fabric layer 1364 before or after depositing the top metal layer 1366 by adjusting implant parameters, such as ion energy. Alternatively, when resistive change elements without a bottom electrode are desired, depositing the bottom metal layer 1362 can be omitted. Alternatively, when resistive change elements without a top electrode are desired, depositing the top metal layer 1366 can be omitted. Alternatively, when resistive change elements without a bottom electrode and a top electrode are desired, depositing the bottom metal layer 1362 and depositing the top metal layer 1366 can be omitted. Alternatively, the method for fabricating resistive change elements in a resistive change element array can include depositing at least one intervening layer, such as a barrier metal layer, prior to depositing the bottom metal layer 1362. Alternatively, the method for fabricating resistive change elements in a resistive change element array can include depositing at least one intervening layer, such as a barrier metal layer, after depositing the top metal layer 1366. Alternatively, the method for fabricating resistive change elements in a resistive change element array can include depositing at least one intervening layer, such as a barrier metal layer, prior to depositing the bottom metal layer 1362 and depositing at least one intervening layer, such as a barrier metal layer, after depositing the top metal layer 1366.

Depositing the layer of photoresist material on the top metal layer 1366, patterning the layer of photoresist material, and etching the layer of photoresist material are carried out using standard semiconductor fabrication techniques. Additionally, for embodiments where defects are introduced in the nanotube fabric layer 1364 post nanotube deposition, depositing the layer of photoresist material can be carried out before or after the defects are introduced in the nanotube fabric layer 1364. For example, when defects are introduced in the nanotube fabric layer 1364 post nanotube deposition by ion implantation, defects can be introduced in the nanotube fabric layer 1364 before or after depositing the layer of photoresist material by adjusting implant parameters, such as ion energy. Etching the top metal layer 1366, the nanotube fabric layer 1364, and the bottom metal layer 1362 can be carried out using standard semiconductor anisotropic etch techniques such as an anisotropic plasma etch or a reactive ion etch (RIE). The anisotropic plasma etch incorporates plasma chemistry that etches the top metal layer 1366 followed by chemistry that etches the nanotube fabric layer 1364 and lastly chemistry that etches the bottom metal layer 1362 resulting in layers that have very little undercut and uniform sides. Example chemistries which depend on the metal or metals used for the bottom metal layer and the top metal layer include, but are not limited to, Chlorine (Cl) or Bromine (Br) based such as, but not limited to, $Cl_2$/He, HCl/He, $Cl_2$/Ar, HBr/Ar, or $BCl_3$/$Cl_2$ for example. In addition to the chemistry component of the etch and depending on the etch technique employed there can be a significant physical etch component to the etch process, i.e., the ions created in the plasma can be accelerated under a DC bias that adds a physical etch component and provides a more anisotropic etch such as, but not limited to, a reactive ion etch (RIE).

Although an oxygen based chemistry such as $O_2$ or $O_2$/Ar, for example, can be used to etch the nanotube fabric layer 1364, etching the top metal layer 1366 with the addition of $O_2$ and with the physical etch component is sufficient to etch the nanotube fabric layer 1364 allowing etching the top metal layer 1366, the nanotube fabric layer 1364, and the bottom metal layer 1362 to be performed in the same reactor. In addition, using the metal etch oxygen chemistry any residual metal that penetrates the top region of the nanotube fabric layer 1364 will continue being cleared during etching the nanotube fabric layer 1364.

Figure 13E:
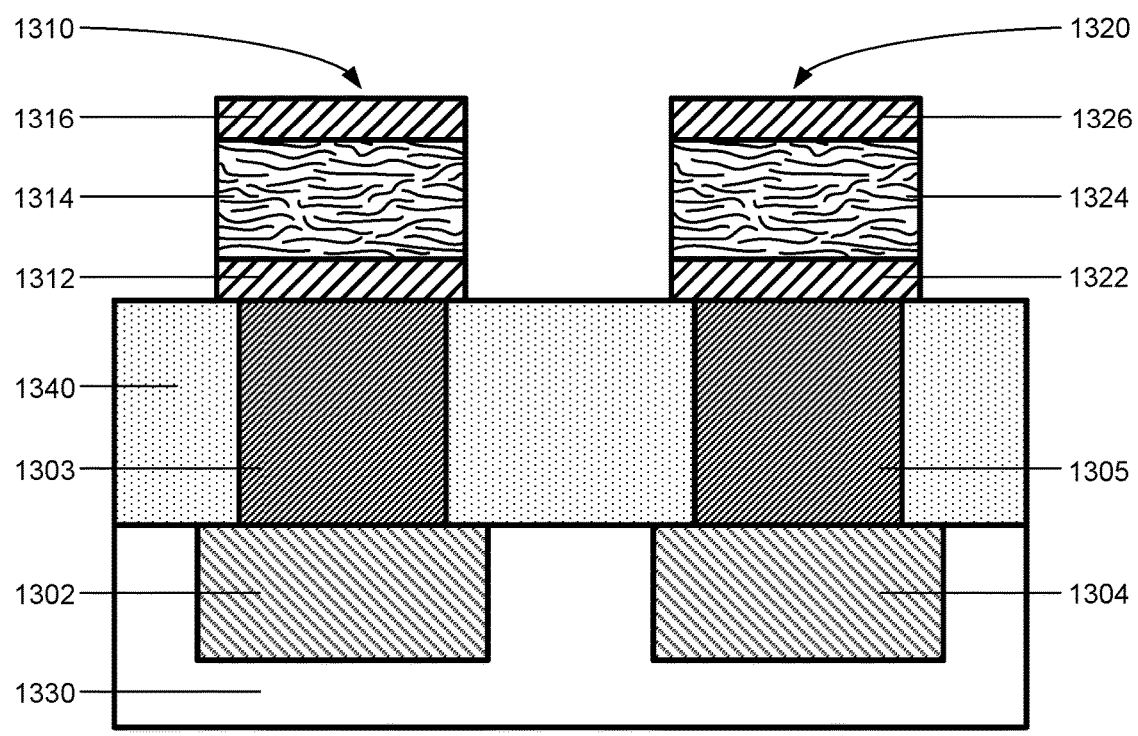
FIG. 13E illustrates a cross-sectional view of resistive change elements formed on bottom plugs formed on an initial structure for fabricating resistive change elements.

Following the nanotube fabric layer etch, the bottom metal layer 1362 is etched by converting the reactor back to the proper chemistry and reactor configuration (power, temperature, etc) to anisotropically etch the bottom metal layer 1362 depending on its composition which may be a different composition than the top metal layer 1366. As discussed above, the bottom metal layer 1362 can be a single metal layer such as, Al, TiN, TaN, W, Ru, RuN, RuO or other metal for example as disclosed in Bertin, et.al., U.S. Patent Application Publication No. 2008/0160734, or a multilayer metal such as, TiN/W, TiN/TaN, Ru/TiN, Ru/Cu/TaN, TiN/W/TaN, or other combination of metals depending on the device, circuit, and backend of the line (BEOL) process requirements. The bottom metal layer etch removes the bottom metal layer 1362 to the dielectric layer 1340 as illustrated in FIG. 13D. FIG. 13D illustrates the resistive change element 1310 formed on the first bottom plug 1303 and the resistive change element 1320 formed on the second bottom plug 1305 prior to removal of the patterned and etched layer of photoresist material 1368. The patterned and etched layer of photoresist material 1368 is removed using either a plasma ashing process such as $O_2$ or $O_2$/Ar, a wet chemical photoresist removal process, or other standard photoresist removal chemistry. In either case of wet or dry plasma photoresist removal, care must be taken not to damage or etch the nanotube fabric layer that is exposed during the photoresist removal process. FIG. 13E illustrates the resistive change element 1310 formed on the first bottom plug 1303 and the resistive change element 1320 formed on the second bottom plug 1305 after removal of the layer of photoresist material 1368.

Each resistive change element 1310, 1320 includes a bottom electrode 1312, 1322, a nanotube fabric layer 1314, 1324, and top electrode 1316, 1326. The nanotube fabric layers 1314, 1324, can be formed with nanotubes that are relatively defect free, such as discussed above with respect to FIGS. 2A-2F, nanotubes having defects introduced post nanotube deposition, such as discussed above with respect to FIGS. 3A-3E, nanotubes having intrinsic nanotube defects introduced prior to nanotube deposition, such as discussed above with respect to FIGS. 4A-4E, and nanotubes having intrinsic nanotube defects introduced prior to nanotube deposition and additional defects introduced post nanotube deposition. The bottom electrode 1312 is in contact with the nanotube fabric layer 1314 and the top electrode 1316 is in contact with the nanotube fabric layer 1314. The bottom electrode 1322 is in contact with the nanotube fabric layer 1324 and the top electrode 1326 is in contact with the nanotube fabric layer 1324. Additionally, the resistive change elements 1310, 1320 can have a square horizontal cross-sectional shape, or a non-square horizontal cross-sectional shape, such as a rectangular horizontal cross-sectional shape, a circular horizontal cross-sectional shape, an oval horizontal cross-sectional shape, a triangular horizontal cross-sectional shape, a trapezoidal horizontal cross-sectional shape, an irregular horizontal cross-sectional shape, and a non-uniform horizontal cross-sectional shape where different sections of each resistive change element 1310, 1320 can have different dimensions.

The method for fabricating resistive change elements in a resistive change element array proceeds, as similarly discussed above in step 1206, by sealing the nanotube fabric layers 1314, 1324 of the resistive change elements 1310, 1320. Alternatively, the method for fabricating resistive change elements in a resistive change element array includes sealing the nanotube fabric layers 1314, 1324 of the resistive change elements 1310, 1320, as similarly discussed above in step 1206, during forming resistive change element 1310 on the first bottom plug 1303 and resistive change element 1320 on the second bottom plug 1305, as similarly discussed above in step 1204. Alternatively, the method for fabricating resistive change elements in a resistive change element array includes starting sealing the nanotube fabric layers 1314, 1324 of the resistive change elements 1310, 1320, as similarly discussed above in step 1206, during forming resistive change element 1310 on the first bottom plug 1303 and resistive change element 1320 on the second bottom plug 1305, as similarly discussed above in step 1204, and concluding sealing the nanotube fabric layers 1314, 1324 after forming resistive change element 1310 on the first bottom plug 1303 and resistive change element 1320 on the second bottom plug 1305 concludes.

Sealing the nanotube fabric layers 1314, 1324 of the resistive change elements 1310, 1320 after forming resistive change element 1310 on the first bottom plug 1303 and resistive change element 1320 on the second bottom plug 1305 using the method for sealing a resistive change material layer of a resistive change element formed above a dielectric discussed above with respect to FIG. 8 is discussed below with respect to the structures shown in FIGS. 13F-13H. Sealing the nanotube fabric layers 1314, 1324 of the resistive change elements 1310, 1320 after forming resistive change element 1310 on the first bottom plug 1303 and resistive change element 1320 on the second bottom plug 1305 using the method for sealing a resistive change material layer of a resistive change element discussed above with respect to FIG. 9 is discussed below with respect to the structures shown in FIGS. 13I-13M. Sealing the nanotube fabric layers 1314, 1324 of the resistive change elements 1310, 1320 during forming resistive change element 1310 on the first bottom plug 1303 and resistive change element 1320 on the second bottom plug 1305 using the method for sealing a resistive change material layer of a resistive change element discussed above with respect to FIG. 10 is discussed below with respect to the structures shown in FIGS. 13N-13O. Starting sealing the nanotube fabric layers 1314, 1324 of the resistive change elements 1310, 1320 during forming resistive change element 1310 on the first bottom plug 1303 and resistive change element 1320 on the second bottom plug 1305 and concluding sealing the nanotube fabric layers 1314, 1324 after forming resistive change element 1310 on the first bottom plug 1303 and resistive change element 1320 on the second bottom plug 1305 concludes using the method for sealing with a multi-film thin dielectric sidewall discussed above with respect to FIG. 11 is discussed below with respect to the structures shown in FIG. 13P.

It is noted the method for sealing a resistive change material layer of a resistive change element with a thin dielectric sidewall discussed above with respect to FIG. 10 is not limited to being performed during forming at least one resistive change element above the at least one bottom plug, where each resistive change element includes a resistive change material layer. For example, the method for sealing a resistive change material layer of a resistive change element with a thin dielectric sidewall discussed above with respect to FIG. 10 can be performed after forming at least one resistive change element above the at least one bottom plug, where each resistive change element includes a resistive change material layer. It is also noted the method for sealing with a multi-film thin dielectric sidewall a resistive change material layer of a resistive change element discussed above with respect to FIG. 11 is not limited to starting during, and concluding after, forming at least one resistive change element above the at least one bottom plug, where each resistive change element includes a resistive change material layer. For example, the method for sealing with a multi-film thin dielectric sidewall a resistive change material layer of a resistive change element can be performed after forming at least one resistive change element above the at least one bottom plug, where each resistive change element includes a resistive change material layer.

Figure 13F:
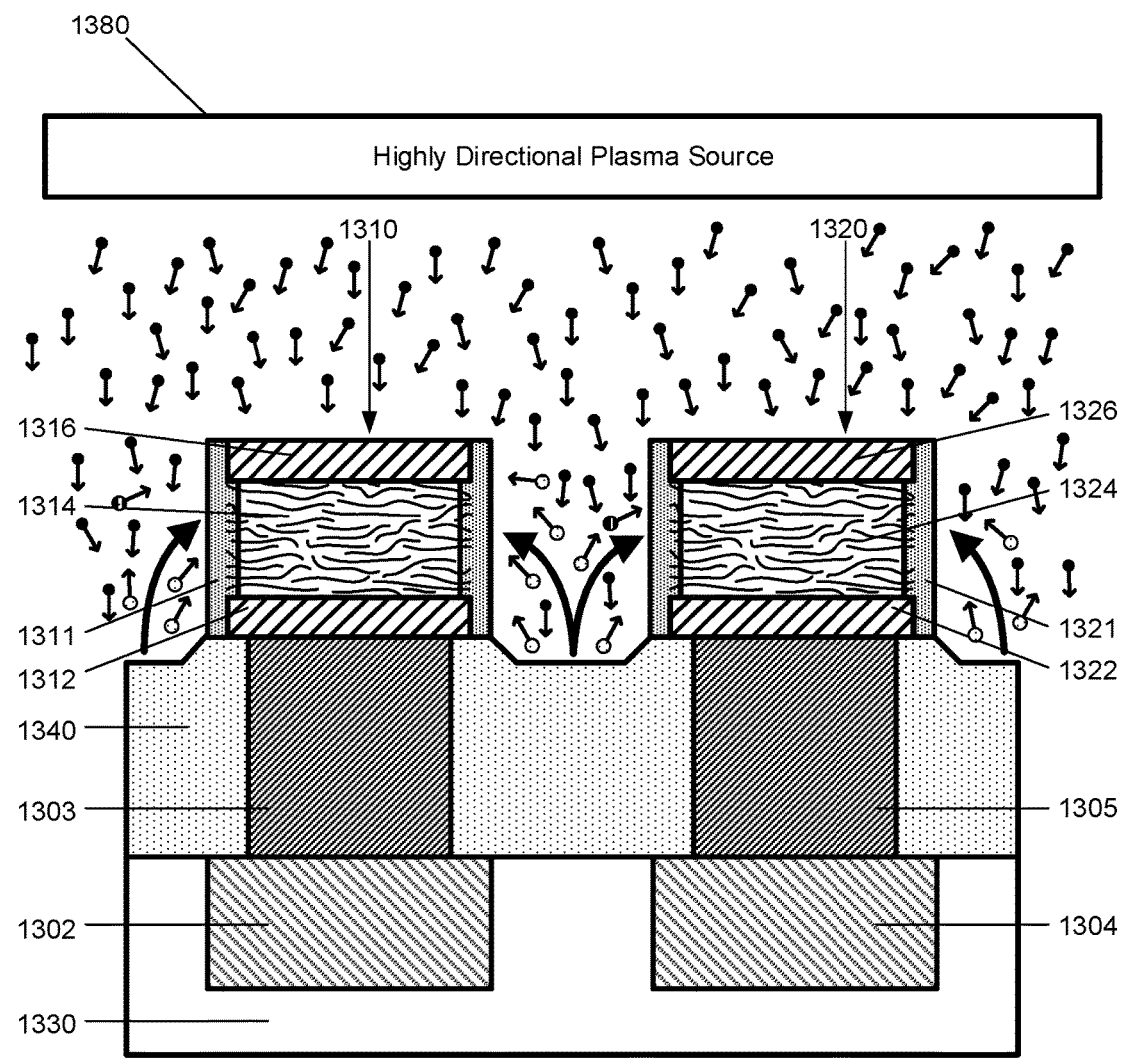
FIG. 13F illustrates backsputtering particles of a dielectric to form thin dielectric sidewall films on vertical sides of nanotubes fabric layers of resistive change elements formed on bottom plugs formed on an initial structure for fabricating resistive change elements.

Referring now to FIG. 13F, backsputtering particles of the dielectric 1340 to form thin dielectric sidewall films 1311, 1321 on the vertical sides of the nanotube fabric layers 1314, 1324 of the resistive change elements 1310, 1320 is illustrated. The particles of the dielectric 1340 are backsputtered using a highly directional plasma source 1380 to form thin dielectric sidewall films 1311, 1321 on vertical sides of nanotube fabric layers 1314, 1324 with minimal penetration into the vertical sides of the nanotube fabric layers 1314, 1324. The dielectric 1340 is formed from a dielectric material having a dielectric constant sufficient to isolate the first bottom plug 1303 from the second bottom plug 1305. The dielectric material is not required to have a dielectric constant sufficient for the thin dielectric sidewall films 1311, 1321 to isolate the resistive change elements 1310, 1320 because the regions around the resistive change elements 1310, 1320 are subsequently filled with a dielectric 1350 having a low dielectric constant, such as a flowable dielectric having a low dielectric constant, that isolates the resistive change elements 1310, 1320. Thus, other characteristics of the dielectric material can be selected for backsputtering to form thin dielectric sidewall films 1311, 1321 with minimal penetration into the nanotube fabric layers 1314, 1324 and with a minimal amount of dielectric material rather than isolating resistive change elements 1310, 1320. For example, the dielectric 1340 can be formed from a dielectric material having a large molecule size to reduce penetration into the nanotube fabric layers 1314, 1324.

As illustrated in FIG. 13F, ions are formed and accelerated via a DC bias toward the structure surface with a primarily vertical velocity component. The accelerated ions impinge on the structure surface with sufficient energy to dislodge surface atoms or molecules of the exposed portions of the dielectric 1340. Although the accelerated ions also impinge the top electrodes 1316, 1326, the sputter yield of the top electrodes 1316, 1326 will be significantly less than the sputter yield of the dielectric 1340. The sputtered dielectric material is dislodged in random directions from the structure surface with most of the sputtered material forming thin dielectric sidewall films 1311, 1321 on the vertical sides of the resistive change elements 1310, 1320. The sputtering process is continued until the desired dielectric film thickness is obtained that will seal the vertical sides of the nanotube fabric layers 1314, 1324 with minimum penetration due to the angles that the dielectric material impinges the vertical sides of the nanotube fabric layers 1314, 1324. Examples of ions used in the sputtering process are, but not limited to, $Ar^+$, $Ne^+$, $Xe^+$, $N^+$, or $N_2^+$ which are typically inert in this process. The thin dielectric sidewall films 1311, 1321 can ring shapes based on the horizontal cross-sectional shapes of the top electrodes 1316, 1326 the nanotube fabric layers 1314, 1324, the bottom electrodes 1312, 1322.

FIG. 13F shows backsputtering particles of the dielectric 1340 to form thin dielectric sidewall films 1311, 1321 on the vertical sides of nanotube fabric layers 1314, 1324 after the remaining photoresist material has been removed. Alternatively, backsputtering particles of the dielectric 1340 to form thin dielectric sidewall films 1311, 1321 on the vertical sides of the nanotube fabric layers 1314, 1324 can be performed before removing the remaining photoresist material by adding a small amount oxygen, $O_2$, to the plasma sputtering process, the ionized $O^+$ will volatize any carbon sputtered from the photoresist masking layer. An example process configuration, but not limited to, is an RIE anisotropic plasma process utilizing an $Ar/O_2$ gas mixture to generate the plasma.

The method for fabricating resistive change elements in a resistive change element array continues, as similarly discussed above in step 1208, by filling the remaining gaps around the resistive change elements 1310, 1320 with a dielectric 1350 having a low dielectric constant, such as a flowable dielectric having a low dielectric constant. The dielectric 1350 does not penetrate into the nanotube fabric layers 1314, 1324 because the nanotube fabric layers 1314, 1324 are sealed by thin dielectric sidewall films 1311, 1321. Thus, the combination of the resistive change element 1310 and the thin dielectric sidewall film 1311 can be considered a sealed resistive change element and the combination of the resistive change element 1320 and the thin dielectric sidewall film 1321 can be considered a sealed resistive change element. Additionally, the thin dielectric sidewall films 1311, 1321 can prevent contaminants, such as water and metallic contaminants, from penetrating into the nanotube fabric layers 1314, 1324 and can prevent parasitic conductive paths between the top electrodes 1316, 1326 and the bottom electrodes 1312, 1322. FIG. 13G shows the dielectric 1350 filling the remaining gaps around the resistive change elements 1310, 1320. The dielectric 1350 isolates the resistive change elements 1310, 1320.

Figure 13G:
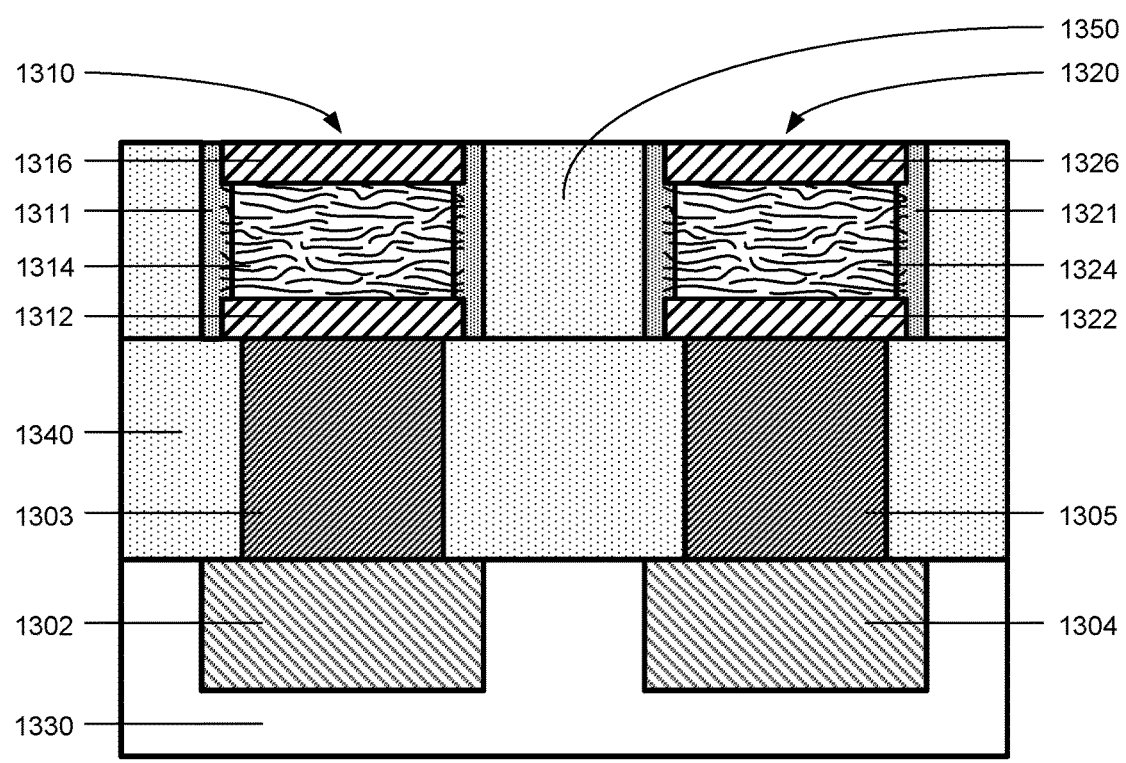
FIG. 13G illustrates a cross-sectional view of resistive change elements formed on bottom plugs formed on an initial structure for fabricating resistive change elements, where thin dielectric sidewall films on vertical sides of nanotubes fabric layers of resistive change elements were formed by backsputtering and a dielectric fills the remaining gaps around the resistive change elements.
Figure 13H:
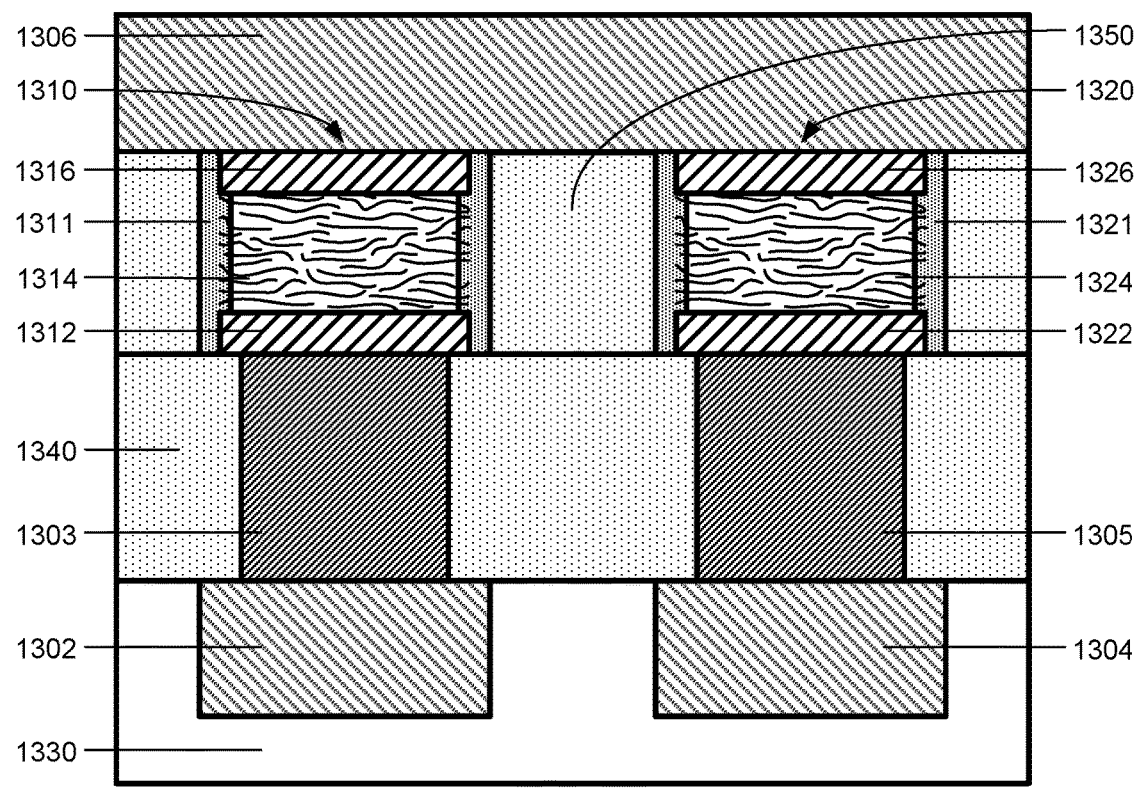
FIG. 13H illustrates a cross-sectional view of resistive change elements from a resistive change element array, where thin dielectric sidewall films on vertical sides of nanotubes fabric layers of resistive change elements were formed by backsputtering.

The method for fabricating resistive change elements in a resistive change element array proceeds, as similarly discussed above in step 1210, by forming a top interconnect conductor 1306 on the structure shown in FIG. 13G. The top surface of the structure shown in FIG. 13G is planarized using standard planarizing techniques such as chemical mechanical polishing (CMP) or plasma etch back leaving the top electrodes 1316, 1326 exposed through the dielectric 1350. The top interconnect conductor 1306 is formed on the structure shown in FIG. 13G by depositing a metal layer, patterning the metal layer, and etching the metal layer. Depositing the metal layer, patterning the metal layer, and etching the metal layer, can be carried out using standard semiconductor fabrication processes. FIG. 13H illustrates the resistive change elements 1310, 1320 following forming the top interconnect conductor 1306. Alternatively, the method for fabricating resistive change elements in a resistive change element array can include forming a first top plug above the top electrode 1316 and a second top plug above the top electrode 1326 before forming the top interconnect conductor 1306. The first top plug and the second top plug can be formed in a similar manner to the first bottom plug 1303 and the second bottom plug 1305. Alternatively, the method for fabricating resistive change elements in a resistive change element array can include depositing at least one intervening layer, such as a barrier metal layer, after forming the first top plug and the second top plug.

Figure 13I:
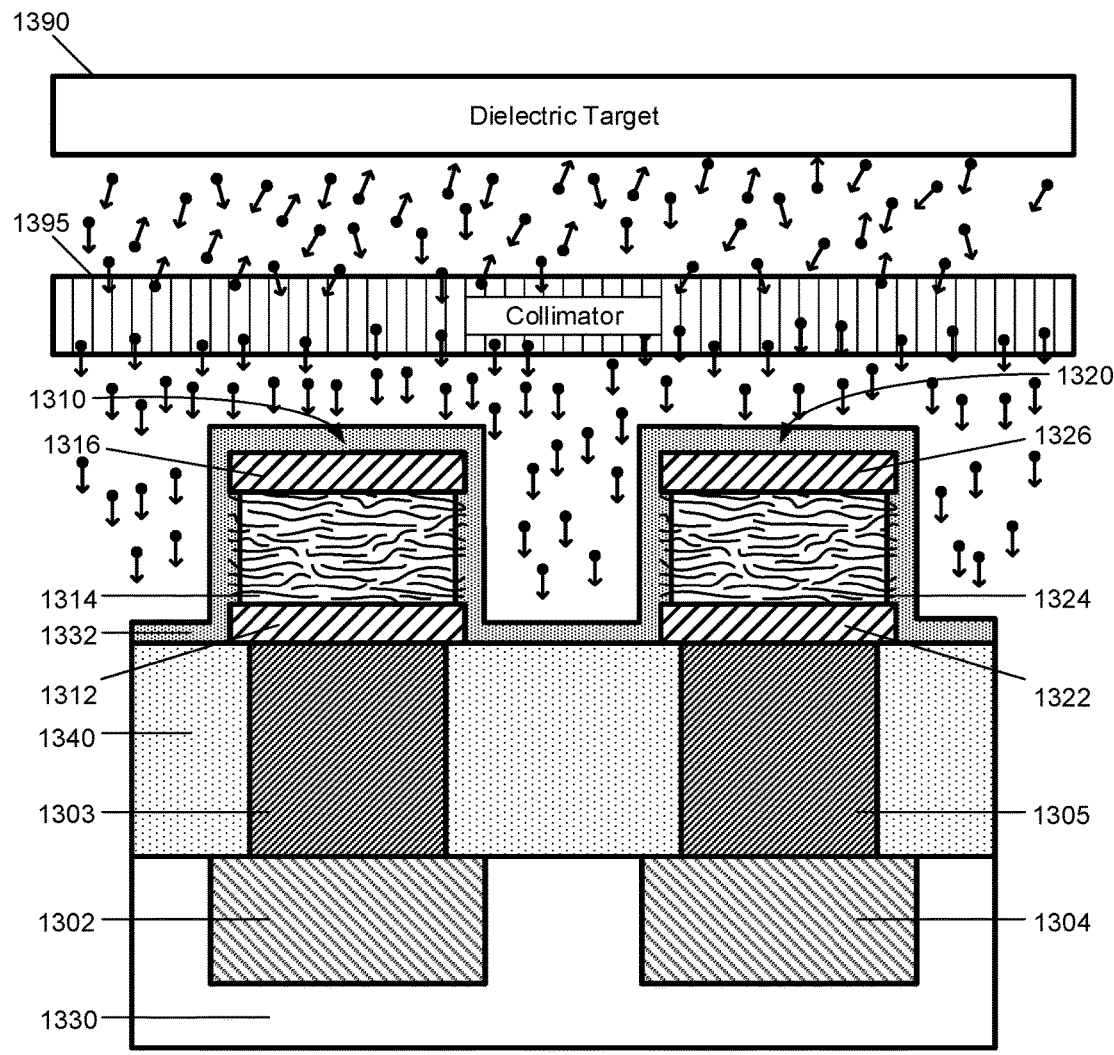
FIG. 13I illustrates sputtering particles through a collimator to form a thin dielectric sidewall film on vertical sides of nanotubes fabric layers of resistive change elements formed on bottom plugs formed on an initial structure for fabricating resistive change elements.
Figure 13J:
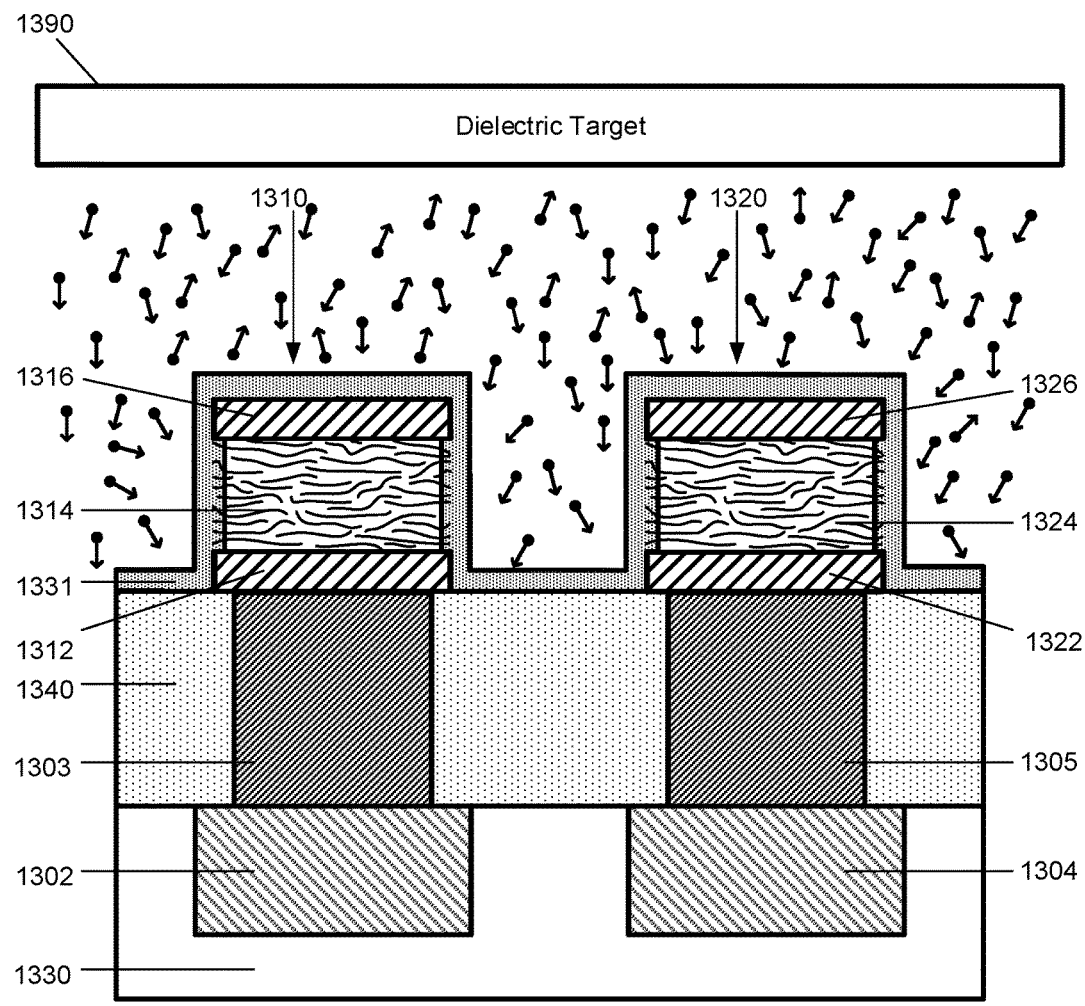
FIG. 13J illustrates sputtering particles from a non-collimated source to form to a dielectric sidewall film on vertical sides of nanotubes fabric layers of resistive change elements formed on bottom plugs formed on an initial structure for fabricating resistive change elements.

Referring now to FIG. 13I, sputtering particles of a dielectric 1390 located above the resistive change elements 1310, 1320 through a collimator 1395 to form a thin dielectric sidewall film 1332 on vertical sides of the nanotube fabric layers 1314, 1324 of the resistive change elements 1310, 1320 is illustrated. FIG. 13J shows a dielectric sidewall film 1331 deposited onto the vertical sides of the resistive change elements 1310, 1320 from a non-collimated source by sputtering the dielectric sidewall material from a dielectric 1390 located above the resistive change elements 1310, 1320 using standard semiconductor fabrication equipment. As illustrated in FIG. 13J, the dielectric sidewall film 1331 will coat all exposed surfaces, however, since the sputtered dielectric particles from the dielectric 1390 enter the space between the resistive change elements 1310, 1320 at various angles unless sputtered from a collimated source, the propensity for forming a lip at the entrance to space between memory cells will be enhanced causing thickness variations of the dielectric sidewall film from the top to the bottom of the resistive change elements 1310, 1320. The collimator 1395 is inserted between the dielectric 1390 and the structure surface, as illustrated in FIG. 13I, to improve the thickness uniformity of the sidewall deposition and as the particles pass through the collimator, the particles exit the collimator with primarily a vertical velocity component as illustrated in FIG. 13I. With the particles having primarily a vertical (i.e., parallel to the sides of the resistive change elements) velocity component, the penetration into the nanotube fabric layers 1314, 1324 will be limited as the thin dielectric sidewall film 1332 is formed. Alternatively, magnetic fields are used adjust the velocity of the particles such that the particles have primarily a vertical velocity component so the penetration into the nanotube fabric layers 1314, 1324 will be limited as the thin dielectric sidewall film 1332 is formed. The dielectric 1390 can be formed from a dielectric material selected for sputtering to form thin dielectric sidewall film 1332 with minimal penetration into the nanotube fabric layers 1314, 1324 and with a minimal amount of dielectric material. The dielectric material is not required to have a dielectric constant sufficient for the thin dielectric sidewall film 1332 to isolate the resistive change elements 1310, 1320 because the regions around the resistive change elements 1310, 1320 are subsequently filled with a dielectric 1350 having a low dielectric constant, such as a flowable dielectric having a low dielectric constant, that isolates the resistive change elements 1310, 1320. For example, the dielectric 1390 can be formed from an dielectric material having a large molecule size to reduce penetration into the nanotube fabric layers 1314, 1324.

Figure 13K:
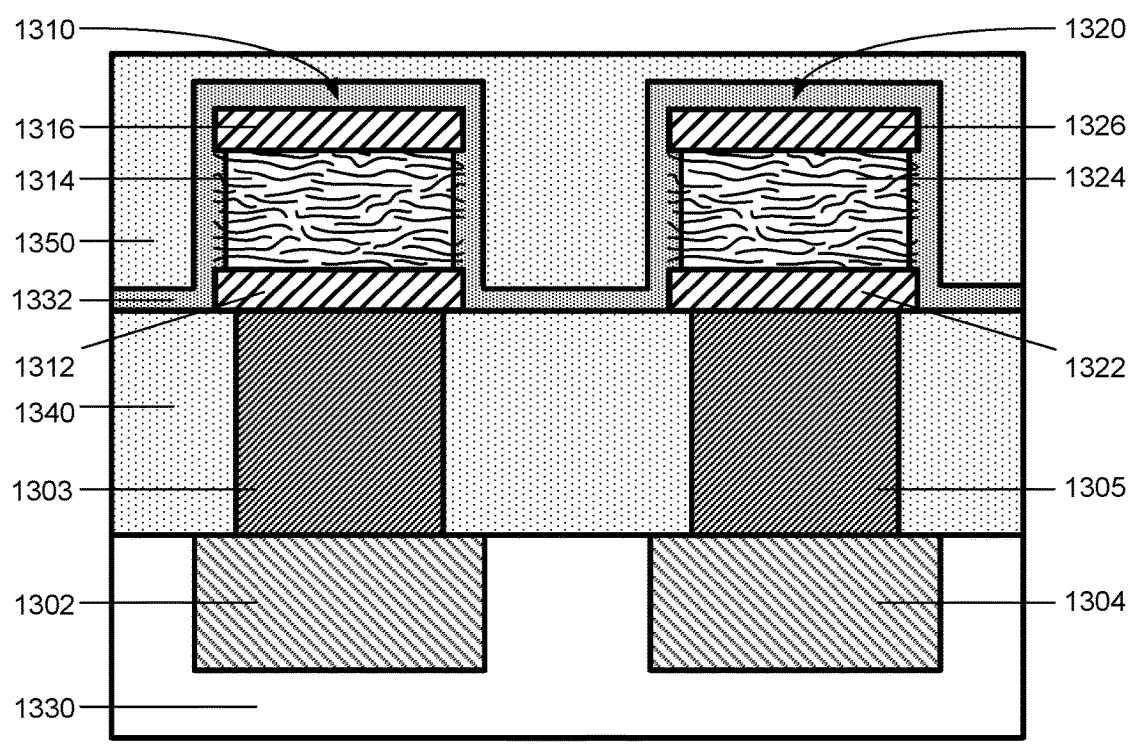
FIG. 13K illustrates a cross-sectional view of resistive change elements formed on bottom plugs formed on an initial structure for fabricating resistive change elements, where a thin dielectric sidewall film on vertical sides of nanotubes fabric layers of resistive change elements was formed by sputtering and a dielectric fills the remaining gaps around the resistive change elements.

The method for fabricating resistive change elements in a resistive change element array continues, as similarly discussed above in step 1208, by filling the remaining gaps around the resistive change elements 1310, 1320 with a dielectric 1350 having a low dielectric constant, such as a flowable dielectric having a low dielectric constant. The dielectric 1350 does not penetrate into the nanotube fabric layers 1314, 1324 because the nanotube fabric layers 1314, 1324 are sealed by thin dielectric sidewall film 1332. Thus, the combination of the resistive change element 1310 and the portion of the thin dielectric sidewall film 1332 formed around the resistive change element 1310 can be considered a sealed resistive change element and the combination of the resistive change element 1320 and the portion of the thin dielectric sidewall film 1332 formed around the resistive change element 1320 can be considered a sealed resistive change element. Additionally, the thin dielectric sidewall film 1332 can prevent contaminants, such as water and metallic contaminants, from penetrating into the nanotube fabric layers 1314, 1324 and can prevent parasitic conductive paths between the top electrodes 1316, 1326 and the bottom electrodes 1312, 1322. FIG. 13K shows the dielectric 1350 filling the remaining gaps around the resistive change elements 1310, 1320. The dielectric 1350 isolates the resistive change elements 1310, 1320.

Figure 13L:
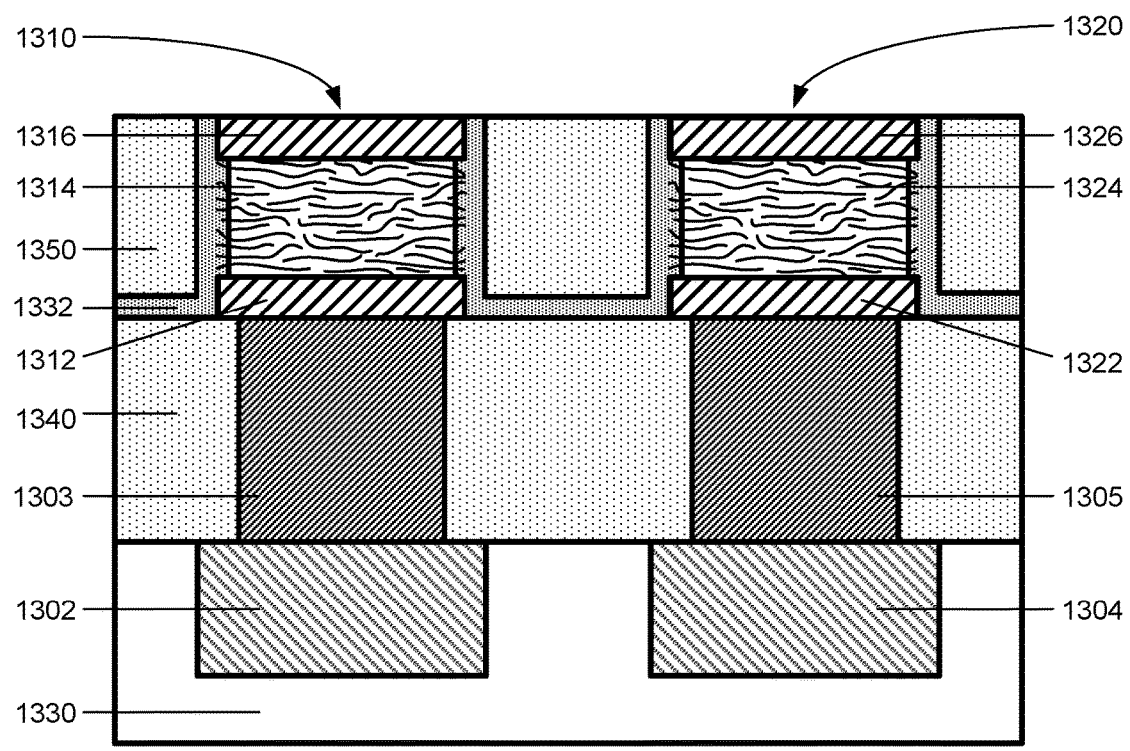
FIG. 13L illustrates a cross-sectional view of resistive change elements formed on bottom plugs formed on an initial structure for fabricating resistive change elements, where a thin dielectric sidewall film on vertical sides of nanotubes fabric layers of resistive change elements was formed by sputtering, a dielectric fills the remaining gaps around the resistive change elements, and top electrodes of the resistive change elements are exposed through the dielectric.
Figure 13M:
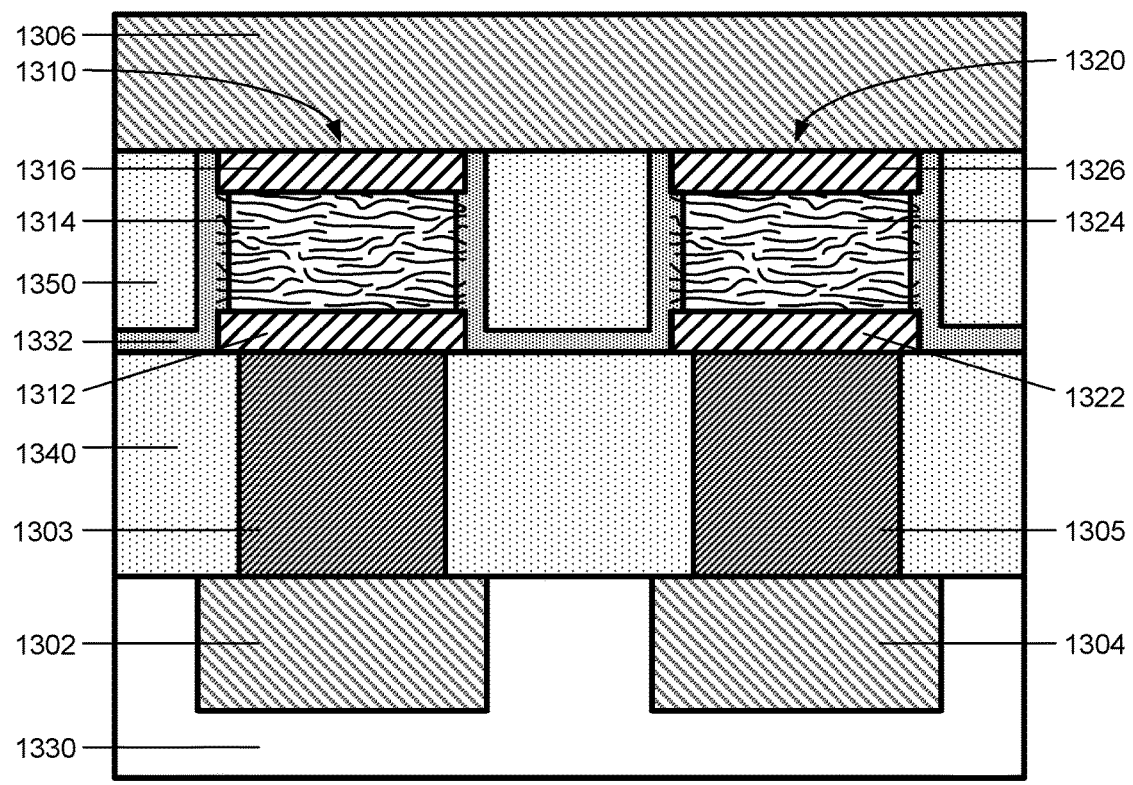
FIG. 13M illustrates a cross-sectional view of resistive change elements from a resistive change element array, where a thin dielectric sidewall film on vertical sides of nanotubes fabric layers of resistive change elements was formed by sputtering.

The method for fabricating resistive change elements in a resistive change element array proceeds, as similarly discussed above in step 1210, by forming a top interconnect conductor 1306 on the structure shown in FIG. 13L. The top surface of the structure shown in FIG. 13K is planarized using standard planarizing techniques such as chemical mechanical polishing (CMP) or plasma etch back leaving the top electrodes 1316, 1326 exposed through the dielectric 1350 as shown in FIG. 13L. The top interconnect conductor 1306 is formed on the structure shown in FIG. 13L by depositing a metal layer, patterning the metal layer, and etching the metal layer. Depositing the metal layer, patterning the metal layer, and etching the metal layer, can be carried out using standard semiconductor fabrication processes. FIG. 13M illustrates the resistive change elements 1310, 1320 following forming the top interconnect conductor 1306. Alternatively, the method for fabricating resistive change elements in a resistive change element array can include forming a first top plug above the top electrode 1316 and a second top plug above the top electrode 1326 before forming the top interconnect conductor 1306. The first top plug and the second top plug can be formed in a similar manner to the first bottom plug 1303 and the second bottom plug 1305. Alternatively, the method for fabricating resistive change elements in a resistive change element array can include depositing at least one intervening layer, such as a barrier metal layer, after forming the first top plug and the second top plug.

Figure 13N:
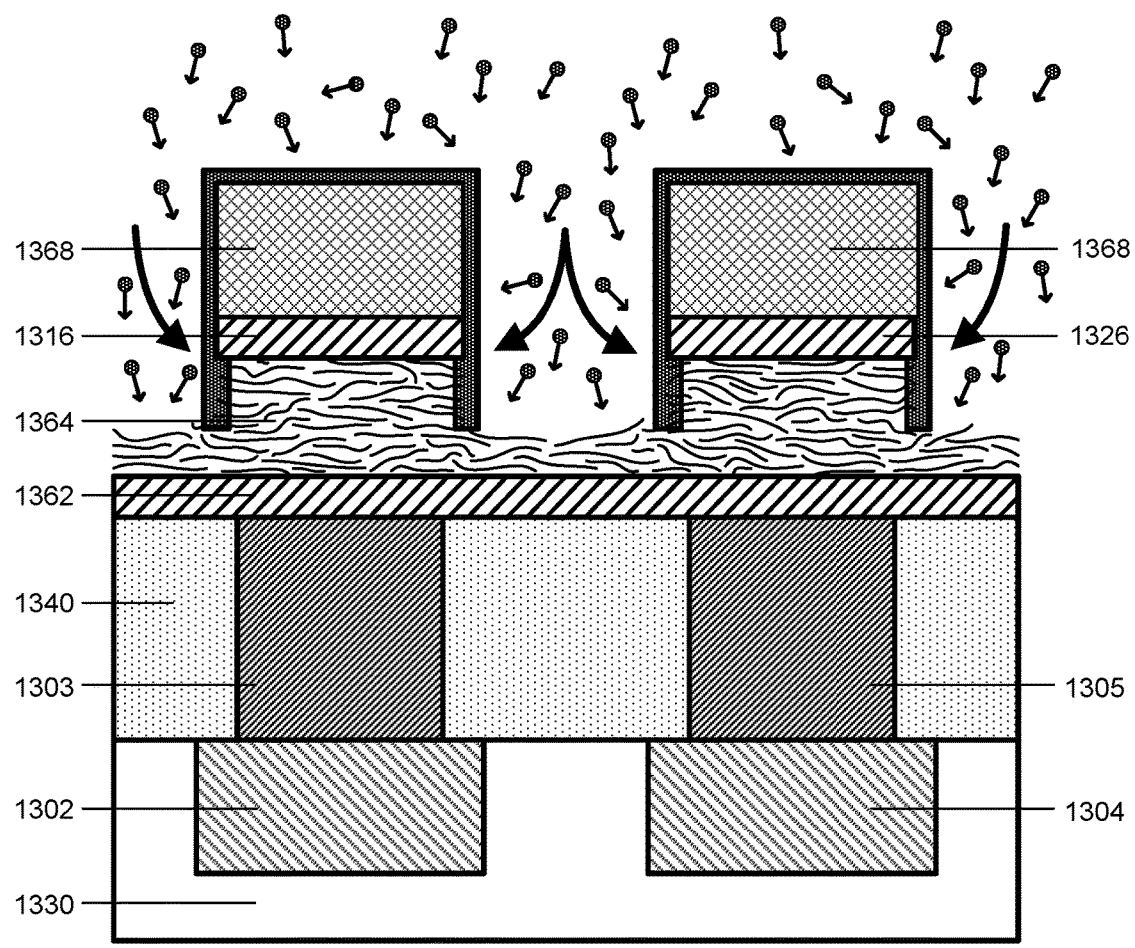
FIG. 13N illustrates depositing from a reaction of at least one material that reacts with a reactant gas and at least one reactant gas at least one dielectric material to form thin dielectric sidewall films on vertical sides of nanotube fabric layers of resistive change elements formed on bottom plugs formed on an initial structure for fabricating resistive change elements.

Referring now to FIG. 13N, depositing from a reaction of at least one material that reacts with a reactant gas and at least one reactant gas at least one dielectric material to form thin dielectric sidewall films on vertical sides of nanotube fabric layers of resistive change elements as the nanotube fabric layers are formed by etching of the nanotube fabric layer 1364 is illustrated. The at least one material that reacts with a reactant gas and the at least one reactant gas are introduced prior to the depositing shown in FIG. 13N. Etching the nanotube fabric layer 1364 introduces at least one material that reacts with a reactant gas into the reactor. For example, an ionized oxygen based etch of a nanotube fabric layer volatizes carbon of the nanotube fabric layer to form CO and $CO_2$, and thus, the ionized oxygen based etch of a nanotube fabric layer provides molecular carbon, such as CO, $CO_2$, and excess oxygen that is not consumed by etching the nanotube fabric layer into a reactor. Additional materials that react with a reactant gas also can be flowed into the reactor during etching of the nanotube fabric layer 1364. For example, nitrogen gas can be flowed into the reactor during etching of the nanotube fabric layer 1364. A reactant gas is introduced into the reactor during etching of the nanotube fabric layer by flowing the reactant gas into the reactor. In the above example, where the nanotube fabric layer 1364 is etched with an oxygen based chemistry, $SiH_4$ is flowed into the reactor and the amount of $SiH_4$ and/or the amount oxygen can be adjusted so that oxygen for etching the nanotube fabric layer 1364 is not depleted. The at least one material that reacts with a reactant gas reacts with the react gas to form at least one dielectric material and the at least one dielectric material is deposited to form thin dielectric sidewall films on vertical sides of nanotube fabric layers of resistive change elements as the nanotube fabric layers are formed during etching of the nanotube fabric layer 1364 as illustrated in FIG. 13N. In the above example, where the nanotube fabric layer 1364 is etched with an ionized oxygen based etch and $SiH_4$ is flowed into the reactor, molecular carbon, such as CO, $CO_2$, and oxygen react with SiH4 to form thin dielectric sidewall films from SiOx, SiC, and SiCO. In the above example, where nitrogen is also flowed into the reactor, molecular carbon, such as CO, $CO_2$, and oxygen, and nitrogen react with SiH4 to form thin dielectric sidewall films from SiOx, SiC, SiCO, SiON. It is noted that introducing nitrogen to form SiON can reduce sidewall penetration into nanotube fabric layers because SiON is a large molecule. It is also noted that sealing nanotube fabric layers of resistive change elements with thin dielectric sidewall films during etching of the nanotube fabric layer 1364 can reduce sidewall penetration into nanotube fabric layers of resistive change elements because the ions used in the etch have a primarily vertical velocity.

Alternatively, depositing from a reaction of at least one material that reacts with a reactant gas and at least one reactant gas at least one dielectric material to form thin dielectric sidewall films on vertical sides of nanotube fabric layers of resistive change elements can be performed after etching of the nanotube fabric layer 1364 to form the nanotube fabric layers 1314, 1324. The at least one material that reacts with a reactant gas and the at least one reactant gas are introduced prior to the depositing. The at least one material that reacts with a react gas can be introduced during etching the nanotube fabric layer 1364, such as by etching the nanotube fabric layer 1364, or after etching the nanotube fabric layer 1364, such as by flowing at least one material that reacts with a reactant gas into the reactor. Additional materials that react with a reactant gas also can be flowed into the reactor during etching of the nanotube fabric layer 1364 or after etching the nanotube fabric layer 1364. For example, nitrogen gas can be flowed into the reactor during etching of the nanotube fabric layer 1364 or after etching the nanotube fabric layer 1364. A reactant gas is introduced into the reactor after etching of the nanotube fabric layer 1364 by flowing the reactant gas into the reactor. For example, where an ionized oxygen based etch of the nanotube fabric layer 1364 provides molecular carbon, such as CO, $CO_2$, and excess oxygen that is not consumed by etching the nanotube fabric layer 1364 into a reactor, $SiH_4$ is flowed into the reactor after etching of the nanotube fabric layer 1364 to deplete the oxygen in the reactor from the etch. For example, oxygen is flowed into the reactor after etching the nanotube fabric layer 1364 and $SiH_4$ is flowed into the reactor after etching of the nanotube fabric layer 1364. The at least one material that reacts with a reactant gas reacts with the react gas to form at least one dielectric material and the at least one dielectric material is deposited to form thin dielectric sidewall films on vertical sides of nanotube fabric layers of resistive change elements. In the above example, where the nanotube fabric layer 1364 is etched with an ionized oxygen based etch and $SiH_4$ is flowed into the reactor, molecular carbon, such as CO, $CO_2$, and oxygen react with $SiH_4$ to form thin dielectric sidewall films from SiOx, SiC, and SiCO. In the above example, when nitrogen is also flowed into the reactor, molecular carbon, such as CO, $CO_2$, oxygen, and nitrogen react with SiH4 to form thin dielectric sidewall films from SiOx, SiC, SiCO, SiON. It is noted that introducing nitrogen to form SiON can reduce sidewall penetration into nanotube fabric layers because SiON is a large molecule.

Figure 13O:
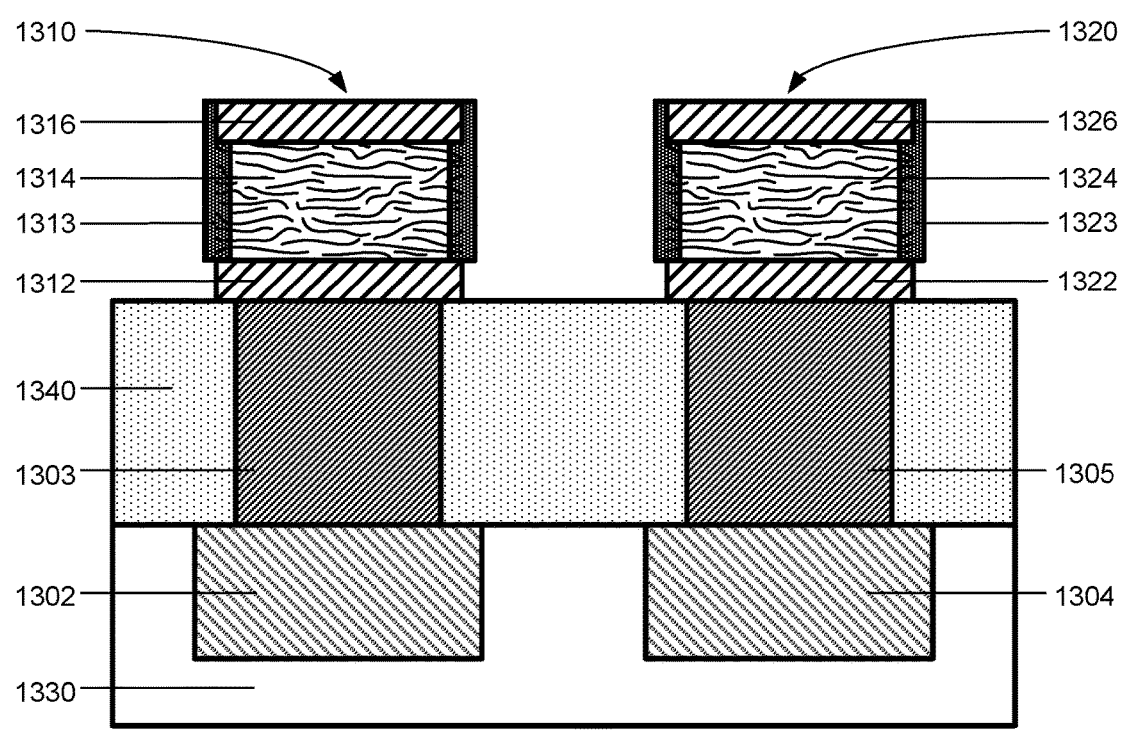
FIG. 13O illustrates a cross-sectional view of resistive change elements, where thin dielectric sidewall films on vertical sides of nanotube fabric layers of resistive change elements was formed by depositing from a reaction of at least one material that reacts with a reactant gas and at least one reactant gas at least one dielectric material.

Forming resistive change elements 1310, 1320 continues after sealing the nanotube fabric layers 1314, 1324 with the thin dielectric sidewall films 1313, 1323 with etching the bottom metal layer 1362 and removing the patterned and etched layer of photoresist material 1368. The thin dielectric sidewall films 1313, 1323 can have ring shapes based on the horizontal cross-sectional shapes of the top electrodes 1316, 1326, the nanotube fabric layers 1314, 1324, and the bottom electrodes 1312, 1322. The etch of the bottom metal layer and the removal of the photoresist are adjusted so that the etch of the bottom metal layer and the removal of the photoresist do not remove the thin dielectric sidewalls 1313, 1323. For example, when the bottom metal layer 1362 is etched with a Chlorine (Cl) or Bromine (Br) based chemistry, such as discussed above with respect to step 1204, the Chlorine (Cl) or Bromine (Br) based etch does not remove the thin dielectric sidewall films 1313, 1323. For example, when the patterned and etched layer of photoresist is removed with a wet chemistry, as discussed above with respect to step 1204, the wet chemistry is adjusted so that the thin dielectric sidewall films 1313, 1323 are not removed. The thin dielectric sidewall films 1313, 1323 are formed over the vertical surfaces of the top electrodes 1316, 1326 and the nanotube fabric layers 1314, 1324. It is noted that the thin dielectric sidewall films 1313, 1323 are not formed over the vertical sides of the bottom electrodes because the bottom metal layer 1362 is after etched the nanotube fabric layers 1314, 1324 are sealed with thin dielectric sidewall films 1313, 1323. FIG. 13O illustrates the resistive change elements 1310, 1320 after etching of the bottom metal layer and removing of the layer of photoresist material.

Filling the regions around the resistive change elements 1310, 1320 with a dielectric is performed as described above with respect to step 1208. The dielectric does not penetrate into the nanotube fabric layers 1314, 1324 because the nanotube fabric layers are sealed by the thin dielectric sidewall films 1313, 1323. Thus, the combination of the resistive change element 1310 and the thin dielectric sidewall film 1313 can be considered a sealed resistive change element and the combination of the resistive change element 1320 and the thin dielectric sidewall film 1323 can be considered a sealed resistive change element. Additionally, the thin dielectric sidewall films 1313, 1323 can prevent contaminants, such as water and metallic contaminants, from penetrating into the nanotube fabric layers 1314, 1324 and can prevent parasitic conductive paths between the top electrodes 1316, 1326 and the bottom electrodes 1312, 1322. Forming the top interconnect conductor above the resistive change elements 1310, 1320 is performed as described above with respect to step 1210.

Figure 13P:
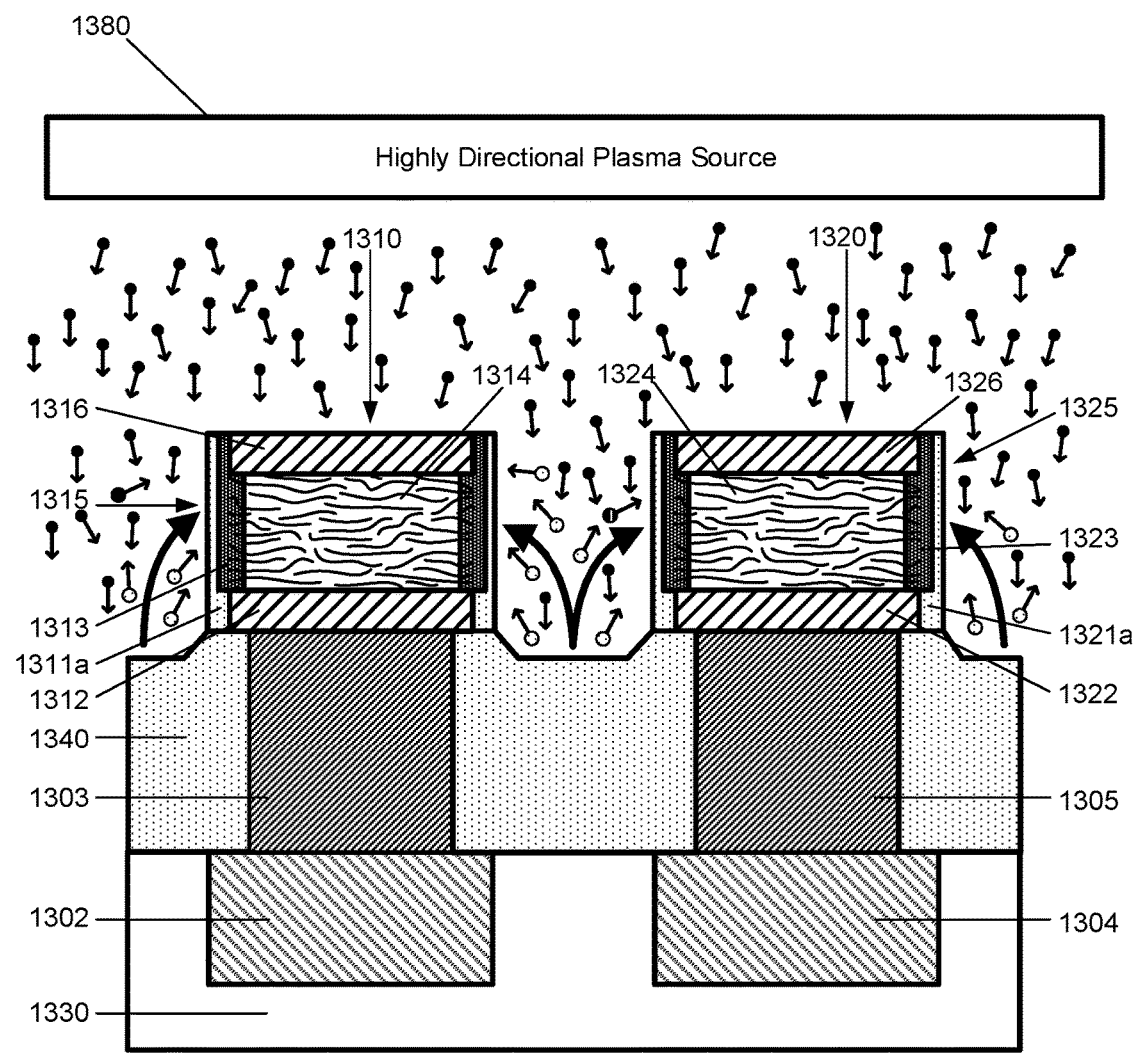
FIG. 13P illustrates backsputtering particles of a dielectric to form second thin dielectric sidewall films on vertical sides of nanotubes fabric layers of resistive change elements formed on bottom plugs formed on an initial structure for fabricating resistive change elements.

Referring now to FIG. 13P, forming multi-film thin dielectric sidewalls 1315, 1325 by backsputtering particles of the dielectric 1340 to form second thin dielectric sidewall films 1311a, 1321a over the nanotube fabric layers 1314, 1324 is illustrated. The multi-film thin dielectric sidewalls 1315, 1325 can have ring shapes based on the horizontal cross-sectional shapes of the top electrodes 1316, 1326, the nanotube fabric layers 1314, 1324, and the bottom electrodes 1312, 1322. The first thin dielectric sidewall films 1313, 1323 are formed over the nanotube fabric layers 1314, 1324 of the resistive change elements 1310, 1320 by introducing at least one material that reacts with a reactant gas, introducing at least one reactant gas, and depositing from a reaction of at least one material that reacts with a reactant gas and at least one reactant gas at least one dielectric material to form thin dielectric sidewall films on vertical sides of nanotube fabric layers of resistive change elements, as described above with respect to FIGS. 13N-13O. The first thin dielectric sidewall films 1313, 1323 can have ring shapes based on the horizontal cross-sectional shapes of the top electrodes 1316, 1326, the nanotube fabric layers 1314, 1324, and the bottom electrodes 1312, 1322. Alternatively, the first thin dielectric sidewall films can be formed over the nanotube fabric layers 1314, 1324 by backsputtering particles of the dielectric 1340 as described above with respect to FIGS. 13F or by sputtering particles with primarily a vertical velocity from a dielectric located above the resistive change elements 1310, 1320, as described above with respect to FIG. 13I. The second thin dielectric sidewall films 1311a, 1321a are formed over the nanotube fabric layers 1314, 1324 by backsputtering particles of the dielectric 1340 to form thin dielectric sidewall films on the vertical sides of the nanotube fabric layers 1314, 1324 of the resistive change elements, as described above with respect to FIG. 13F. The second thin dielectric sidewall films 1311a, 1321a can have ring shapes based on the horizontal cross-sectional shapes of the top electrodes 1316, 1326, the nanotube fabric layers 1314, 1324, and the bottom electrodes 1312, 1322. Alternatively, the second thin dielectric sidewall films can be formed over the nanotube fabric layers 1314, 1324 by introducing at least one material that reacts with a reactant gas, introducing at least one reactant gas, and depositing from a reaction of at least one material that reacts with a reactant gas and at least one reactant gas at least one dielectric material to form thin dielectric sidewall films, as described above with respect to FIGS. 13N-13O, by sputtering particles with primarily a vertical velocity from a dielectric located above the resistive change elements 1310, 1320, as described above with respect to FIG. 13I, or by or semiconductor fabrication techniques, such as an atomic layer deposition-chemical vapor deposition (ALD-CVD).

Filling the regions around the resistive change elements 1310, 1320 with a dielectric is performed as described above with respect to step 1208. The dielectric does not penetrate into the nanotube fabric layers 1314, 1324 because the nanotube fabric layers 1314, 1324 are sealed by multi-film thin dielectric sidewalls 1315, 1325. Thus, the combination of the resistive change element 1310 and the multi-film thin dielectric sidewall 1315 can be considered a sealed resistive change element and the combination of the resistive change element 1320 and the multi-film thin dielectric sidewall 1325 can be considered a sealed resistive change element. Additionally, the multi-film thin dielectric sidewalls 1315, 1325 can prevent contaminants, such as water and metallic contaminants, from penetrating into the nanotube fabric layers 1314, 1324 and can prevent parasitic conductive paths between the top electrodes 1316, 1326 and the bottom electrodes 1312, 1322. Forming the top interconnect conductor above the resistive change elements 1310, 1320 is performed as described above with respect to step 1210.

As the horizontal dimensions of resistive change elements are scaled down, it is desirable to scale down the vertical dimensions of the resistive change elements to reduce the aspect ratio of the resistive change elements to reduce fabrication complexity and cost of fabrication in either an aluminum or a copper back end of the line (BEOL). Additionally, as the horizontal dimensions of resistive change elements are scaled down, it is also desirable to scale down the vertical dimensions for connecting resistive change elements to interconnect conductors to reduce fabrication complexity and cost of fabrication of either an aluminum or a copper BEOL.

Figure 14A:
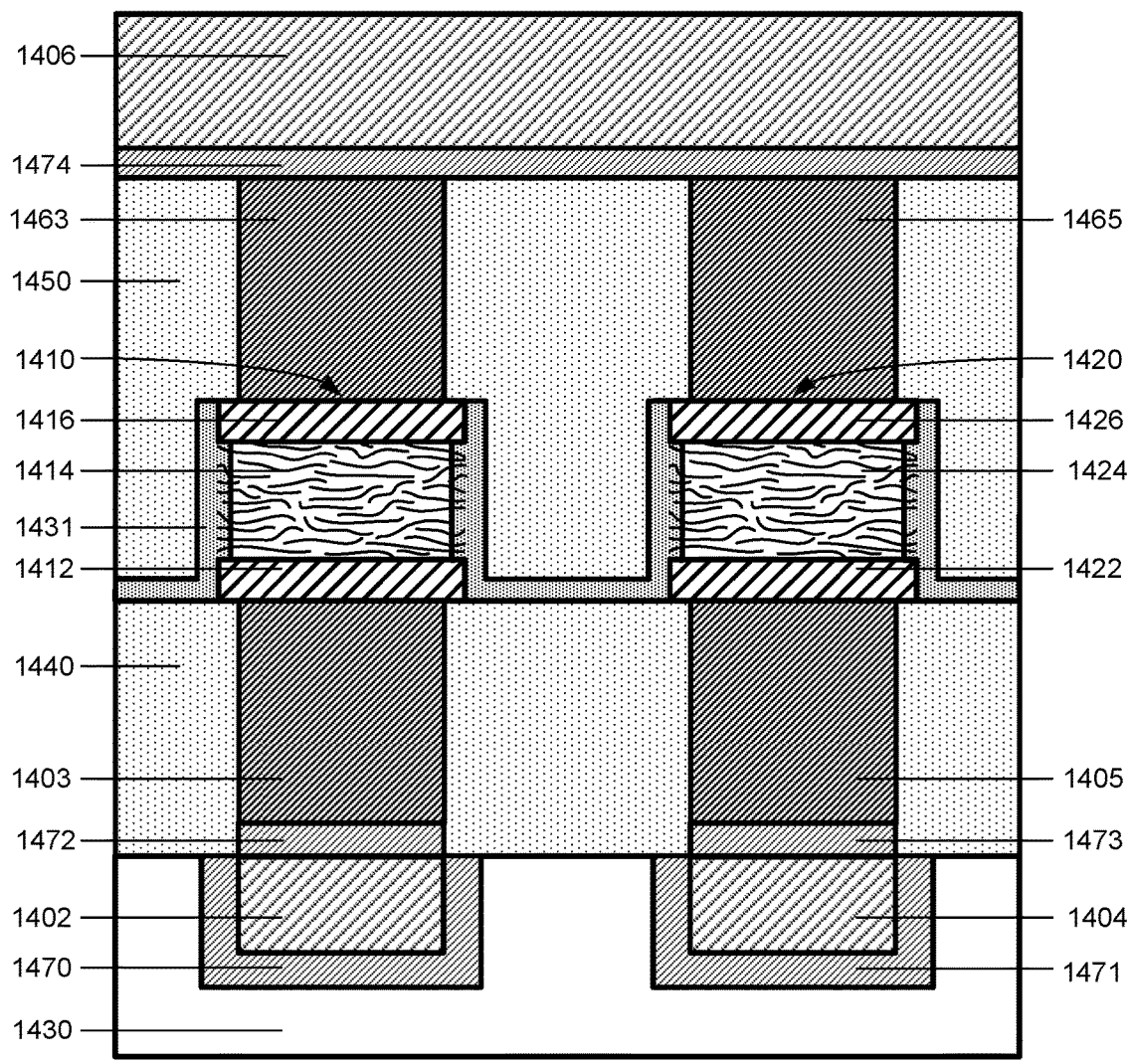
FIG. 14A illustrates a cross-sectional view of resistive change elements from a cross point resistive change element array with a copper back end of the line.

FIG. 14A illustrates a cross-sectional view of resistive change elements 1410, 1420 from a cross point resistive change element array with a copper BEOL. The resistive change element 1410 is located where a top copper interconnect conductor 1406 crosses a first bottom copper interconnect conductor 1402 and the resistive change element 1420 is located where the top copper interconnect conductor 1406 crosses a second bottom copper interconnect conductor 1404. The cross point resistive change element array can be a two-dimensional cross point resistive change element array with a layout similar to one level of the three-dimensional cross point resistive change element array 200 shown in FIG. 2A and can include additional resistive change elements having the same structure as the resistive change elements 1410, 1420 with the thin dielectric sidewall film 1431 formed around the additional resistive change elements, additional top copper interconnect conductors having the same structure as the top copper interconnect conductor 1406, and additional bottom copper interconnect conductors having the same structure as the first and second bottom copper interconnect conductors 1402, 1404. Alternatively, the cross point resistive change element array can be a three-dimensional cross point resistive change element array with a layout similar to the three-dimensional cross point resistive change element array 200 shown in FIG. 2A and can include additional resistive change elements having the same structure as the resistive change elements 1410, 1420 with the thin dielectric sidewall film formed around the additional resistive change elements, additional top copper interconnect conductors having the same structure as the top copper interconnect conductor 1406, and additional bottom copper interconnect conductors having the same structure as the first and second bottom copper interconnect conductors 1402, 1404.

Each resistive change element 1410, 1420 includes a bottom electrode 1412, 1422, a nanotube fabric layer 1414, 1424, and a top electrode 1416, 1426. The nanotube fabric layers 1414, 1424 can be formed with nanotubes that are relatively defect free, such as discussed above with respect to FIGS. 2A-2F, nanotubes having defects introduced post nanotube deposition, such as discussed above with respect to FIGS. 3A-3E, nanotubes having intrinsic nanotube defects introduced prior to nanotube deposition, such as discussed above with respect to FIGS. 4A-4E, and nanotubes having intrinsic nanotube defects introduced prior to nanotube deposition and additional defects introduced post nanotube deposition. The nanotube fabric layers 1414, 1424 are shown in FIG. 14A without a dielectric 1450, such as a flowable dielectric, penetrating into the nanotube fabric layers 1414, 1424 because a thin dielectric sidewall film 1431 seals the nanotube fabric layers 1414, 1424. Thus, the combination of the resistive change element 1410 and the portion of the thin dielectric sidewall film 1431 formed around the resistive change element 1410 can be considered a sealed resistive change element and the combination of the resistive change element 1420 and the portion of the thin dielectric sidewall film 1420 formed around the resistive change element 1420 can be considered a sealed resistive change element. Additionally, the thin dielectric sidewall film 1431 can prevent contaminants, such as water and metallic contaminants, from penetrating into the nanotube fabric layers 1414, 1424 and can prevent parasitic conductive paths between the top electrodes 1416, 1426 and the bottom electrodes 1412, 1422.

FIG. 14A shows the thin dielectric sidewall film 1431 formed over the nanotube fabric layers 1414, 1424 using the method for sealing a resistive change material layer of a resistive change element discussed above with respect to FIG. 9. The resistive change elements 1410, 1420 can have a square horizontal cross-sectional shape or a non-square horizontal cross-sectional shape, such as a rectangular horizontal cross-sectional shape, a circular horizontal cross-sectional shape, an oval horizontal cross-sectional shape, a triangular horizontal cross-sectional shape, a trapezoidal horizontal cross-sectional shape, an irregular horizontal cross-sectional shape, and a non-uniform horizontal cross-sectional shape where different sections of the resistive change elements 1410, 1420 can have different dimensions. Alternatively, thin dielectric sidewall films can be formed over the nanotube fabric layers 1414, 1424 using the method for sealing a resistive change material layer of a resistive change element formed above a dielectric discussed above with respect to FIG. 8 and the thin dielectric sidewall films can have ring shapes. Alternatively, thin dielectric sidewall films can be formed over the nanotube fabric layers 1414, 1424 using the method for sealing a resistive change material layer of a resistive change element discussed above with respect to FIG. 10 and the thin dielectric sidewall films can have ring shapes. Alternatively, multi-film thin dielectric sidewalls can be formed over the nanotube fabric layers 1414, 1424 using the method for sealing with a multi-film thin dielectric sidewall a resistive change material layer of a resistive change element described above with respect to FIG. 11 and the multi-film thin dielectric sidewalls can have ring shapes.

The bottom electrode 1412 is in electrical communication with a first bottom copper interconnect conductor 1402 through a first bottom plug 1403 and the bottom electrode 1422 is in electrical communication with a second bottom copper interconnect conductor 1404 through a second bottom plug 1405. The top electrode 1416 is in electrical communication with a top copper interconnect conductor 1406 through a first top plug 1463 and the top electrode 1426 is in electrical communication with the top copper interconnect conductor 1406 through a second top plug 1465. The first bottom copper interconnect conductor 1402 and the second bottom copper interconnect conductor 1404 are formed in a dielectric 1430, the first bottom plug 1403 and the second bottom plug 1405 are formed in the dielectric 1440, and the first top plug 1463 and the second top plug 1465 are formed in the dielectric 1450.

In a copper BEOL care must be taken to limit copper migration into the body of resistive change elements and into isolating dielectrics by providing a barrier to copper migration. FIG. 14A illustrates a first bottom barrier metal layer 1470 formed around the first bottom copper interconnect conductor 1402, a second bottom barrier metal layer 1471 formed around the second bottom copper interconnect conductor 1404, a first plug barrier metal layer 1472, a second plug barrier metal layer 1473, and a top barrier metal layer 1474 to provide a barrier to copper migration. The first bottom barrier metal layer 1470, the second bottom barrier metal layer 1471, the first plug barrier metal layer 1472, the second plug barrier metal layer 1473, and the top barrier metal layer 1474 can be metal layers such as Ta, TaN, TiN, $Mo_2N$, Ru, $RuO_x$, or amorphous ternary alloys, such as $Ta_{36}Si_{14}N_{50}$, $Ti_{34}Si_{23}N_{43}$. The first bottom barrier metal layer 1470, the second bottom barrier metal layer 1471, the first plug barrier metal layer 1472, the second plug barrier metal layer 1473, and the top barrier metal layer 1474 are not limited to being the same metal or alloy. For example, a metal or alloy selected for the first bottom barrier metal layer 1470, the second bottom barrier metal layer 1471, and the top barrier metal layer 1474 can be different from a metal or alloy selected for the first plug barrier metal layer 1472 and the second plug barrier metal layer 1473.

Figure 14B:
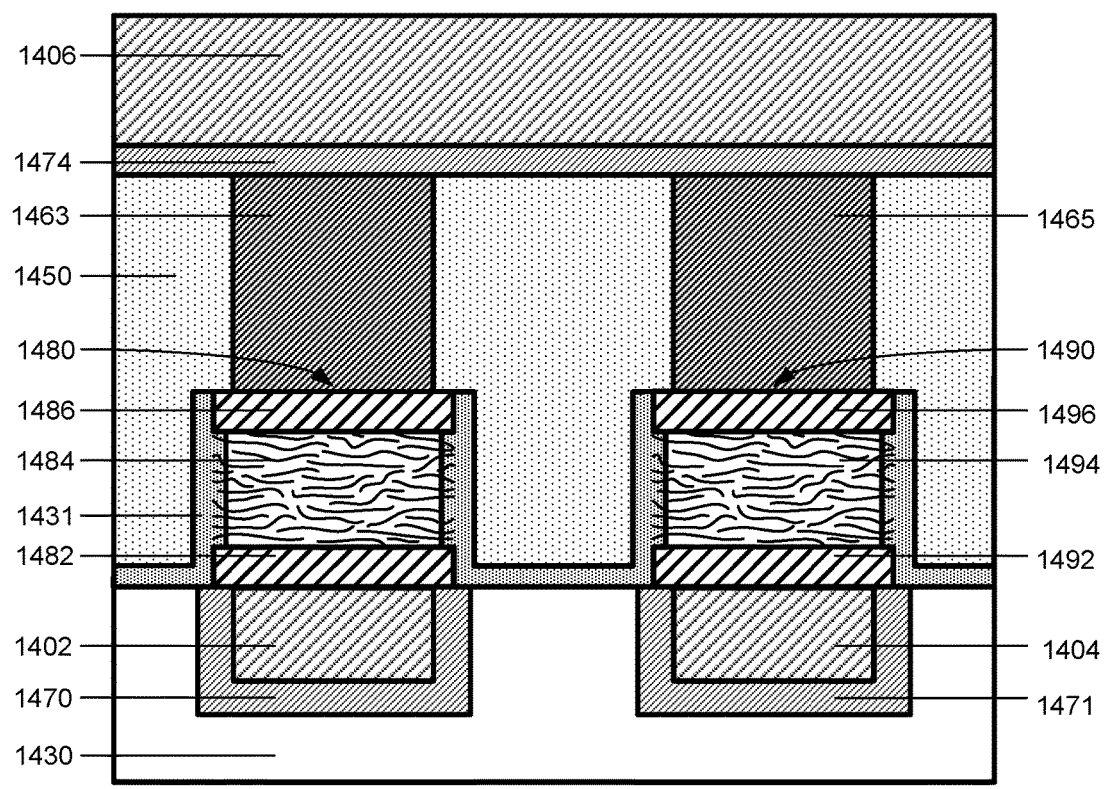
FIG. 14B illustrates a cross-sectional view of resistive change elements from a cross point resistive change element array with a copper back end of the line, where the resistive change elements include bottom electrodes formed by single layer films.

The vertical dimensions of resistive change elements can be scaled down by reducing the thicknesses of top electrodes, reducing the thickness of bottom electrodes, reducing thicknesses of nanotube fabric layers, omitting top electrodes, and omitting bottom electrodes. The vertical dimensions for connecting resistive change elements to interconnect conductors can be scaled down by reducing thicknesses of plugs that connect resistive change elements to interconnect conductors and omitting plugs that connect resistive change elements to interconnect conductors. FIG. 14B illustrates a gain in vertical scaling when the first bottom plug 1403 and the second bottom plug 1405 are omitted from the structure shown in FIG. 14A. FIG. 14B shows resistive change elements 1480, 1490 with each resistive change element 1480, 1490 including a bottom electrode 1482, 1492, a nanotube fabric layer 1484, 1494, and a top electrode 1486, 1496. The bottom electrode 1482 is in contact with the first bottom copper interconnect conductor 1402. The bottom electrode 1482 functions as a bottom electrode of the resistive change element 1480 and the bottom electrode also provides a barrier to copper migration from the first bottom copper interconnect conductor 1402. The bottom electrode 1492 is in contact with the second bottom copper interconnect conductor 1404. The bottom electrode 1492 functions as a bottom electrode of the resistive change element 1490 and the bottom electrode 1492 also provides a barrier to copper migration from the second bottom copper interconnect conductor 1404. The bottom electrodes 1482, 1492 are formed by single layer films, such as Ru or $RuO_x$. Selection of the bottom electrode film composition depends on several parameters, but not limited to, the contact resistivity to the nanotube fabric layer, barrier to copper migration, overall thickness required for copper mitigation, process complexity, device reliability, for example. The nanotube fabric layers 1484, 1494 and the top electrodes 1486, 1496 have the same structure as nanotube fabric layers 1414, 1424 and the top electrodes 1416, 1426 discussed above with respect to FIG. 14A.

Figure 14C:
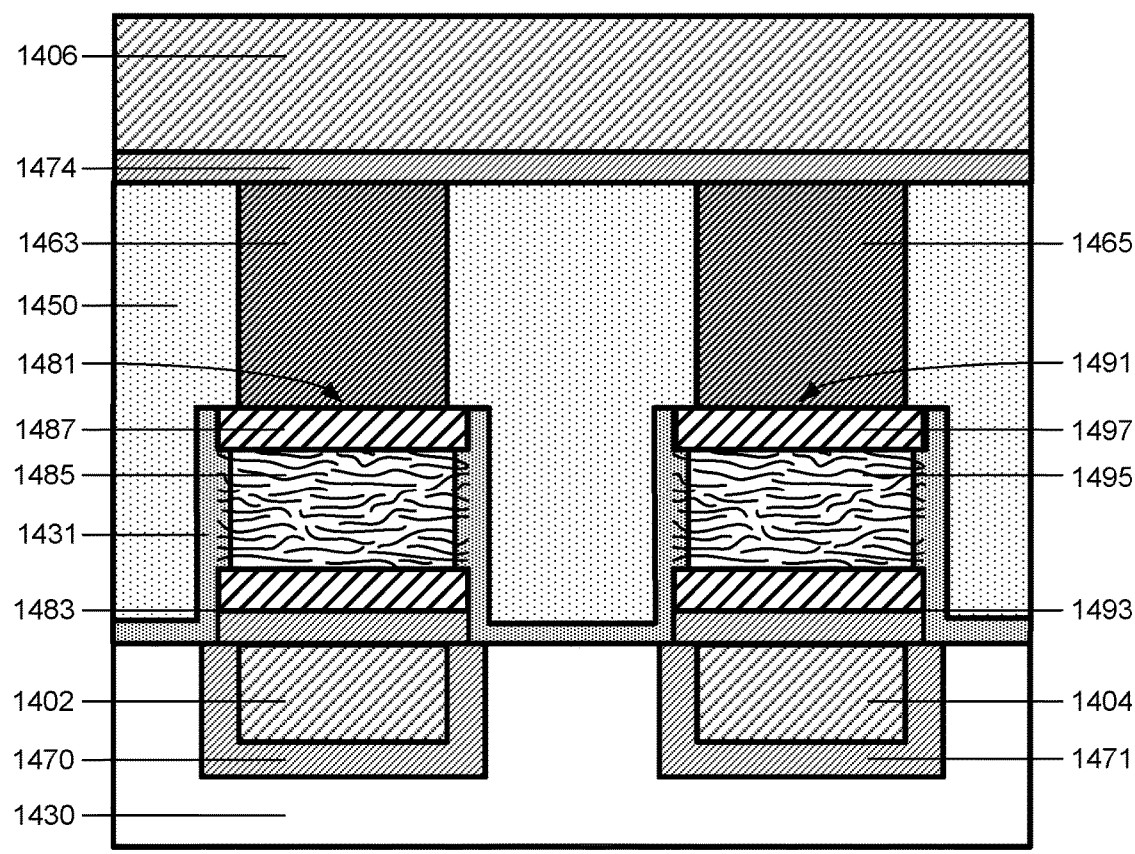
FIG. 14C illustrates a cross-sectional view of resistive change elements from a cross point resistive change element array with a copper back end of the line, where the resistive change elements include bottom electrodes formed by bilayer films.

FIG. 14C illustrates a gain in vertical scaling when the first bottom plug 1403 and the second bottom plug 1405 are omitted from the structure shown in FIG. 14A. FIG. 14C shows resistive change elements 1481, 1491 with each resistive change element 1481, 1491 including a bottom electrode 1483, 1493, a nanotube fabric layer 1485, 1495, and a top electrode 1487, 1497. The bottom electrode 1483 is in contact with the first bottom copper interconnect conductor 1402. The bottom electrode 1483 functions as a bottom electrode of the resistive change element 1481 and the bottom electrode 1483 also provides a barrier to copper migration from the first bottom copper interconnect conductor 1402. The bottom electrode 1493 is in contact with the second bottom copper interconnect conductor 1404. The bottom electrode 1493 functions as a bottom electrode of the resistive change element 1491 and the bottom electrode 1493 also provides a barrier to copper migration from the second bottom copper interconnect conductor 1404. The bottom electrodes 1483, 1493 are formed by bilayer films where one metal forms a contact to the nanotube fabric layer and another metal forms a barrier to copper migration. Examples of bilayer films are, but not limited to, $RuO_x/Ru$, $RuO_x/Ta$, TiN/Ta, TaN/Ta, $TiN/RuO_x$ or TiN/Ru. Alternatively, the bottom electrodes 1483, 1493 can be formed by multilayer films including at least three layers, where one metal forms a contact to the nanotube fabric layer and another metal forms a barrier to copper migration. Selection of the bottom electrode film composition depends on several parameters, but not limited to, the contact resistivity to the nanotube fabric layer, barrier to copper migration, overall thickness required for copper mitigation, process complexity, device reliability, for example. The nanotube fabric layers 1485, 1495 and the top electrodes 1487, 1497 have the same structure as nanotube fabric layers 1414, 1424 and the top electrodes 1416, 1426 discussed above with respect to FIG. 14A.

Figure 14D:
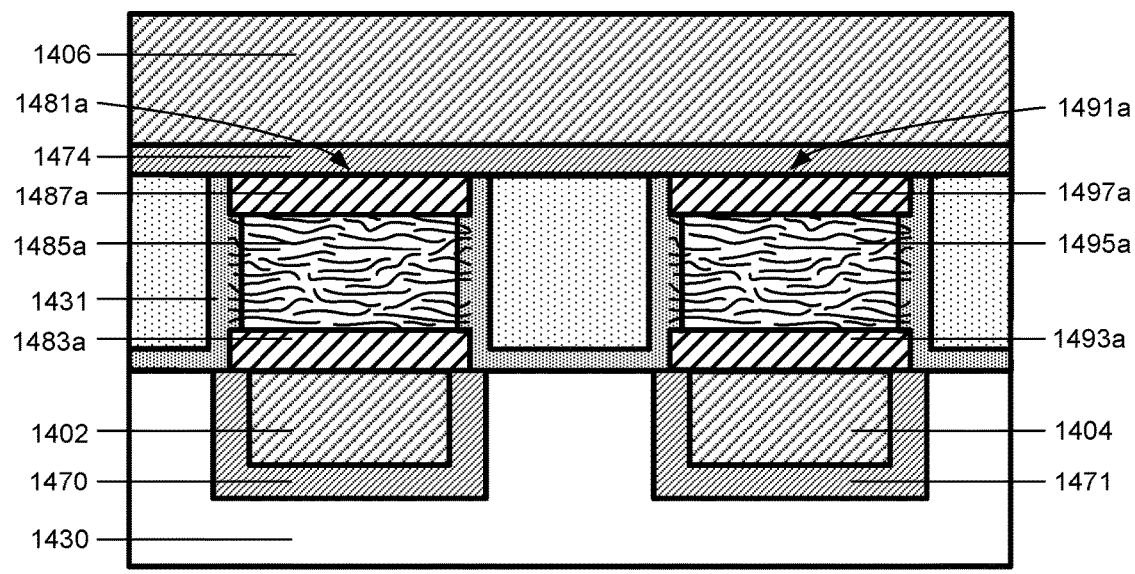
FIG. 14D illustrates a cross-sectional view of resistive change elements from a cross point resistive change element array with a copper back end of the line, where the resistive change elements are in contact with bottom copper interconnect conductors and a top barrier metal layer.

FIG. 14D illustrates a gain in vertical scaling when the first bottom plug 1403, the second bottom plug 1405, the first top plug 1463, and the second top plug 1465 are omitted from the structure shown in FIG. 14A. FIG. 14D shows resistive change elements 1481a, 1491a with each resistive change element 1481a, 1491a including a bottom electrode 1483a, 1493a, a nanotube fabric layer 1485a, 1495a, and a top electrode 1487a, 1497a. The bottom electrode 1483a is in contact with the first bottom copper interconnect conductor 1402. The bottom electrode 1483a functions as a bottom electrode of the resistive change element 1481a and the bottom electrode 1483a also provides a barrier to copper migration from the first bottom copper interconnect conductor 1402. The bottom electrode 1493a is in contact with the second bottom copper interconnect conductor 1404. The bottom electrode 1493a functions as a bottom electrode of the resistive change element 1491 and the bottom electrode 1493a also provides a barrier to copper migration from the second bottom copper interconnect conductor 1404. The bottom electrodes 1483a, 1493a can be formed by single layer films, such as Ru or $RuO_x$, bilayer films where one metal forms a contact to the nanotube fabric layer and another metal forms a barrier to copper migration, such as, $RuO_x/Ru$, $RuO_x/Ta$, TiN/Ta, TaN/Ta, $TiN/RuO_x$ or TiN/Ru, or multi-layer film including at least three layers where one metal forms a contact to the nanotube fabric layer and another metal forms a barrier to copper migration. Selection of the bottom electrode film composition depends on several parameters, but not limited to, the contact resistivity to the nanotube fabric layer, barrier to copper migration, overall thickness required for copper mitigation, process complexity, device reliability, for example. The top electrode 1487a and the top electrode 1497a are in contact with the top barrier metal layer 1474. The top electrode 1487a functions as a top electrode of the resistive change element 1481a. The top electrode 1487a functions as a top electrode of the resistive change element 1491a. The top barrier metal layer 1474 provides a barrier to copper migration from the top copper interconnect conductor 1406. Additionally, the top electrodes 1487a, 1497a can provide a barrier to copper migration from the top copper interconnect conductor 1406. Selection of the top electrode film and top barrier metal layer composition depends on several parameters, but not limited to, the contact resistivity to the nanotube fabric layer, barrier to copper migration, overall thickness required for copper mitigation, process complexity, device reliability, for example. The nanotube fabric layers 1485a, 1495a have the same structure as nanotube fabric layers 1414, 1424 discussed above with respect to FIG. 14A.

Figure 15:
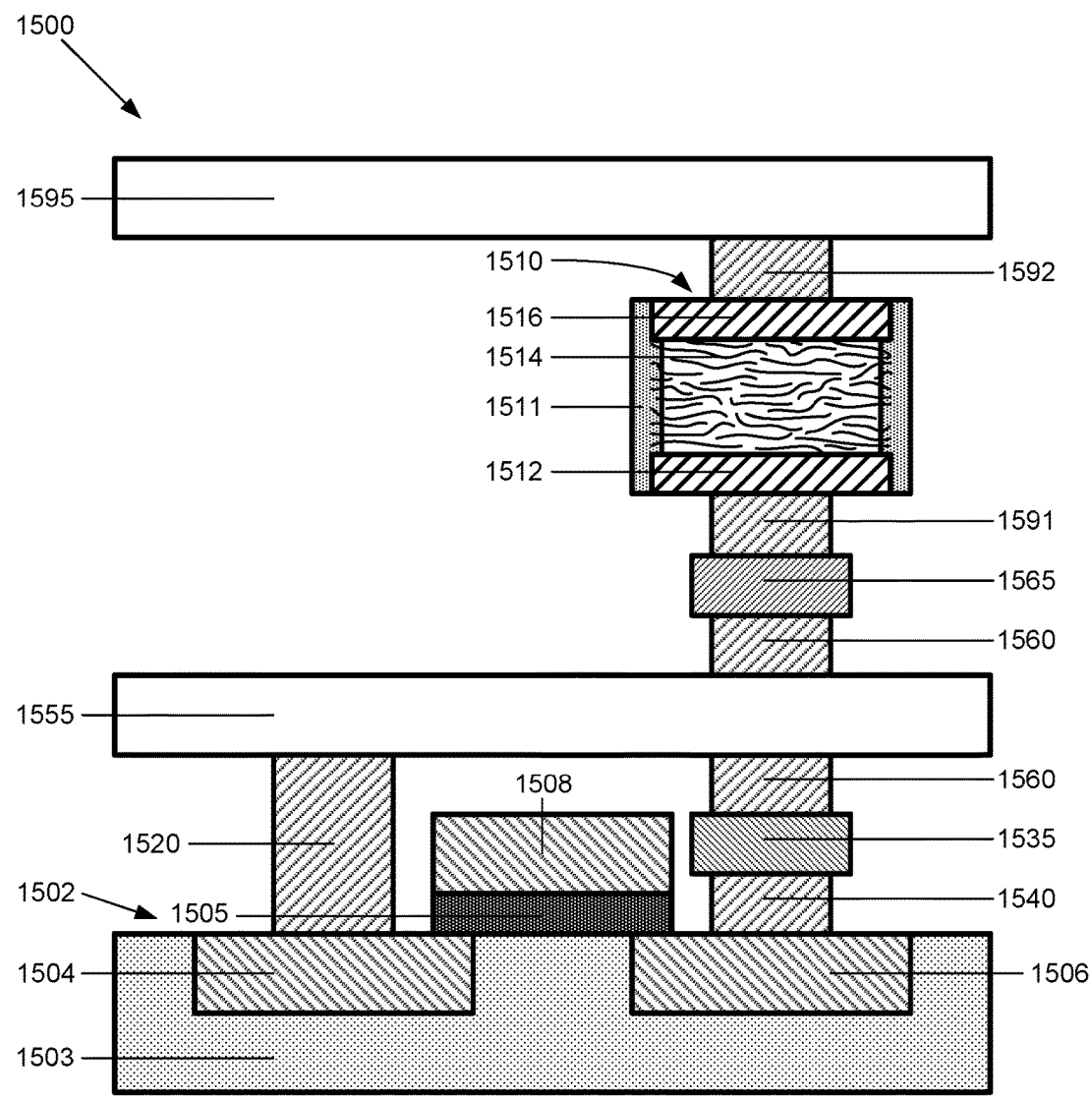
FIG. 15 illustrates an integrated device including an active device in electrical communication with a resistive change element.

As discussed above, the methods for sealing resistive change material layers of resistive change elements with thin dielectric sidewall films can be performed in conjunction with other fabrication methods. Referring to FIG. 15, an integrated device 1500 including an active device 1502 and a resistive change element 1510 fabricated using one of the above methods for sealing a resistive change material layer of a resistive change element with a thin dielectric sidewall film is illustrated. The active device 1502 includes a first terminal 1504, a second terminal 1506, and a gate terminal 1508. The first terminal 1504 and the second terminal 1506 are shown in FIG. 15 formed in a substrate 1503, alternatively, the first terminal 1504 and the second terminal 1506 are formed above the substrate 1503. The gate terminal 1508 is formed above the substrate 1503 and the gate terminal 1508 is separated from the substrate 1503 by a dielectric 1505. Alternatively, the gate terminal 1508 can be separated from a layer of material, such as a nanotube fabric layer, deposited on the substrate 1503 by the dielectric 1505. Additionally, the gate terminal 1508 can be part of a wire that may connect to other device terminals, such as gate terminals of other active devices. The substrate 1503 can be formed from a conductive material, a semiconductor material, or an insulating material as required by the needs of a specific application.

The active device 1502 can be a field effect transistor such as a metal oxide semiconductor field effect transistor (MOSFET), a carbon nanotube field effect transistor (CNTFET), a SiGe FETs, a fully-depleted silicon-on-insulator FET, or a three-dimensional FET, such as a FinFET or a three-dimensional CNTFET. Additionally, the active device 1502 can be a p-type, n-type, or ambipolar-type device. The active device 1502 is electrically connected to multiple layers of wiring and plugs, as discussed below, and the active device 1502 is electrically connected to the resistive change element 1510. Further, the active device 1502 can be electrically connected to other active devices not shown in FIG. 15 and a control circuit, such as a processor, a controller, a programmable logic device, or a field programmable gate array (FPGA), also not shown in FIG. 15.

The resistive change element 1510 includes a bottom electrode 1512, a nanotube fabric layer 1514, and a top electrode 1516. The nanotube fabric layer 1514 can be formed with nanotubes that are relatively defect free, such as discussed above with respect to FIGS. 2A-2F, nanotubes having defects introduced post nanotube deposition, such as discussed above with respect to FIGS. 3A-3E, nanotubes with intrinsic nanotube defects introduced prior to nanotube deposition, such as discussed above with respect to FIGS.

4A-4E, and nanotubes with intrinsic nanotube defects introduced prior to nanotube deposition with additional defects introduced post nanotube deposition. The nanotube fabric layer 1514 is sealed by a thin dielectric sidewall film 1511, and thus, the combination of the resistive change element 1510 and the thin dielectric sidewall film 1511 can be considered a sealed resistive change element.

The bottom electrode 1512 is in contact with the nanotube fabric layer 1514 and the top electrode 1516 is in contact with the nanotube fabric layer 1514. Alternatively, the resistive change element 1510 can include at least one intervening layer located between the bottom electrode 1512 and the nanotube fabric layer 1514, at least one intervening layer located between the nanotube fabric layer 1514 and the top electrode 1516, or at least one intervening layer located between the bottom electrode 1512 and the nanotube fabric layer 1514 and at least one intervening layer located between the nanotube fabric layer 1514 and the top electrode 1516. Alternatively, the bottom electrode 1512 can be omitted from the resistive change element 1510, the top electrode 1516 can be omitted from the resistive change element 1510, or the bottom electrode 1512 and the top electrode 1516 can be omitted from the resistive change element 1510. The resistive change element 1510 can have a square horizontal cross-sectional shape or a non-square horizontal cross-sectional shape, such as a rectangular horizontal cross-sectional shape, a circular horizontal cross-sectional shape, an oval horizontal cross-sectional shape, a triangular horizontal cross-sectional shape, a trapezoidal horizontal cross-sectional shape, an irregular horizontal cross-sectional shape, and a non-uniform horizontal cross-sectional shape where different sections of the resistive change element 1510 can have different dimensions. The thin dielectric sidewall film 1511 has a ring shape based on the horizontal cross-sectional shape of the top electrode 1516, the nanotube fabric layer 1514, and the bottom electrode 1512.

The first terminal 1504 is electrically connected to a metal wire 1555 by a plug 1520 and the second terminal 1506 is connected to a metal wire 1535 by a plug 1540. The metal wire 1535 is connected by the plug 1560 to a metal wire 1565, but the plug 1560 is not connected to the metal wire 1555. The metal wire 1565 is connected to the bottom electrode 1512 by a plug 1591. The metal wire 1595 is connected to the top electrode 1516 of the resistive change element 1510 by a plug 1592. The regions around the integrated device 1500 are filled with an interlayer dielectric such as $SiO_2$, TEOS, a flowable dielectric, or other low dielectric constant material, a polymer for example. The interlayer dielectric does not penetrate into the nanotube fabric layer 1514 of the resistive change element 1510 because the nanotube fabric layer 1516 is sealed by the thin dielectric sidewall film 1511. Additionally, the thin dielectric sidewall film 1511 can prevent contaminants, such as water and metallic contaminants, from penetrating into the nanotube fabric layer 1514 and can prevent parasitic conductive paths between the top electrode 1516 and the bottom electrode 1512.

As discussed above, resistive change element 1510 can be used to form memory, logic, analog, signal routing, etc. as a function of interconnections and other devices not shown in FIG. 15. In the case of a standalone or embedded memory application, gate terminal 1508 is connected to, or forms a portion of a word line WL, a metal conductor 1555, connected to terminal 1504 by plug 1520 forms a bit line BL, and a metal conductor 1595 forms a source line SL. When wired to correspond to a memory array with a select transistor and a nonvolatile storage device in series, the integrated device 1500 can be referred to as a 1T1R resistive change memory cell.

Although the present disclosure has been described in relation to particular embodiments thereof, many other variations and modification and other uses will become apparent to those skilled in the art. It is preferred, therefore, that the present disclosure not be limited by the specific disclosure herein.

What is claimed is:

1. A sealed resistive change element comprising:
   a bottom electrode having a horizontal cross-sectional shape;
   a nanotube fabric layer in contact with said bottom electrode, wherein said nanotube fabric layer has a horizontal cross-sectional shape;
   a top electrode in contact with said nanotube fabric layer, wherein said top electrode has a horizontal cross-sectional shape; and
   at least one directionally deposited thin dielectric sidewall film comprising a portion formed around said nanotube fabric layer, wherein said portion of said at least one directionally deposited thin dielectric sidewall film formed around said nanotube fabric layer has a ring shape based on said horizontal cross-sectional shape of said nanotube fabric layer.

2. The sealed resistive change element of claim 1, wherein said horizontal cross-sectional shape of said nanotube fabric layer is a rectangular horizontal cross-sectional shape and said ring shape of said portion of said at least one directionally deposited thin dielectric sidewall film formed around said nanotube fabric layer is a rectangular ring shape.

3. The sealed resistive change element of claim 2, wherein said horizontal cross-sectional shape of said nanotube fabric layer is a square horizontal cross-sectional shape and said ring shape of said portion of said at least one directionally deposited thin dielectric sidewall film formed around said nanotube fabric layer is a square ring shape.

4. The sealed resistive change element of claim 1, wherein said horizontal cross-sectional shape of said nanotube fabric layer is a circular horizontal cross-sectional shape and said ring shape of said portion of said at least one directionally deposited thin dielectric sidewall film formed around said nanotube fabric layer is a circular ring shape.

5. The sealed resistive change element of claim 1, wherein said at least one directionally deposited thin dielectric sidewall film further comprises a portion formed around said top electrode, and wherein said portion of said at least one directionally deposited thin dielectric sidewall film formed around said top electrode has a ring shape based on said horizontal cross-sectional shape of said top electrode.

6. The sealed resistive change element of claim 5, wherein said horizontal cross-sectional shape of said top electrode is a rectangular horizontal cross-sectional shape and said ring shape of said portion of said at least one directionally deposited thin dielectric sidewall film formed around said top electrode is a rectangular ring shape.

7. The sealed resistive change element of claim 6, wherein said horizontal cross-sectional shape of said top electrode is a square horizontal cross-sectional shape and said ring shape of said portion of said at least one directionally deposited thin dielectric sidewall film formed around said top electrode is a square ring shape.

8. The sealed resistive change element of claim 5, wherein said horizontal cross-sectional shape of said top electrode is a circular horizontal cross-sectional shape and said ring shape of said portion of said at least one directionally deposited thin dielectric sidewall film formed around said top electrode is a circular ring shape.

9. The sealed resistive change element of claim 5, wherein said horizontal cross-sectional shape of said top electrode is different from said horizontal cross-sectional shape of said nanotube fabric layer, and wherein said ring shape of said portion of said at least one directionally deposited thin dielectric sidewall film formed around said top electrode is different from said ring shape of said portion of said at least one directionally deposited thin dielectric sidewall film formed around said nanotube fabric layer.

10. The sealed resistive change element of claim 5, wherein said horizontal cross-sectional shape of said top electrode and said horizontal cross-sectional shape of said nanotube fabric layer are the same horizontal cross-sectional shape, and wherein said ring shape of said portion of said at least one directionally deposited thin dielectric sidewall film formed around said top electrode and said ring shape of said portion of said at least one directionally deposited thin dielectric sidewall film formed around said nanotube fabric layer are the same ring shape.

11. The sealed resistive change element of claim 5, wherein said at least one directionally deposited thin dielectric sidewall film further comprises a portion formed around said bottom electrode, and wherein said portion of said at least one directionally deposited thin dielectric sidewall film formed around said bottom electrode has a ring shape based on said horizontal cross-sectional shape of said bottom electrode.

12. The sealed resistive change element of claim 11, wherein said horizontal cross-sectional shape of said bottom electrode is a rectangular horizontal cross-sectional shape and said ring shape of said portion of said at least one directionally deposited thin dielectric sidewall film formed around said bottom electrode is a rectangular ring shape.

13. The sealed resistive change element of claim 12, wherein said horizontal cross-sectional shape of said bottom electrode is a square horizontal cross-sectional shape and said ring shape of said portion of said at least one directionally deposited thin dielectric sidewall film formed around said bottom electrode is a square ring shape.

14. The sealed resistive change element of claim 11, wherein said horizontal cross-sectional shape of said bottom electrode is a circular horizontal cross-sectional shape and said ring shape of said portion of said at least one directionally deposited thin dielectric sidewall film formed around said bottom electrode is a circular ring shape.

15. The sealed resistive change element of claim 11, wherein said horizontal cross-sectional shape of said top electrode, said horizontal cross-sectional shape of said nanotube fabric layer, and said horizontal cross-sectional shape of said bottom electrode are different horizontal cross-sectional shapes, and wherein said ring shape of said portion of said at least one directionally deposited thin dielectric sidewall film formed around said top electrode, said ring shape of said portion of said at least one thin directionally deposited dielectric sidewall film formed around said nanotube fabric layer, and said ring shape of said portion of said at least one directionally deposited thin dielectric sidewall film formed around said bottom electrode are different ring shapes.

16. The sealed resistive change element of claim 11, wherein said horizontal cross-sectional shape of said top electrode, said horizontal cross-sectional shape of said nanotube fabric layer, and said horizontal cross-sectional shape of said bottom electrode are the same horizontal cross-sectional shape, and wherein said ring shape of said portion of said at least one directionally deposited thin dielectric sidewall film formed around said top electrode, said ring shape of said portion of said at least one directionally deposited thin dielectric sidewall film formed around said nanotube fabric layer, and said ring shape of said portion of said at least one directionally deposited thin dielectric sidewall film formed around said bottom electrode are the same ring shape.

17. The sealed resistive change element of claim 1, wherein said at least one directionally deposited thin dielectric sidewall film is formed from $SiO_x$, SiC, and SiCO.

18. The sealed resistive change element of claim 17, wherein said at least one directionally deposited thin dielectric sidewall film is additionally formed from SiON.

19. The sealed resistive change element of claim 1, wherein said bottom electrode is formed by a single layer film that provides a barrier to metal migration from an interconnect conductor.

20. The sealed resistive change element of claim 19, wherein said bottom electrode is formed by a material selected from the group consisting of Ru and $RuO_x$.

21. The sealed resistive change element of claim 1, wherein said bottom electrode is formed by a bilayer film that provides a barrier to metal migration from an interconnect conductor.

22. The sealed resistive change element of claim 21, wherein said bottom electrode is formed by a material selected from the group consisting of $RuO_x/Ru$, $RuO_x/Ta$, TiN/Ta, TaN/Ta, $TiN/RuO_x$, and TiN/Ru.

23. The sealed resistive change element of claim 1, wherein said bottom electrode is formed by a material selected from the group consisting of $Ta_{36}Si_{14}N_{50}$ and $Ti_{34}Si_{23}N^{43}$.

24. The sealed resistive change element of claim 1, wherein said nanotube fabric layer is formed with nanotubes that are relatively defect free.

25. The sealed resistive change element of claim 1, wherein said nanotube fabric layer is formed with nanotubes having defects introduced post nanotube deposition.

26. The sealed resistive change element of claim 1, wherein said nanotube fabric layer is formed with nanotubes having intrinsic nanotube defects introduced prior to nanotube deposition.

27. The sealed resistive change element of claim 1, wherein said nanotube fabric layer is formed with nanotubes having intrinsic nanotube defects introduced prior to nanotube deposition and additional defects introduced post nanotube deposition.

28. The sealed resistive change element of claim 1, wherein said at least one directionally deposited thin dielectric sidewall film is formed from SiN.

29. A sealed resistive change element comprising:
   a bottom electrode having a horizontal cross-sectional shape;
   a layer of buckyballs in contact with said bottom electrode, wherein said layer of buckyballs has a horizontal cross-sectional shape;
   a top electrode in contact with said layer of buckyballs, wherein said top electrode has a horizontal cross-sectional shape; and
   at least one directionally deposited thin dielectric sidewall film comprising a portion formed around said layer of buckyballs, wherein said portion of said at least one directionally deposited thin dielectric sidewall film formed around said layer of buckyballs has a ring shape based on said horizontal cross-sectional shape of said layer of buckyballs.

30. A sealed resistive change element comprising:
a bottom electrode having a horizontal cross-sectional shape;
a layer of graphene flakes in contact with said bottom electrode, wherein said layer of graphene flakes has a horizontal cross-sectional shape;
a top electrode in contact with said layer of graphene flakes, wherein said top electrode has a horizontal cross-sectional shape; and
at least one directionally deposited thin dielectric sidewall film comprising a portion formed around said layer of graphene flakes, wherein said portion of said at least one directionally deposited thin dielectric sidewall film formed around said layer of graphene flakes has a ring shape based on said horizontal cross-sectional shape of said layer of graphene flakes.

* * * * *